(12) United States Patent
Guo et al.

(10) Patent No.: US 12,074,089 B2
(45) Date of Patent: Aug. 27, 2024

(54) HEAT EXCHANGER

(71) Applicant: DENSO CORPORATION, Kariya (JP)

(72) Inventors: Xiaolin Guo, Nisshin (JP); Koji Asagara, Nisshin (JP); Kazuya Takeuchi, Kariya (JP); Akihiro Ohi, Kariya (JP)

(73) Assignee: DENSO CORPORATION, Kariya (JP)

( * ) Notice: Subject to any disclaimer, the term of this patent is extended or adjusted under 35 U.S.C. 154(b) by 961 days.

(21) Appl. No.: 17/066,589

(22) Filed: Oct. 9, 2020

(65) Prior Publication Data

US 2021/0028089 A1 Jan. 28, 2021

Related U.S. Application Data

(63) Continuation of application No. PCT/JP2019/007734, filed on Feb. 28, 2019.

(30) Foreign Application Priority Data

| Apr. 9, 2018 | (JP) | 2018-074812 |
| May 31, 2018 | (JP) | 2018-105121 |
| Jun. 12, 2018 | (JP) | 2018-112301 |

(51) Int. Cl.
H01L 23/427 (2006.01)
B08B 9/032 (2006.01)
(Continued)

(52) U.S. Cl.
CPC ............ H01L 23/427 (2013.01); B08B 9/032 (2013.01); F28D 1/0325 (2013.01);
(Continued)

(58) Field of Classification Search
None
See application file for complete search history.

(56) References Cited

U.S. PATENT DOCUMENTS 3,238,107 A * 3/1966 Leyse .................. G21C 1/30
376/221
3,526,658 A * 9/1970 Bryant, Jr. ............... B01D 7/00
203/96

(Continued)

FOREIGN PATENT DOCUMENTS

JP H06-037219 A 2/1994
JP 2005-079337 A 3/2005
(Continued)

OTHER PUBLICATIONS

Dunbar, William R., Scott D. Moody, and Noam Lior. "Exergy analysis of an operating boiling-water-reactor nuclear power station." Energy Conversion and Management 36.3 (1995): 149-159. (Year: 1995).*

(Continued)

*Primary Examiner* — Carlos R Ortiz Rodriguez
(74) *Attorney, Agent, or Firm* — Oliff PLC

(57) ABSTRACT

A heat exchanger body that includes a circulation path through which a coolant is circulated and performs heat exchange between the coolant flowing through the circulation path and an electronic component; a circulation pump that supplies the coolant to the heat exchanger body; an accumulation determination unit that determines whether a foreign matter accumulation condition is fulfilled that is satisfied when foreign matter is expected to be accumulated in at least a part of the circulation path; and a process execution unit that in response to the foreign matter accumulation condition being satisfied, executes a foreign matter cleaning process of removing the foreign matter accumulated in the circulation path and cleaning the circulation path. In the foreign matter cleaning process, the process execution unit reduces an amount of coolant supplied from (Continued)

the circulation pump so that the coolant has a superheating degree in a nucleate boiling region.

11 Claims, 76 Drawing Sheets

(51) Int. Cl.
- *F28D 1/03* (2006.01)
- *F28D 1/053* (2006.01)
- *F28G 13/00* (2006.01)
- *H05K 7/20* (2006.01)

(52) U.S. Cl.
CPC ......... *F28D 1/05325* (2013.01); *F28G 13/00* (2013.01); *H05K 7/20* (2013.01)

(56) References Cited

U.S. PATENT DOCUMENTS

| | | | | |
|---|---|---|---|---|
| 4,473,036 A | * | 9/1984 | Carlson | F22B 37/02 |
| | | | | 122/479.3 |
| 5,015,432 A | * | 5/1991 | Koloc | H05H 1/52 |
| | | | | 376/148 |
| 5,662,050 A | * | 9/1997 | Angelo, II | C03B 5/005 |
| | | | | 432/103 |
| 2006/0053791 A1 | * | 3/2006 | Prentice, III | F23G 5/006 |
| | | | | 60/645 |
| 2009/0107655 A1 | | 4/2009 | Kajiura | |
| 2009/0302458 A1 | | 12/2009 | Kubo et al. | |
| 2011/0048374 A1 | * | 3/2011 | McAlister | F02D 41/30 |
| | | | | 123/436 |
| 2014/0140004 A1 | | 5/2014 | Kubo et al. | |
| 2018/0112933 A1 | | 4/2018 | Takagi et al. | |

FOREIGN PATENT DOCUMENTS

| | | |
|---|---|---|
| JP | 2009-266936 A | 11/2009 |
| JP | 2009-266937 A | 11/2009 |
| JP | 2010-010418 A | 1/2010 |
| JP | 2010-041005 A | 2/2010 |
| JP | 2015-023044 A | 2/2015 |
| JP | 2017-067412 A | 4/2017 |

OTHER PUBLICATIONS

Kaufmann, Stephan, and Karl Hilfiker. "Prevention of fog in the condensation of vapour from mixtures with inert gas, by a regenerative thermal process." International journal of thermal sciences 38.3 (1999): 209-219. (Year: 1999).*
Theofanous, T. G., et al. "The physics of boiling at burnout." International Conferece on Multiphase Systems (JCMS"2000). 2000. (Year: 2000).*
Theofanous, T. G., et al. "The boiling crisis phenomenon: Part I: nucleation and nucleate boiling heat transfer." Experimental thermal and fluid science 26.6-7 (2002): 775-792. (Year: 2002).*
Choi, Young Jae, Dong Hoon Kam, and Yong Hoon Jeong. "Analysis of CHF enhancement by magnetite nanoparticle deposition in the subcooled flow boiling region." International Journal of Heat and Mass Transfer 109 (2017): 1191-1199. (Year: 2017).*
May 28, 2019 International Search Report issued in International Patent Application No. PCT/JP2019/007734.

* cited by examiner

HEAT EXCHANGER

CROSS-REFERENCE TO RELATED APPLICATION

This application is the U.S. bypass application of International Application No. PCT/JP2019/007734 filed on Feb. 28, 2019 which designated the U.S. and claims priority to Japanese Patent Application No. 2018-074812 filed on Apr. 9, 2018, Japanese Patent Application No. 2018-105121 filed on May 31, 2018, and Japanese Patent Application No. 2018-112301 filed on Jun. 12, 2018, the contents of all of which are incorporated herein by reference.

TECHNICAL FIELD

The present disclosure relates to a heat exchanger.

BACKGROUND

JP 2017-67412 A discloses a known technique of generating bubbles of a liquid coolant using ultrasonic waves to clean off foreign matter accumulated in a coolant circulation path in a heat exchanger (see, for example, JP 2017-67412 A). In JP 2017-67412 A, the heat exchanger is provided with an ultrasonic wave generation unit that generates ultrasonic waves.

JP 2016-205802 A discloses a heat exchanger used for cooling a plurality of semiconductor modules with an integrated semiconductor device. The heat exchanger includes a plurality of channel pipes that are laminated to sandwich a single semiconductor module from both sides, and is configured such that the plurality of channel pipes communicate with each other. The heat exchanger is configured such that each of the plurality of channel pipes arranged to be laminated is partitioned by an intermediate plate into two main channels and each of the two main channels is partitioned by an internal fin into a plurality of narrow channels. The heat exchanger increases a heat transfer area using the internal fin to improve the heat exchange performance between the heat exchanger and the semiconductor module.

JP 2010-10418 A discloses a laminated cooler as a heat exchanger. The cooler is configured such that a coolant is circulated through a coolant channel in a cooling pipe to cool an electronic component arranged in contact with the cooling pipe.

SUMMARY

A first aspect of the present disclosure is a heat exchanger that cools a cooled object by heat exchange between the cooled object and a liquid coolant, the heat exchanger including: a heat exchanger body that includes a circulation path through which the coolant is circulated and performs heat exchange between the coolant flowing through the circulation path and the cooled object; a coolant supply pump that supplies the coolant to the heat exchanger body; an accumulation determination unit that determines whether a foreign matter accumulation condition is fulfilled that is satisfied when foreign matter is expected to be accumulated in at least a part of the circulation path; and a process execution unit that in response to the foreign matter accumulation condition being satisfied, executes a foreign matter cleaning process of removing the foreign matter accumulated in the circulation path and cleaning the circulation path, wherein in the foreign matter cleaning process, the process execution unit reduces an amount of coolant supplied from the coolant supply pump so that the coolant has a superheating degree in a nucleate boiling region.

A second aspect of the present disclosure is a heat exchanger including: a channel pipe that has an outer surface serving as a heat exchange surface for an external heat exchange object; a plate-shaped partition member that partitions the channel pipe into a plurality of channels through which a heat transfer medium flows, and an internal fin that is provided in the channel pipe to divide each of the plurality of channels into a plurality of narrow channels, wherein the partition member is provided with a communication hole through which at least two of the plurality of channels communicate with each other, the internal fin is configured to have a corrugated cross-sectional shape in which a plurality of convex portions and a plurality of concave portions facing the partition member are alternately formed and to be joined to the partition member at the convex portions; and the communication hole is provided at a joining portion of the partition member to which the convex portion of the internal fin is joined.

A third aspect of the present disclosure is a heat exchanger including: a cooling pipe inside which is provided a coolant channel through which a coolant is circulated; and a first electronic component and a second electronic component that are arranged thermally in contact with a cooling surface of the cooling pipe, wherein: the first electronic component is arranged on an upstream side of the second electronic component in the coolant channel; the coolant channel has an intermediate region located on a downstream side of the first electronic component and an upstream side of the second electronic component, an upstream region located between an upstream end of the first electronic component and a downstream end of the first electronic component, and a downstream region located between an upstream end of the second electronic component and a downstream end of the second electronic component; and a fluid diode unit is provided in the intermediate region, in the upstream region and the downstream region, the cooling pipe includes an internal fin that partitions the coolant channel into a plurality of branch channels that extend parallel to each other in a channel direction, and the fluid diode unit causes a channel resistance in a direction from the downstream region toward the upstream region to be higher than a channel resistance in a direction from the upstream region toward the downstream region.

A fourth aspect of the present disclosure is a heat exchanger including: a cooling pipe inside which is provided a coolant channel through which a coolant is circulated; and a first electronic component and a second electronic component that are arranged thermally in contact with a cooling surface of the cooling pipe, wherein: the first electronic component is arranged on an upstream side of the second electronic component in the coolant channel; the cooling pipe includes an internal fin that partitions the coolant channel into a plurality of branch channels that extend parallel to each other in a channel direction; the coolant channel has an intermediate region located on a downstream side of the first electronic component and an upstream side of the second electronic component, an upstream region located between an upstream end of the first electronic component and a downstream end of the first electronic component, and a downstream region located between an upstream end of the second electronic component and a downstream end of the second electronic component; and only in the intermediate region among the upstream region, the intermediate region, and the downstream region, the internal fin is provided with a diffusion unit through which adjacent branch channels communicate with each other.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
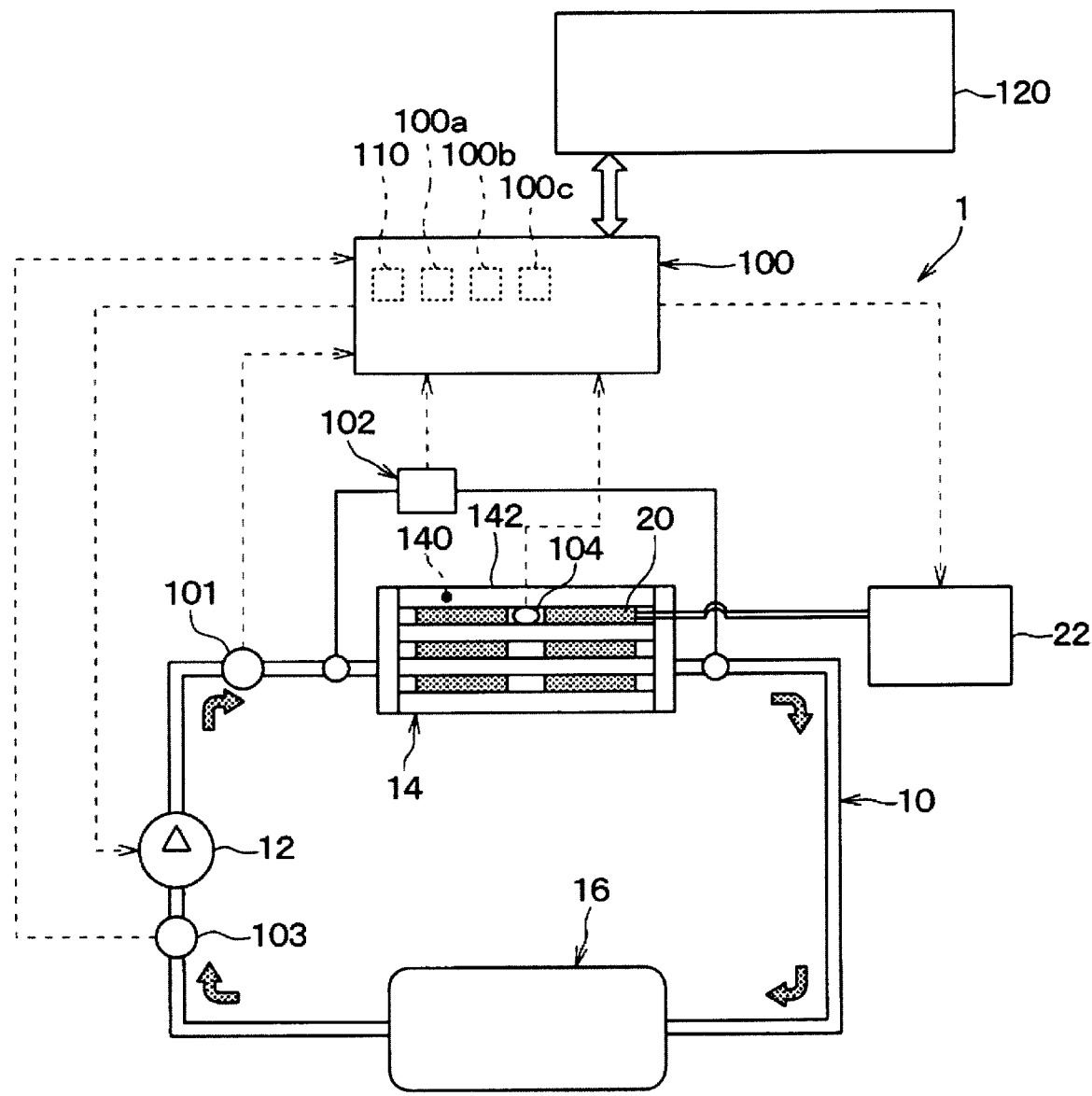
FIG. 1 is a schematic configuration diagram of a heat exchange device according to a first embodiment.

As disclosed in JP 2017-67412 A, the heat exchanger provided with the ultrasonic wave generation unit as a dedicated device for foreign matter cleaning inevitably causes an increase in the number of components and complexity of the device. The increase in the number of components and complexity of the device are factors that increase the manufacturing cost and reduce the applicability of the product, and are thus undesirable.

In the heat exchanger disclosed in JP 2016-205802 A, as the amount of heat generated by the semiconductor module is increased, a cooling medium flowing through the main channels of the channel pipe is more likely to boil. When the cooling medium boils, a pressure in the main channels is increased, and thus the cooling medium is less likely to flow through the channel pipe. If an imbalance in the pressure between the two main channels occurs, the cooling medium is more likely to flow through one of the two main channels and less likely to flow through the other main channel, resulting in an imbalance in the flow rate. The imbalance in the flow rate of the cooling medium is a factor that deteriorates the heat exchange performance of the heat exchanger, which is a problem.

In the laminated cooler disclosed in JP 2010-10418 A, the following problem may occur. Specifically, in a case where a plurality of electronic components are arranged side by side on an upstream side and a downstream side of the coolant channel in the cooling pipe, when the amount of electric current flowing through the electronic components is increased, the amount of heat generated by the electronic components is also increased. This may cause a situation where a temperature of a liquid coolant such as water is locally increased and the liquid coolant boils at a position close to a heat generating unit of the electronic component. In that case, the vaporized coolant may hinder smooth flow of liquid coolant in the cooling pipe. Thus, at the position in the coolant channel close to the electronic component, the liquid coolant is less likely to be supplied, and this may make it difficult to improve the cooling performance. In addition, particularly, in a region in which the electronic component on the downstream side is arranged in the coolant channel, the coolant vaporized by heat of the electronic component on the upstream side is supplied, and the coolant is easily evaporated due to the heat of the electronic component on the downstream side. In that case, in the vicinity of the electronic component on the downstream side, the supply amount of liquid coolant tends to be reduced, and due to what is called dry-out, the cooling performance may be deteriorated.

Thus, in order to ensure sufficient cooling performance, proper thermal design is required, such as an increase in the flow rate of the entire coolant. However, in that case, the cooler requires more energy for cooling, and thus tends to be disadvantageous in terms of cooling efficiency.

The present disclosure is to provide a technique for improving heat exchanger performance.

A first aspect of the present disclosure is a heat exchanger that cools a cooled object by heat exchange between the cooled object and a liquid coolant, the heat exchanger including: a heat exchanger body that includes a circulation path through which the coolant is circulated and performs heat exchange between the coolant flowing through the circulation path and the cooled object; a coolant supply pump that supplies the coolant to the heat exchanger body; an accumulation determination unit that determines whether a foreign matter accumulation condition is fulfilled that is satisfied when foreign matter is expected to be accumulated in at least a part of the circulation path; and a process execution unit that in response to the foreign matter accumulation condition being satisfied, executes a foreign matter cleaning process of removing the foreign matter accumulated in the circulation path and cleaning the circulation path, wherein in the foreign matter cleaning process, the process execution unit reduces an amount of coolant supplied from the coolant supply pump so that the coolant has a superheating degree in a nucleate boiling region.

A second aspect of the present disclosure is a heat exchanger including: a channel pipe that has an outer surface serving as a heat exchange surface for an external heat exchange object; a plate-shaped partition member that partitions the channel pipe into a plurality of channels through which a heat transfer medium flows, and an internal fin that is provided in the channel pipe to divide each of the plurality of channels into a plurality of narrow channels, wherein the partition member is provided with a communication hole through which at least two of the plurality of channels communicate with each other, the internal fin is configured to have a corrugated cross-sectional shape in which a plurality of convex portions and a plurality of concave portions facing the partition member are alternately formed and to be joined to the partition member at the convex portions; and the communication hole is provided at a joining portion of the partition member to which the convex portion of the internal fin is joined.

A third aspect of the present disclosure is a heat exchanger including: a cooling pipe inside which is provided a coolant channel through which a coolant is circulated; and a first electronic component and a second electronic component that are arranged thermally in contact with a cooling surface of the cooling pipe, wherein: the first electronic component is arranged on an upstream side of the second electronic component in the coolant channel; the coolant channel has an intermediate region located on a downstream side of the first electronic component and an upstream side of the second electronic component, an upstream region located between an upstream end of the first electronic component and a downstream end of the first electronic component, and a downstream region located between an upstream end of the second electronic component and a downstream end of the second electronic component; and a fluid diode unit is provided in the intermediate region, in the upstream region and the downstream region, the cooling pipe includes an internal fin that partitions the coolant channel into a plurality of branch channels that extend parallel to each other in a channel direction, and the fluid diode unit causes a channel resistance in a direction from the downstream region toward the upstream region to be higher than a channel resistance in a direction from the upstream region toward the downstream region.

A fourth aspect of the present disclosure is a heat exchanger including: a cooling pipe inside which is provided a coolant channel through which a coolant is circulated; and a first electronic component and a second electronic component that are arranged thermally in contact with a cooling surface of the cooling pipe, wherein: the first electronic component is arranged on an upstream side of the second electronic component in the coolant channel; the cooling pipe includes an internal fin that partitions the coolant channel into a plurality of branch channels that extend parallel to each other in a channel direction; the coolant channel has an intermediate region located on a downstream side of the first electronic component and an upstream side of the second electronic component, an upstream region located between an upstream end of the first electronic component and a downstream end of the first electronic component, and a downstream region located between an upstream end of the second electronic component and a downstream end of the second electronic component; and only in the intermediate region among the upstream region, the intermediate region, and the downstream region, the internal fin is provided with a diffusion unit through which adjacent branch channels communicate with each other.

In the heat exchanger of the first aspect, when foreign matter is expected to be accumulated in at least a part of the circulation path of the heat exchanger body, the amount of coolant supplied to the heat exchanger body is reduced so that the coolant has a superheating degree. In a case where the coolant has a superheating degree in the nucleate boiling region, gas bubbles are generated in the circulation path, and the foreign matter accumulated in the circulation path can be removed by a force generated when a volume change of the gas bubbles or disappearance of the gas bubbles occurs.

Such a configuration capable of removing the foreign matter by adjusting the amount of coolant supplied to the heat exchanger body does not require a dedicated device such as an ultrasonic wave generation unit, leading to simplification of the heat exchanger. Thus, the heat exchanger of the first aspect can remove the foreign matter accumulated in the circulation path and clean the circulation path with a simple configuration.

The expression "the coolant has a superheating degree in the nucleate boiling region" means a state in which, with regard to a saturation start point and a burnout point indicated by a boiling curve, the superheating degree of the coolant exceeds the saturation start point and is the burnout point or less. The term "superheating degree" means a temperature difference between a temperature of a heat transfer portion between the cooled object and the coolant and a saturation temperature of the coolant, and is defined, for example, as a value obtained by subtracting the saturation temperature of the coolant from the temperature of the heat transfer portion between the cooled object and the coolant.

In the heat exchanger of the second aspect, the heat transfer medium flowing in the channel pipe exchanges heat with the external heat exchange object through the heat exchange surface which is the outer surface of the channel pipe. The channel pipe is partitioned by the plate-shaped partition member into the plurality of channels, and the heat transfer medium flows each of the plurality of channels. At least two of the plurality of channels communicate with each other through the communication hole provided in the partition member.

Thus, for example, even when an imbalance in pressure occurs between at least two of the channels due to boiling of the heat transfer medium or the like, by distributing the pressure so that the pressure in the channel on the high-pressure side is shared with the channel on the low-pressure side through the communication hole of the partition member, the imbalance in the pressure can be reduced. Therefore, it is possible to prevent the imbalance in the pressure between the plurality of channels formed by partitioning the channel pipe.

In the heat exchanger of the third aspect, the fluid diode unit is provided in the intermediate region. Thus, even when a part of the liquid coolant in the downstream region is evaporated to be vapor by heat of the second electronic component on the downstream side, the vapor can be prevented from flowing backward to the upstream region. As a result, the vapor is discharged easily and early from a downstream end of the coolant channel.

Therefore, a smooth flow of coolant from the upstream side toward the downstream side of the coolant channel can be ensured. As a result, the cooling performance for not only the first electronic component but also the second electronic component can be improved.

In the heat exchanger of the fourth aspect, the diffusion unit is formed in the intermediate region. Accordingly, even when the coolant is evaporated to vapor by heat of the first electronic component and the second electronic component, the vapor can be diffused in a direction orthogonal to the channel direction through the diffusion unit. Thus, the vapor generated in the branch channel in the vicinity of a center of the coolant channel can be released outward. Accordingly, in the vicinity of the center, the liquid coolant can be smoothly introduced and efficient cooling of the first electronic component and the second electronic component can be ensured.

As described above, the above aspects can improve heat exchanger performance.

Embodiments of the present disclosure will be described below with reference to the drawings.

In the embodiments, portions identical or equivalent to those described in a preceding embodiment are given the same reference numerals and may not be redundantly described. When only a part of a component is described in the embodiments, the component described in the preceding embodiment can be applied to the other parts of the component. Even if not explicitly stated, the embodiments may be partially combined, provided there is no inconsistency in the combination.

First to seventh embodiments of the heat exchanger of the first aspect of the present disclosure will be described with reference to the drawings. An object of the disclosure is to provide a heat exchanger capable, with a simple configuration, of removing foreign matter accumulated in a circulation path through which a coolant is circulated, thereby improving heat exchanger performance.

First Embodiment

A heat exchanger 1 of the present embodiment will be described with reference to FIGS. 1 to 11. The heat exchanger 1 is a device that performs heat exchange between a cooled object and a coolant. The heat exchanger 1 of the present embodiment is an in-vehicle device mounted on a vehicle, and is configured to cool a cooled object such as a heat generating device mounted on the vehicle.

As shown in FIG. 1, the heat exchanger 1 includes a circulation circuit 10 through which a coolant is circulated, a circulation pump 12 that causes the coolant to be circulated, a heat exchanger body 14 that cools a cooled object by heat exchange between the cooled object and the coolant, a radiator 16 that causes the coolant to radiate heat, and a control device 100.

The circulation circuit 10 is configured as a closed circuit. The circulation circuit 10 is filled with a liquid coolant. The coolant is composed of an antifreeze containing an anticorrosive that prevents generation of rust. The antifreeze is a known long-life coolant. The antifreeze is, for example, a liquid coolant obtained by adding an anticorrosive, an antioxidant, and the like to water containing ethylene glycol.

The circulation pump 12 is an electric pump provided in the circulation circuit 10. The circulation pump 12 includes an electric motor, and is driven by a driving force of the electric motor. The circulation pump 12 can change a flow rate of the coolant in the circulation circuit 10 by changing a rotational speed of the electric motor (i.e., pump rotational speed). The pump rotational speed can be changed according to a control signal from the control device 100 (described later). In the present embodiment, the circulation pump 12 constitutes a coolant supply pump that supplies the coolant to the heat exchanger body 14.

The heat exchanger body 14 is provided in the circulation circuit 10. The heat exchanger body 14 includes a plurality of cooling pipes 142 that form a circulation path 140 through which the coolant is circulated, and performs heat exchange between the coolant flowing through the circulation path 140 and the cooled object.

The heat exchanger body 14 of the present embodiment is composed of a component cooler that is configured to cool, as the cooled object, an electronic component 20 used in an inverter mounted on the vehicle and cools the electronic component 20 by heat exchange between the electronic component 20 and the coolant. The heat exchanger body 14 is configured as a laminate in which the plurality of cooling pipes 142 are laminated with the electronic component 20 interposed between the plurality of cooling pipes 142.

The electronic component 20 generates heat by energization. Thus, the electronic component 20 constitutes a heating element that generates heat by energization. The electronic component 20 is connected to a drive circuit 22. The electronic component 20 is composed of, for example, a semiconductor module with an integrated semiconductor device composed of a SiC substrate that has better performance characteristics at high temperature than other semiconductor devices such as a semiconductor device composed of a Si substrate.

The drive circuit 22 constitutes an adjustment unit for adjusting the energization amount to the electronic component 20. The drive circuit 22 is configured to be able to change the energization amount to the electronic component 20 according to a control signal from the control device 100 (described later).

The radiator 16 is provided on a coolant flow downstream side of the heat exchanger body 14 in the circulation circuit 10. The radiator 16 causes the coolant whose temperature has been increased in the heat exchanger body 14 to radiate heat by heat exchange with outside air. The radiator 16 also functions as a coolant tank that stores the coolant. The radiator 16 may be configured to cause the coolant whose temperature has been increased in the heat exchanger body 14 to radiate heat by heat exchange with a heat transfer medium other than outside air.

Next, the control device 100 that constitutes an electronic control unit of the heat exchanger 1 will be described. The control device 100 is composed of a well-known microcomputer including a processor and a memory 110, and a peripheral circuit of the microcomputer. The memory 110 of the control device 100 is composed of a non-transitory tangible storage medium.

An input side of the control device 100 is connected to a flow rate sensor 101, a differential pressure sensor 102, a coolant temperature sensor 103, and the like as means for detecting a state of the coolant in the circulation circuit 10 and the like.

The flow rate sensor 101 is a sensor that detects a flow rate Gr of the coolant flowing into the heat exchanger body 14. The flow rate sensor 101 is provided at a portion of the circulation circuit 10 between a coolant outlet of the circulation pump 12 and a coolant inlet of the heat exchanger body 14.

The differential pressure sensor 102 is a sensor that detects a difference in pressure between the coolant inlet and a coolant outlet of the heat exchanger body 14 as a pressure loss $\Delta P$ of the heat exchanger body 14. The differential pressure sensor 102 is configured to output, as the pressure difference, a value obtained by subtracting the pressure on the coolant outlet side of the heat exchanger body 14 from the pressure on the coolant inlet side of the heat exchanger body 14.

The coolant temperature sensor 103 is a sensor that detects a temperature (i.e., coolant temperature Tw) of the coolant flowing into the heat exchanger body 14. The coolant temperature sensor 103 is provided at a portion of the circulation circuit 10 between a coolant outlet of the radiator 16 and a coolant inlet of the circulation pump 12.

The input side of the control device 100 is connected to a device temperature sensor 104 that detects a device temperature Td, which is a temperature of the electronic component 20. The device temperature sensor 104 is configured to directly detect the device temperature Td. The device temperature sensor 104 may be configured to indirectly detect the device temperature Td on the basis of the energization amount to the electronic component 20 or the like.

Furthermore, the control device 100 is connected to a vehicle control device 120 so that the control device 100 can bidirectionally communicate with the vehicle control device 120. The vehicle control device 120 controls driving operation of the vehicle and the like. Thus, the control device 100 can acquire information such as a traveling state of the vehicle via the vehicle control device 120.

On the other hand, an output side of the control device 100 is connected to the electric motor of the circulation pump 12, the drive circuit 22 of the electronic component 20, and the like. The control device 100 controls the electric motor of the circulation pump 12, the drive circuit 22 of the electronic component 20, and the like on the basis of information acquired from various sensors or the like.

The control device 100 collectively includes hardware and software constituting a process execution unit that executes various processes, a determination unit that determines satisfaction or dissatisfaction of various conditions, an arithmetic unit that performs various computations, and the like.

The control device 100 collectively includes, for example, a process execution unit 100a that executes a foreign matter cleaning process of removing foreign matter accumulated in the circulation path 140 of the heat exchanger body 14 and cleaning the circulation path 140. The foreign matter cleaning process is a process of generating gas bubbles of the coolant and removing the foreign matter accumulated in the circulation path 140 by a force generated when a volume change of the gas bubbles or disappearance of the gas bubbles occurs.

Furthermore, the control device 100 collectively includes an arithmetic unit 100b that calculates a blockage degree OD of the circulation path 140 and the like. The blockage degree OD is an index for clogging of the circulation path 140. The blockage degree OD is set to have a minimum value (e.g., 0%) when no foreign matter is accumulated and have a maximum value (e.g., 100%) when the circulation path 140 is completely blocked by foreign matter or the like.

Furthermore, the control device 100 collectively includes an accumulation determination unit 100c that determines whether a foreign matter accumulation condition is fulfilled that is satisfied when foreign matter is expected to be accumulated in at least a part of the circulation path 140. The foreign matter accumulation condition of the present embodiment is a condition that is satisfied when the blockage degree OD exceeds a predetermined blockage threshold ODth1.

Figure 2:
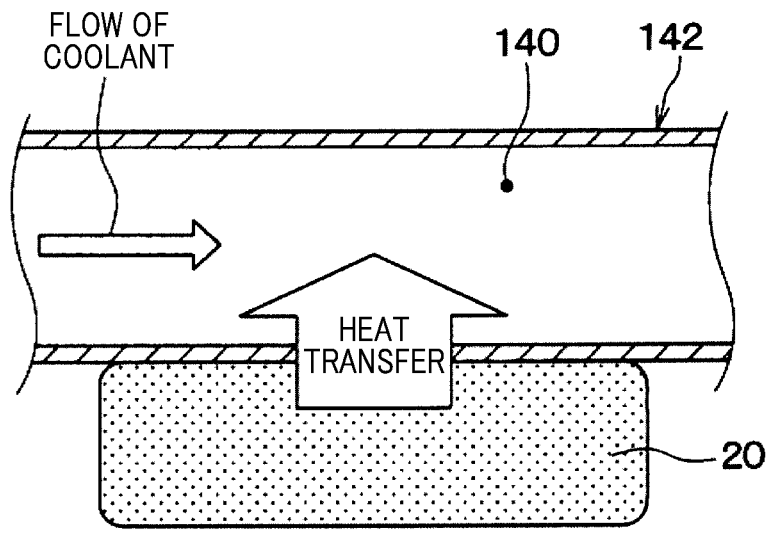
FIG. 2 is an explanatory diagram illustrating heat exchange between a coolant and an electronic component of the heat exchange device according to the first embodiment.

Next, operation of the heat exchanger 1 of the present embodiment will be described. In the heat exchanger 1, for example, when the vehicle is started and heat is generated by the electronic component 20, the control device 100 drives the circulation pump 12 to execute a cooling process for the electronic component 20. As shown in FIG. 2, the coolant discharged from the circulation pump 12 flows into the circulation path 140 of the heat exchanger body 14. At this time, heat of the electronic component 20 is transferred to the coolant flowing through the circulation path 140 to cool the electronic component 20. The coolant flowing out of the circulation path 140 of the heat exchanger body 14 radiates heat to outside air in the radiator 16, and is then sucked into the circulation pump 12.

Figure 3:
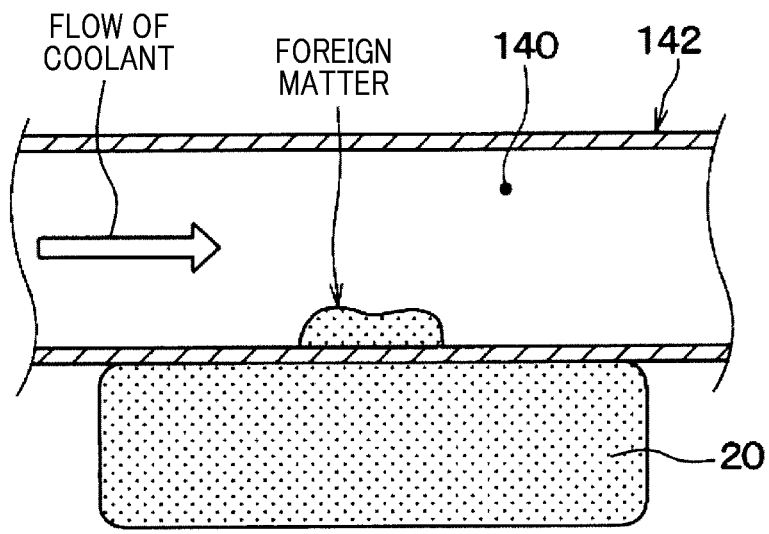
FIG. 3 is an explanatory diagram illustrating a state in which foreign matter is accumulated in a coolant circulation path of the heat exchange device according to the first embodiment.

The temperature of the coolant flowing through the circulation path 140 is increased by heat from the electronic component 20. When the electronic component 20 is at high temperature, in some cases, the temperature of the coolant is increased close to a saturation temperature Ts. According to research and study by the inventors, when the temperature of the coolant is increased close to the saturation temperature Ts, in some cases, a part of the anticorrosive or impurities in the water contained in the coolant are deteriorated and solidified, and the solidified substance is accumulated as foreign matter on a wall surface of the circulation path 140 as shown in FIG. 3. Such a phenomenon presumably occurs because the components constituting the coolant are locally concentrated around gas bubbles generated by boiling, and a hydrogen ion exponent pH is increased, resulting in precipitation of foreign matter derived from the anticorrosive or the impurities in the water. Such foreign matter is mainly accumulated in a heat exchange section of the heat exchanger body 14. Unlike the case of foreign matter entering from outside, it is difficult to predict a part of the heat exchange section of the heat exchanger body 14 at which such foreign matter is accumulated. Thus, for example, even if a filter for capturing the foreign matter is placed on a coolant flow upstream side in the heat exchange section of the heat exchanger body 14, it is difficult to achieve an effect of capturing the foreign matter by the filter. Accumulation as the foreign matter of the solidified anticorrosive or impurities in the water of the antifreeze has been found as a result of the study by the inventors.

When foreign matter is accumulated in the circulation path 140, the accumulated foreign matter serves as a thermal resistance that hinders heat transfer between the coolant and the electronic component 20, and deteriorates the cooling performance for the electronic component 20. When foreign matter is accumulated in the circulation path 140, fine irregularities formed on an inner wall of the circulation path 140 are smoothed by the foreign matter, and thus a heat transfer area between the coolant and the electronic component 20 is reduced. This is also a factor that deteriorates the cooling performance for the electronic component 20.

Figure 4:
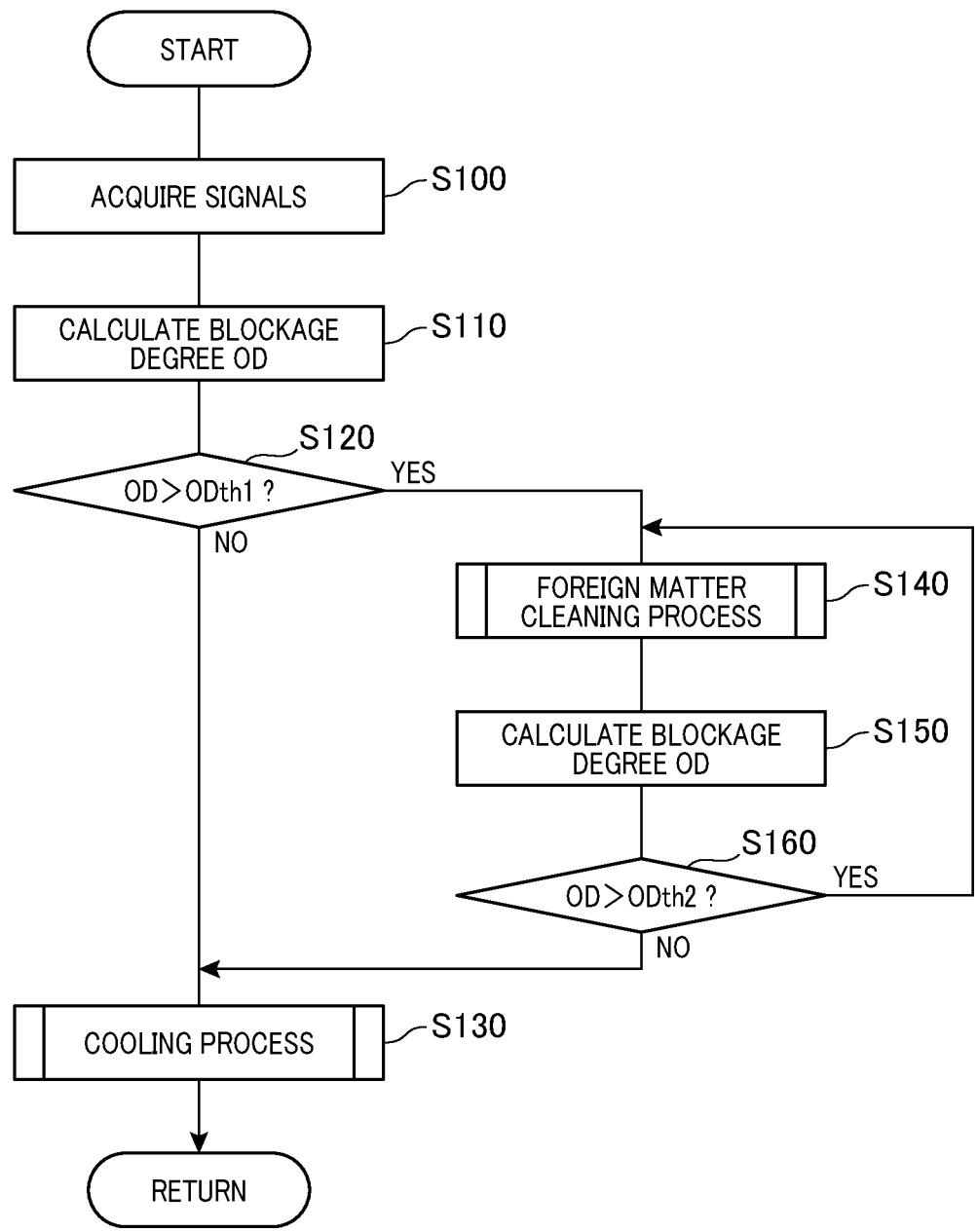
FIG. 4 is a flow chart showing an example of a control process executed by a control device of the heat exchange device according to the first embodiment.

In this regard, the heat exchanger 1 is configured such that the control device 100 executes a control process including the foreign matter cleaning process. An example of the control process executed by the control device 100 will be described below with reference to a flow chart shown in FIG. 4. The control process shown in FIG. 4 is executed by the control device 100 at regular or irregular intervals, for example, after the vehicle is started. Control steps of the control process shown in FIG. 4 constitute a function implementation unit that implements various functions implemented by the control device 100.

As shown in FIG. 4, at step S100, the control device 100 acquires various signals from various sensors, the vehicle control device 120, or the like. Then, at step S110, the control device 100 calculates the blockage degree OD of the circulation path 140 of the heat exchanger body 14.

In the heat exchanger body 14, when the blockage degree OD of the circulation path 140 is increased by foreign matter, the flow rate Gr of the coolant flowing into the heat exchanger body 14 is reduced, and the pressure loss ΔP of the heat exchanger body 14 is increased. Accordingly, the blockage degree OD of the circulation path 140 is highly correlated with the flow rate Gr of the coolant and the pressure loss ΔP.

Figure 5:
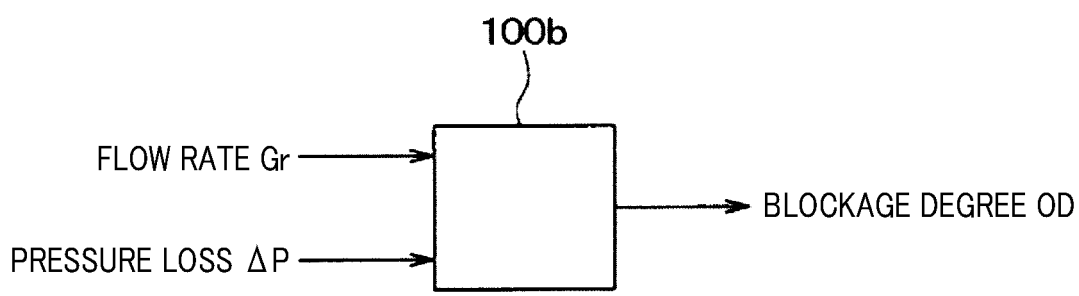
FIG. 5 is an explanatory diagram illustrating a method of calculating a blockage degree of the heat exchange device according to the first embodiment.

Thus, as shown in FIG. 5, the control device 100 is configured such that the arithmetic unit 100b calculates the blockage degree OD of the circulation path 140 on the basis of the flow rate Gr of the coolant flowing into the heat exchanger body 14 and the pressure loss ΔP of the heat exchanger body 14. The arithmetic unit 100b refers to, for example, a control map that defines a correspondence between the flow rate Gr of the coolant, the pressure loss ΔP, and the blockage degree OD, and calculates the blockage degree OD on the basis of a detection value obtained by the flow rate sensor 101 and a detection value obtained by the differential pressure sensor 102. The arithmetic unit 100b may be configured to calculate the blockage degree OD, for example, by using a function that defines, as a mathematical expression, the correspondence between the flow rate Gr of the coolant, the pressure loss ΔP, and the blockage degree OD.

Returning to FIG. 4, at step S120, the control device 100 determines whether the blockage degree OD exceeds the predetermined blockage threshold ODth1. The blockage threshold ODth1 is set in advance to a value that ensures the cooling performance of the heat exchanger body 14 for the electronic component 20. The blockage threshold ODth1 is not limited to a fixed value set in advance, and may be, for example, a variable value that is successively changed.

When the blockage degree OD is the blockage threshold ODth1 or less, there is not much foreign matter accumulated in the circulation path 140, and presumably, the heat exchanger body 14 can sufficiently cool the electronic component 20. Thus, at step S130, the control device 100 executes the cooling process for the electronic component 20. In the cooling process, the control device 100 controls the circulation pump 12 so that a pump rotational speed N of the circulation pump 12 is a normal rotational speed Nn.

On the other hand, when the blockage degree OD exceeds the blockage threshold ODth1, foreign matter is accumulated in the circulation path 140, and the cooling performance of the heat exchanger body 14 for the electronic component 20 may be deteriorated. Thus, control proceeds to step S140, and the control device 100 executes the foreign matter cleaning process of removing the foreign matter accumulated in the circulation path 140. Details of the foreign matter cleaning process will be described with reference to a flow chart shown in FIG. 6.

Figure 6:
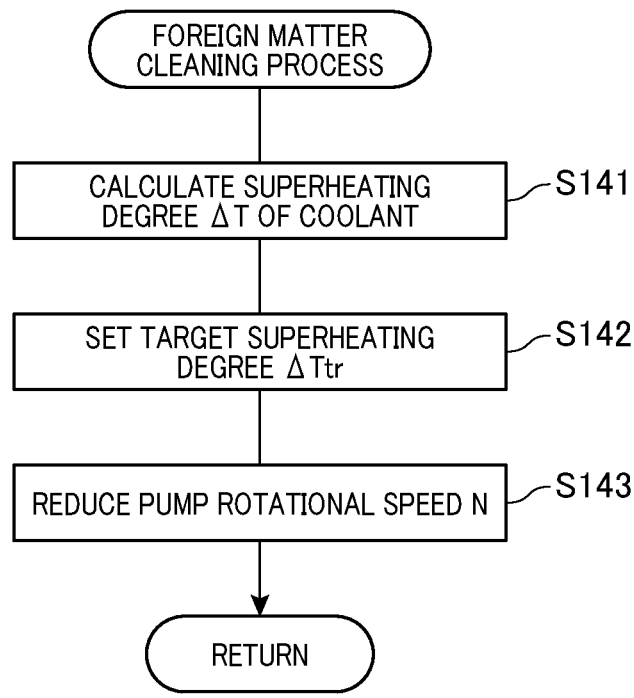
FIG. 6 is a flow chart showing an example of a foreign matter cleaning process executed by the control device of the heat exchange device according to the first embodiment.

As shown in FIG. 6, first, at step S141, the control device 100 calculates a superheating degree ΔT of the coolant flowing through the circulation path 140. The superheating degree ΔT of the coolant is a temperature difference between a temperature of a heat transfer portion between the coolant and the electronic component 20 and the saturation temperature Ts of the coolant.

The temperature of the heat transfer portion between the coolant and the electronic component 20 is correlated with the device temperature Td of the electronic component 20. The saturation temperature Ts of the coolant is correlated with the coolant temperature Tw, which is the temperature of the coolant flowing into the heat exchanger body 14. Accordingly, the superheating degree ΔT of the coolant is correlated with the device temperature Td and the coolant temperature Tw.

Figure 7:
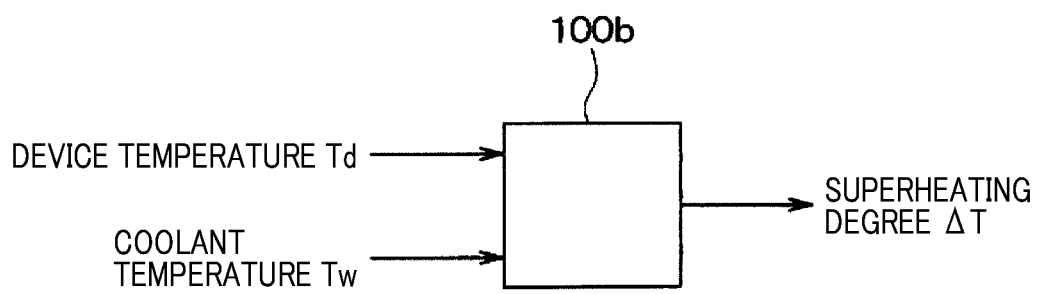
FIG. 7 is an explanatory diagram illustrating a method of calculating a superheating degree of the heat exchange device according to the first embodiment.

Thus, as shown in FIG. 7, the control device 100 is configured such that the arithmetic unit 100b calculates the superheating degree ΔT of the coolant on the basis of the device temperature Td of the electronic component 20 and the coolant temperature Tw, which is the temperature of the coolant flowing into the heat exchanger body 14. The arithmetic unit 100b refers to, for example, a control map that defines a correspondence between the device temperature Td, the coolant temperature Tw, and the superheating degree ΔT, and calculates the superheating degree ΔT of the coolant on the basis of a detection value obtained by the device temperature sensor 104 and a detection value obtained by the coolant temperature sensor 103. The arithmetic unit 100b may be configured to calculate the superheating degree ΔT of the coolant, for example, by using a function that defines, as a mathematical expression, the correspondence between the device temperature Td, the coolant temperature Tw, and the superheating degree ΔT.

Subsequently, at step S142, the control device 100 sets a target superheating degree ΔTtr. The target superheating degree ΔTtr is a target value of the superheating degree ΔT of the coolant during execution of the foreign matter cleaning process, and is set to a value within a nucleate boiling region.

Figure 8:
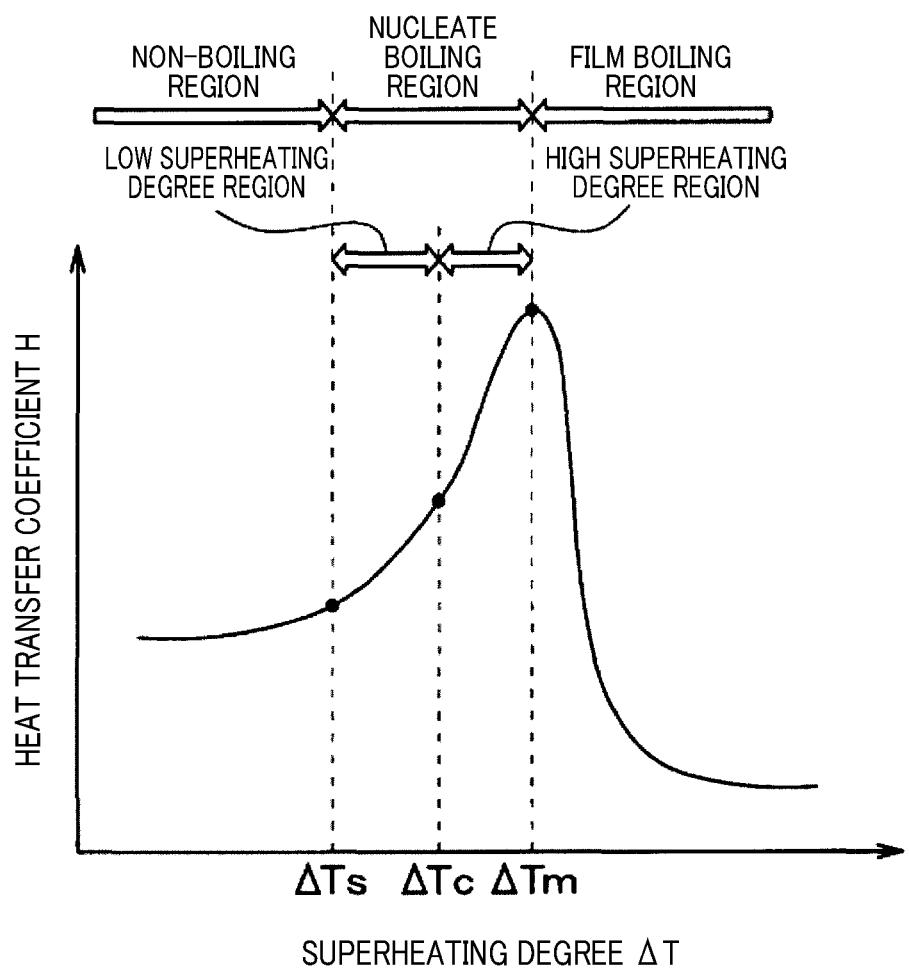
FIG. 8 is an explanatory diagram illustrating a relationship between the superheating degree and a heat transfer coefficient.

FIG. 8 shows a boiling curve indicating a form of boiling phenomenon of the coolant as a relationship between the superheating degree ΔT of the coolant and a heat transfer coefficient H of the heat transfer portion between the coolant and the electronic component 20. As shown in FIG. 8, in a non-boiling region in which the superheating degree ΔT of the coolant is less than a saturation start point ΔTs, the coolant does not boil and heat is transferred by natural convection. The saturation start point ΔTs is the superheating degree at which generation of gas bubbles of the coolant is started.

In the nucleate boiling region in which the superheating degree ΔT of the coolant exceeds the saturation start point ΔTs, boiling is started and heat flux is increased, and thus the heat transfer coefficient H is increased. In the nucleate boiling region, as the superheating degree ΔT is increased, the heat transfer coefficient H is increased. The nucleate boiling region is a region in which the superheating degree $\Delta T$ of the coolant ranges from the saturation start point $\Delta Ts$ to a burnout point $\Delta Tm$. The burnout point $\Delta Tm$ is the superheating degree at which the heat transfer coefficient H is maximum in the nucleate boiling region.

In a film boiling region in which the superheating degree $\Delta T$ of the coolant exceeds the burnout point $\Delta Tm$, a vapor film is formed in the vicinity of the heat transfer portion between the coolant and the electronic component 20. Thus, in the film boiling region, the vapor film formed in the vicinity of the heat transfer portion serves as a thermal resistance that hinders heat exchange between the coolant and the electronic component 20, and the heat transfer coefficient H is reduced. In the film boiling region, generation of gas bubbles in the vicinity of the heat transfer portion is prevented, and thus the foreign matter is less likely to be removed than in the nucleate boiling region.

In the nucleate boiling region, a gradient of the heat transfer coefficient H is maximum in the vicinity of an intermediate point $\Delta Tc$ between the saturation start point $\Delta Ts$ and the burnout point $\Delta Tm$. In the present embodiment, in the nucleate boiling region, a region from the saturation start point $\Delta Ts$ to the intermediate point $\Delta Tc$ is referred to as a low superheating degree region, and a region from the intermediate point $\Delta Tc$ to the burnout point $\Delta Tm$ is referred to as a high superheating degree region. The high superheating degree region is also a region in which the superheating degree is closer to the burnout point $\Delta Tm$ than to the saturation start point $\Delta Ts$.

In the nucleate boiling region, when the superheating degree $\Delta T$ of the coolant is in the high superheating degree region in which the superheating degree is closer to the burnout point $\Delta Tm$ than to the saturation start point $\Delta Ts$, due to an increase in the number of points at which gas bubbles are generated or the like, a force generated when a volume change of the gas bubbles or disappearance of the gas bubbles occurs tends to be larger than in the low superheating degree region. Thus, in the high superheating degree region, the foreign matter is presumably more likely to be removed than in the low superheating degree region.

Thus, the control device 100 sets, as the target superheating degree $\Delta Ttr$, a superheating degree in the high superheating degree region. For example, the target superheating degree $\Delta Ttr$ is set to be higher as the blockage degree OD is higher. The target superheating degree $\Delta Ttr$ may be a fixed value determined in advance instead of a variable value.

Figure 9:
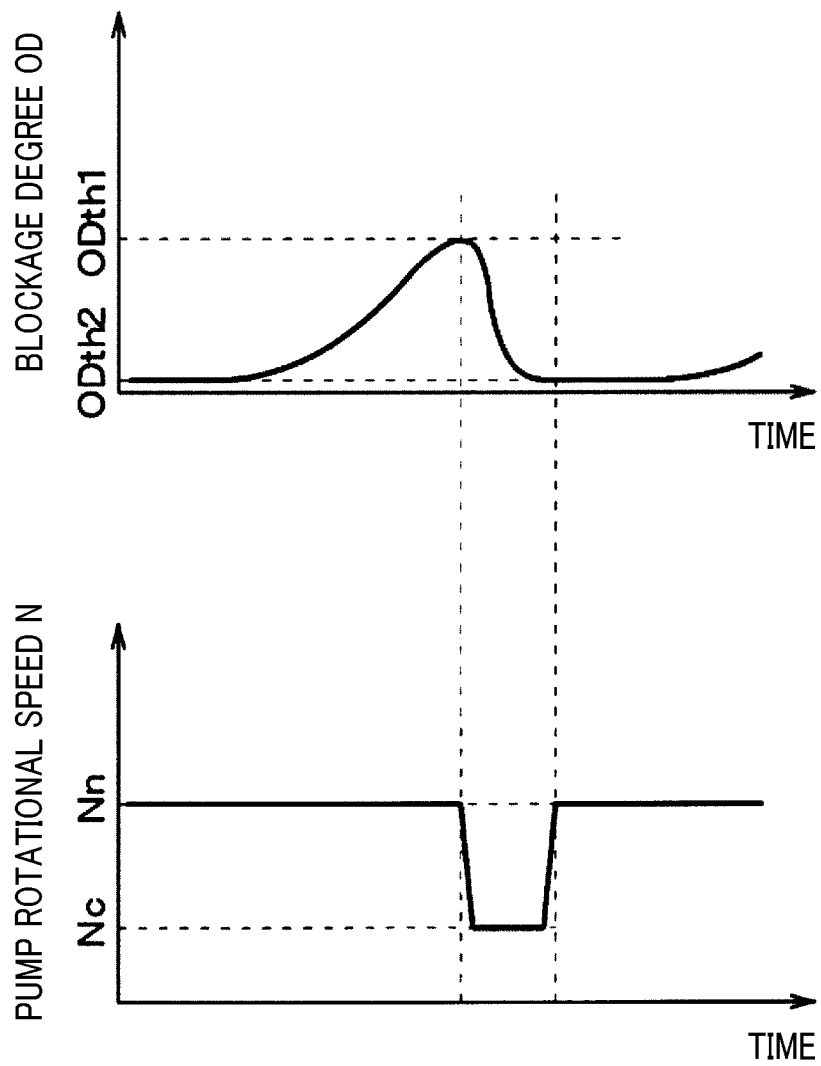
FIG. 9 is an explanatory diagram illustrating operation of a coolant supply pump of the heat exchange device according to the first embodiment.

Subsequently, at step S143, the control device 100 reduces the amount of coolant supplied from the circulation pump 12 to the heat exchanger body 14 so that the coolant has a superheating degree in the nucleate boiling region. Thus, as shown in FIG. 9, the control device 100 controls operation of the circulation pump 12 so that the pump rotational speed N of the circulation pump 12 is a pump rotational speed Nc which is lower than the pump rotational speed Nn during the cooling process.

The control device 100 of the present embodiment sets, as the target superheating degree $\Delta Ttr$, a superheating degree closer to the burnout point $\Delta Tm$ than to the saturation start point $\Delta Ts$, and reduces the amount of coolant supplied from the circulation pump 12 to the heat exchanger body 14 so that the superheating degree $\Delta T$ of the coolant approaches the target superheating degree $\Delta Ttr$. Specifically, the control device 100 reduces the pump rotational speed N of the circulation pump 12 by feedback control so that the superheating degree $\Delta T$ of the coolant approaches the target superheating degree $\Delta Ttr$.

Figure 10:
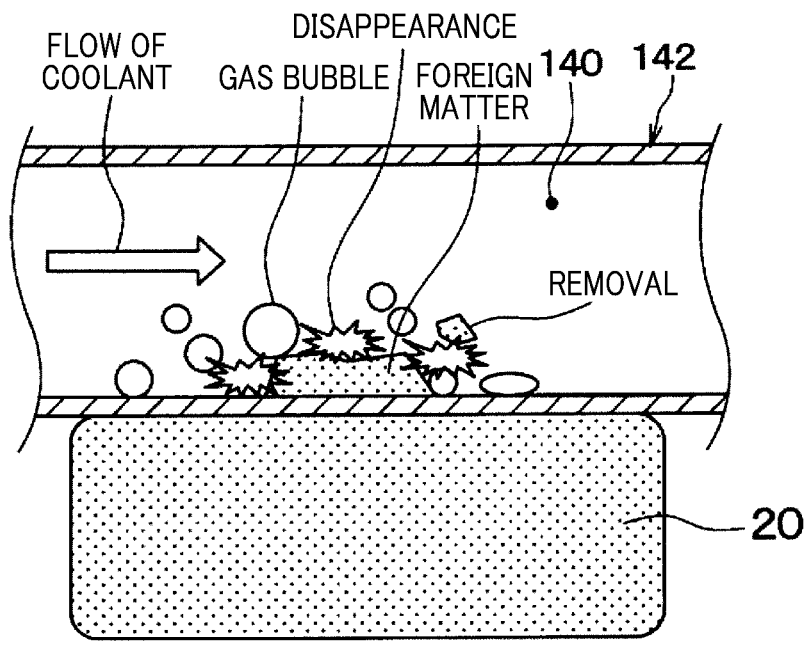
FIG. 10 is an explanatory diagram illustrating removal of the foreign matter accumulated in the coolant circulation path.

When the amount of coolant supplied to the heat exchanger body 14 is reduced, the temperature of the heat transfer portion between the coolant and the electronic component 20 is increased. Then, when the superheating degree $\Delta T$ reaches the nucleate boiling region, as shown in FIG. 10, gas bubbles are generated in the circulation path 140, and the foreign matter accumulated in the circulation path 140 is removed by a force generated when a volume change of the gas bubbles or disappearance of the gas bubbles occurs.

Returning to FIG. 4, at step S150, the control device 100 acquires again a detection value obtained by the flow rate sensor 101, a detection value obtained by the differential pressure sensor 102, and the like, and calculates the blockage degree OD on the basis of the acquired information. At step S150, the blockage degree OD is calculated by the same method as in step S110. Thus, the method of calculating the blockage degree OD at step S150 will not be described.

Subsequently, at step S160, the control device 100 determines whether the blockage degree OD of the coolant exceeds a predetermined release threshold ODth2. The release threshold ODth2 is set to a value lower than the blockage threshold ODth1. For example, the release threshold ODth2 is set to a value obtained by subtracting a predetermined value a from the blockage threshold ODth1 as expressed by the following formula F1.

$$ODth2 = ODth1 - \alpha \quad (F1)$$

When the blockage degree OD exceeds the predetermined release threshold ODth2, the removal of the foreign matter is presumably incomplete. Thus, when the blockage degree OD exceeds the predetermined release threshold ODth2, control returns to step S140 and the control device 100 continues the foreign matter cleaning process.

On the other hand, when the blockage degree OD is the predetermined release threshold ODth2 or less, the removal of the foreign matter is presumably complete. Thus, when the blockage degree OD is the predetermined release threshold ODth2 or less, control proceeds to step S130 and the control device 100 executes the cooling process for the electronic component 20.

In the present embodiment, a configuration that executes the determination process at step S120 constitutes the accumulation determination unit 100c that determines satisfaction or dissatisfaction of the foreign matter accumulation condition. The foreign matter accumulation condition is a condition that is satisfied when the blockage degree OD exceeds the blockage threshold ODth1.

In the present embodiment, a configuration that executes the process at step S140 constitutes the process execution unit 100a that executes the foreign matter cleaning process, and a configuration that executes the process at step S141, and the like constitute the arithmetic unit 100b that calculates the blockage degree OD of the circulation path 140.

The heat exchanger 1 described above is configured such that when foreign matter is expected to be accumulated in at least a part of the circulation path 140 of the heat exchanger body 14, the amount of coolant supplied to the heat exchanger body 14 is reduced so that the coolant has a superheating degree $\Delta T$ in the nucleate boiling region. According to this, the foreign matter accumulated in the circulation path 140 can be removed by a force generated at the time of occurrence of a volume change or disappearance of the gas bubbles generated in the circulation path 140. Such a configuration does not require a dedicated device such as an ultrasonic wave generation unit, leading to simplification of the heat exchanger 1. Thus, the heat exchanger 1 of the present embodiment can remove the foreign matter accumulated in the circulation path 140 and clean the circulation path 140 with a simple configuration.

Figure 11:
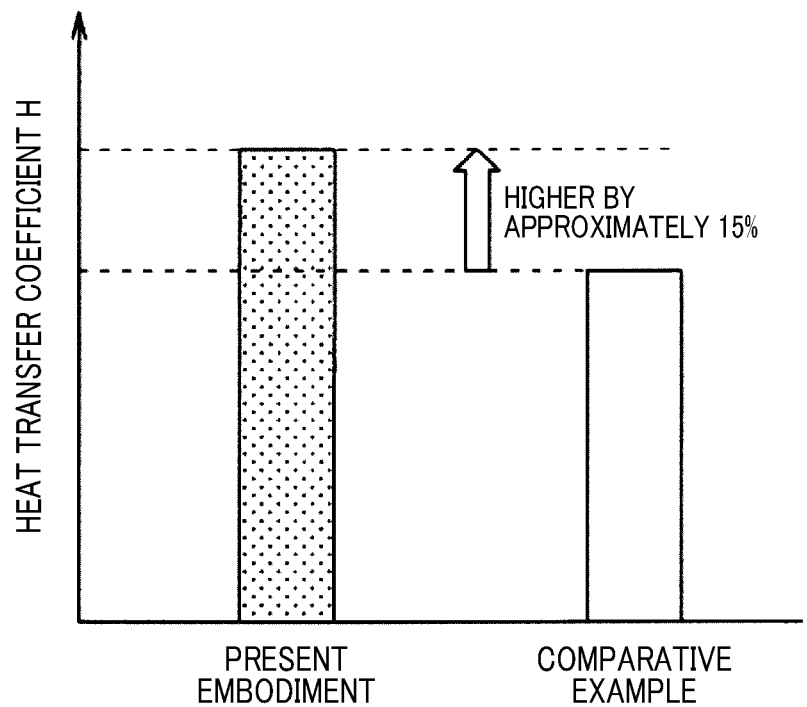
FIG. 11 is an explanatory diagram illustrating the heat transfer coefficient of the heat exchange device according to the first embodiment.

FIG. 11 shows the result of comparison between the heat transfer coefficient H of the heat exchanger 1 of the present embodiment and the heat transfer coefficient H of a heat exchange device of a comparative example of the present embodiment when the heat exchanger body 14 is used for a predetermined period. The heat exchange device of the comparative example differs from the heat exchange device of the present embodiment in that the foreign matter cleaning process is not executed. According to FIG. 11, the heat transfer coefficient H of the heat exchanger 1 of the present embodiment is higher by approximately 15% than the heat transfer coefficient H of the heat exchange device of the comparative example. This shows that since the foreign matter in the circulation path 140 is cleaned off by the foreign matter cleaning process, the cooling performance of the heat exchanger body 14 is improved.

In the foreign matter cleaning process, the heat exchanger 1 of the present embodiment sets, as the target superheating degree $\Delta Ttr$, a superheating degree $\Delta T$ closer to the burnout point $\Delta Tm$ than to the saturation start point $\Delta Ts$, and operates the circulation pump 12 so that the superheating degree $\Delta T$ of the coolant approaches the target superheating degree $\Delta Tm$. According to this, a large force is generated when a volume change of the gas bubbles or disappearance of the gas bubbles occurs, and thus the foreign matter accumulated in the circulation path 140 is easily removed.

The heat exchanger 1 of the present embodiment is configured to calculate the blockage degree OD of the circulation path 140 from the flow rate Gr of the coolant and the pressure loss $\Delta P$ and execute the foreign matter cleaning process when the blockage degree OD exceeds the blockage threshold ODth1. According to this, the foreign matter cleaning process can be executed while the foreign matter is accumulated in the circulation path 140. In other words, since the foreign matter cleaning process is not executed while no foreign matter is accumulated, unnecessary execution of the foreign matter cleaning process can be prevented.

The heat exchanger body 14 of the present embodiment is composed of a component cooler that is configured to cool, as the cooled object, the electronic component 20 generating heat by energization and cools the electronic component 20 by heat exchange between the electronic component 20 and the coolant. According to this, insufficient cooling of the electronic component 20 due to the accumulation of foreign matter in the circulation path 140 of the heat exchanger body 14 can be prevented with a simple configuration.

In particular, in the present embodiment, the electronic component 20 is composed of a SiC semiconductor device having better performance characteristics at high temperature than other semiconductor devices. According to this, even if the cooling performance of the heat exchanger body 14 is slightly deteriorated by the foreign matter cleaning process, operation of the electronic component 20 can be continued.

Modification of the First Embodiment

The first embodiment shows an example in which the cooling process for the electronic component 20 is executed when, after the foreign matter cleaning process is executed, the blockage degree OD is the predetermined release threshold ODth2 or less, but the present disclosure is not limited to this. The heat exchanger 1 may be configured to execute the cooling process for the electronic component 20, for example, when, after the foreign matter cleaning process is executed, a predetermined time has elapsed from the start of the foreign matter cleaning process.

Second Embodiment

Next, the heat exchanger 1 of a second embodiment will be described with reference to FIGS. 12 and 13. The present embodiment differs from the first embodiment in the method of calculating the blockage degree OD. In the present embodiment, portions different from those of the first embodiment will be mainly described, and the same portions as in the first embodiment may not be described.

Figure 12:
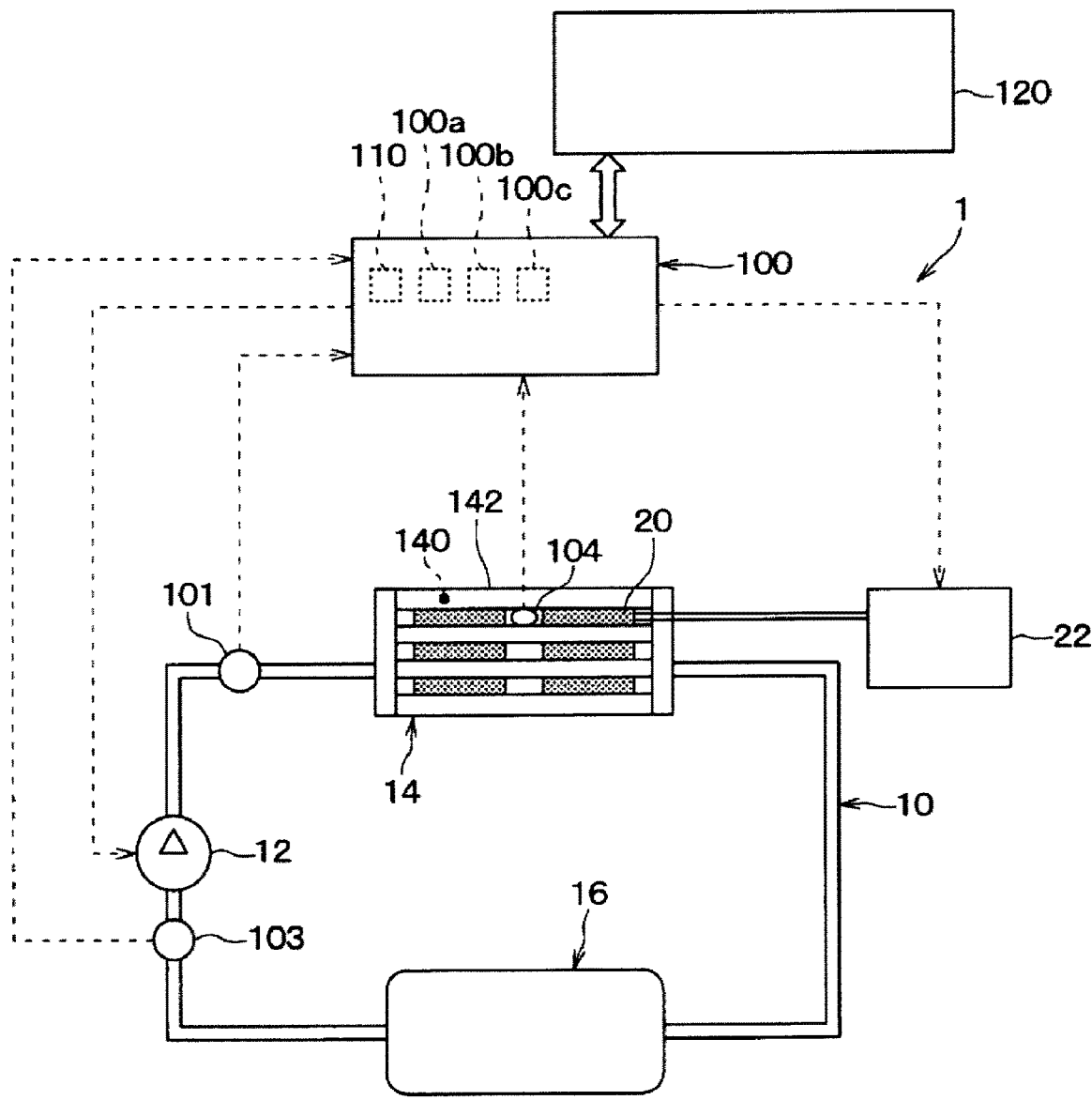
FIG. 12 is a schematic configuration diagram of a heat exchange device according to a second embodiment.

As shown in FIG. 12, in the heat exchanger 1, the differential pressure sensor 102 for detecting the pressure loss $\Delta P$ of the heat exchanger body 14 is omitted. That is, the heat exchanger 1 is provided with only the flow rate sensor 101, the coolant temperature sensor 103, and the like, and is not provided with the differential pressure sensor 102.

Figure 13:
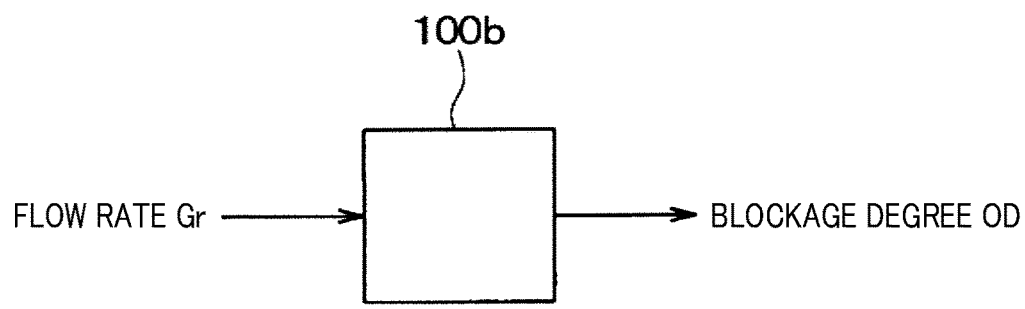
FIG. 13 is an explanatory diagram illustrating a method of calculating a blockage degree of the heat exchange device according to the second embodiment.

As shown in FIG. 13, the arithmetic unit 100b of the control device 100 is configured to calculate the blockage degree OD of the circulation path 140 on the basis of a detection value obtained by the flow rate sensor 101. Specifically, the arithmetic unit 100b refers to, for example, a control map that defines a correspondence between the flow rate Gr of the coolant and the blockage degree OD, and calculates the blockage degree OD on the basis of a detection value obtained by the flow rate sensor 101. The arithmetic unit 100b may be configured to calculate the blockage degree OD, for example, by using a function that defines, as a mathematical expression, the correspondence between the flow rate Gr of the coolant and the blockage degree OD.

The heat exchanger 1 of the present embodiment differs from the heat exchanger 1 of the first embodiment in the method of calculating the blockage degree OD, but the rest of the configuration and operation is the same as in the first embodiment. Thus, as in the first embodiment, the heat exchanger 1 of the present embodiment can achieve the same functions and effects achieved by the same configuration and operation as in the first embodiment.

In particular, the heat exchanger 1 of the present embodiment does not use the differential pressure sensor 102 to detect the blockage degree OD, and thus has an advantage that the foreign matter accumulated in the circulation path 140 can be cleaned off with a simplified configuration.

Modification of the Second Embodiment

The second embodiment shows an example in which the blockage degree OD of the circulation path 140 is calculated on the basis of a detection value obtained by the flow rate sensor 101, but the present disclosure is not limited to this. The heat exchanger 1 may be configured to calculate the blockage degree OD, for example, on the basis of the pressure loss $\Delta P$ of the heat exchanger body 14. In this case, the heat exchanger 1 includes the differential pressure sensor 102 but does not need to include the flow rate sensor 101, and thus the foreign matter accumulated in the circulation path 140 can be cleaned off with a simplified configuration.

The heat exchanger 1 may be configured to calculate the blockage degree OD, for example, by taking into consideration not only the flow rate Gr of the coolant and the pressure loss $\Delta P$ but also the period of use of the heat exchanger body 14, the pump rotational speed N, and the coolant temperature Tw.

Third Embodiment

Figure 14:
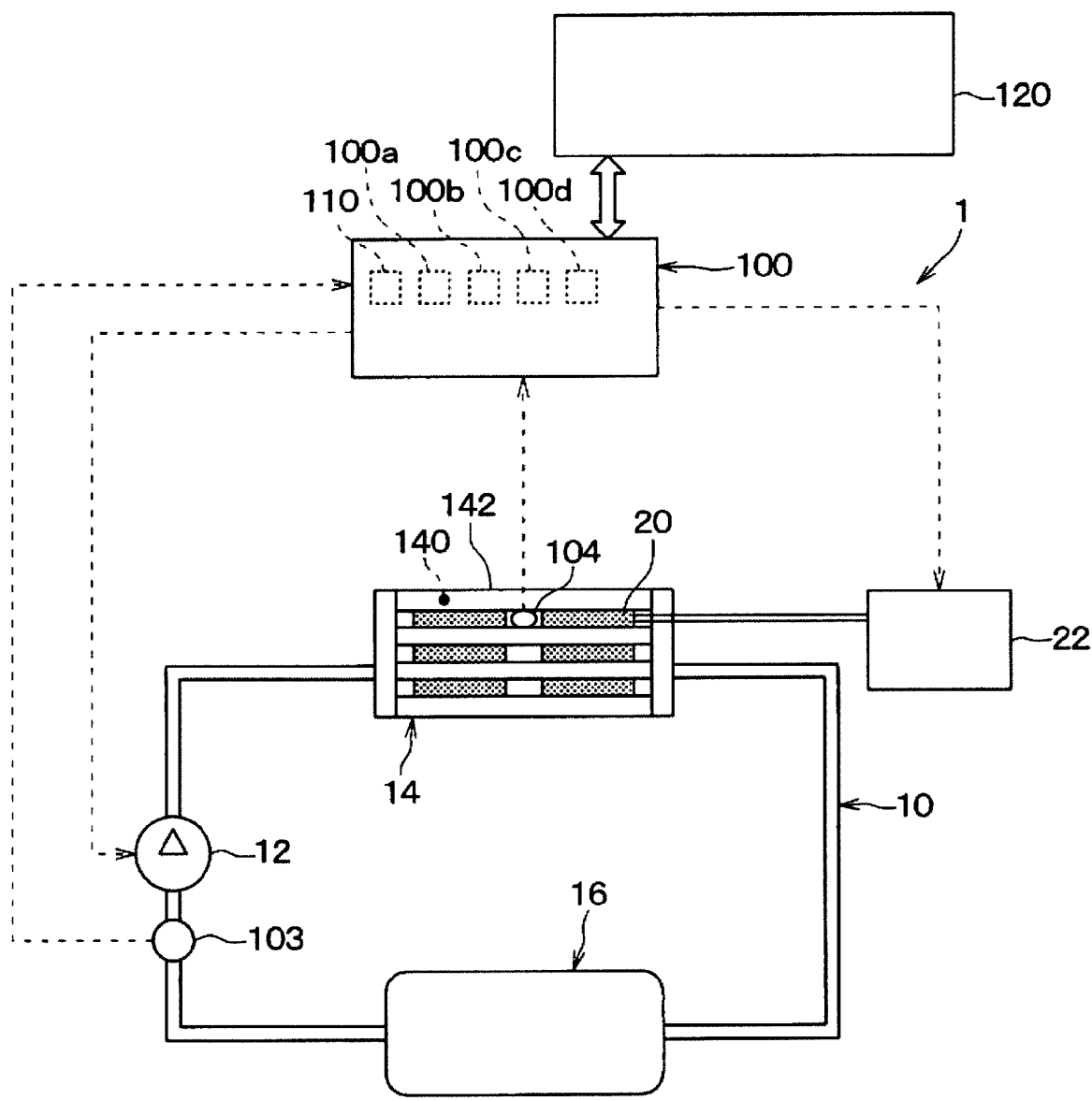
FIG. 14 is a schematic configuration diagram of a heat exchange device according to a third embodiment.

Next, the heat exchanger 1 of a third embodiment will be described with reference to FIGS. 14 to 16. The present embodiment differs from the first embodiment in that elapsed time Tv from the start of use of the heat exchanger body 14 or the like is a factor that determines satisfaction or dissatisfaction of the foreign matter accumulation condition. In the present embodiment, portions different from those of the first embodiment will be mainly described, and the same portions as in the first embodiment may not be described.

The heat exchanger 1 of the present embodiment is configured such that the control device 100 can measure elapsed time from the start of use of the heat exchanger body 14 or elapsed time from the previous foreign matter cleaning process. Specifically, as shown in FIG. 14, the control device 100 aggregates a timer unit 100d for measuring the elapsed time Tv from the start of use of the heat exchanger body 14 or elapsed time Tv from the previous foreign matter cleaning process. The timer unit 100d is implemented by hardware and software constituting the control device 100.

According to findings by the inventors, foreign matter tends to be more likely to be accumulated in the circulation path 140 as the elapsed time Tv from the start of use of the heat exchanger body 14 or the elapsed time Tv from the previous foreign matter cleaning process is increased.

Thus, the control device 100 of the present embodiment is configured to execute the foreign matter cleaning process on the basis of not the blockage degree OD of the circulation path 140 but the elapsed time Tv from the start of use of the heat exchanger body 14 or the elapsed time Tv from the previous foreign matter cleaning process. Since the blockage degree OD of the circulation path 140 does not need to be calculated, the heat exchanger 1 of the present embodiment is not provided with the flow rate sensor 101 or the differential pressure sensor 102.

An example of the control process executed by the control device 100 of the present embodiment will be described below with reference to FIG. 15. The control process shown in FIG. 15 is executed by the control device 100 at regular or irregular intervals, for example, after the vehicle is started. Control steps of the control process shown in FIG. 15 constitute the function implementation unit that implements various functions implemented by the control device 100.

Figure 15:
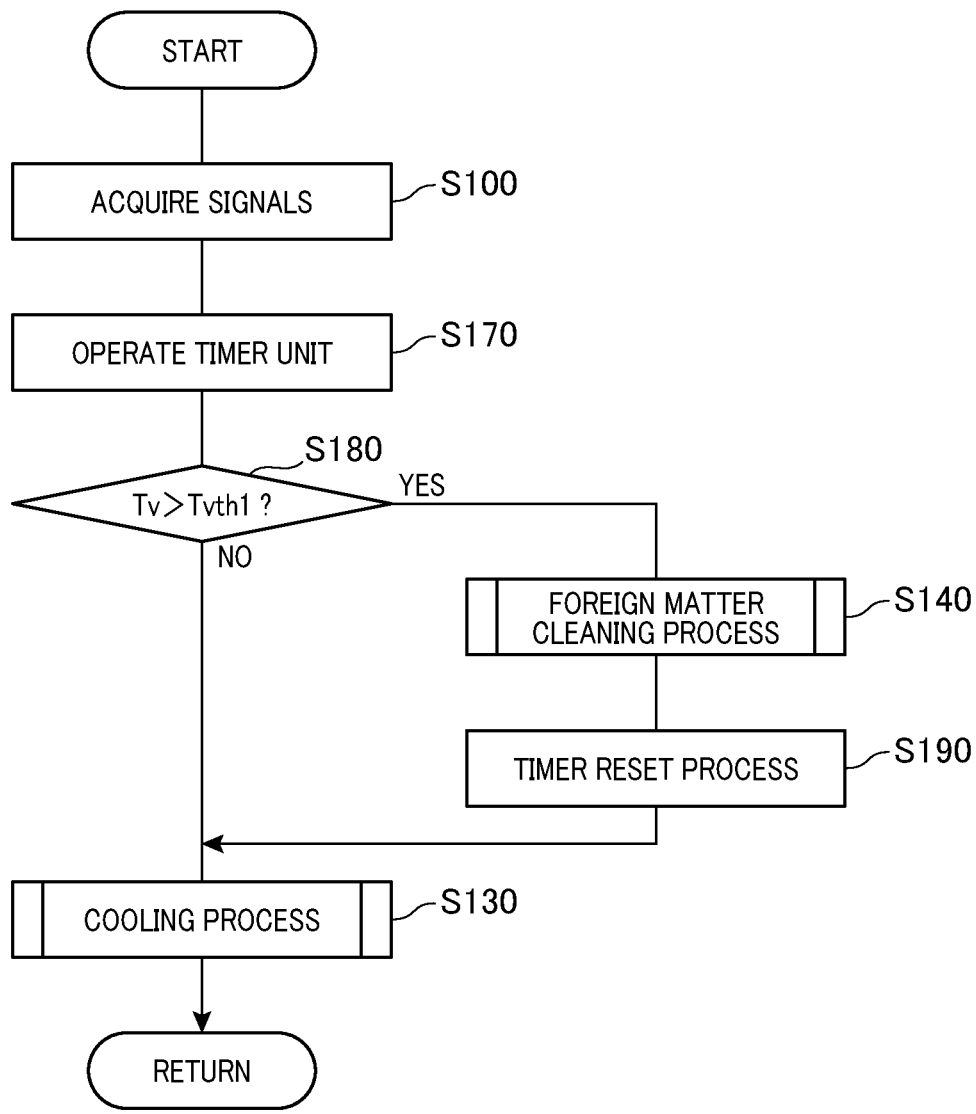
FIG. 15 is a flow chart showing an example of a control process executed by a control device of the heat exchange device according to the third embodiment.
Figure 16:
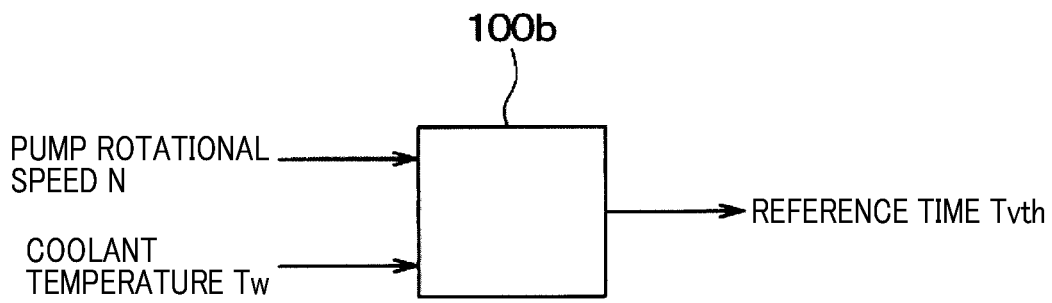
FIG. 16 is an explanatory diagram illustrating a method of calculating a reference time of the heat exchange device according to the third embodiment.

As shown in FIG. 15, at step S100, the control device 100 acquires various signals from various sensors, the vehicle control device 120, or the like. Then, at step S170, the control device 100 operates the timer unit 100d to measure the elapsed time Tv from the start of use of the heat exchanger body 14 or the elapsed time Tv from the previous foreign matter cleaning process. Then, at step S180, the control device 100 determines whether the elapsed time Tv exceeds a predetermined reference time Tvth. In the present embodiment, a configuration that executes the determination process at step S170 constitutes the accumulation determination unit 100c that determines satisfaction or dissatisfaction of the foreign matter accumulation condition. The foreign matter accumulation condition is a condition that is satisfied when the elapsed time Tv from the start of use of the heat exchanger body 14 or the elapsed time Tv from the previous foreign matter cleaning process exceeds the predetermined reference time Tvth.

Depending on the use mode of the devices or the like of the heat exchanger 1, even when the elapsed time Tv from the start of use of the heat exchanger body 14 or the like is short, foreign matter may be accumulated in the circulation path 140. For example, when the circulation pump 12 is operated at low capacity or when the temperature of the coolant flowing into the circulation path 140 is continuously high, foreign matter may be accumulated in the circulation path 140 in a short period of time.

Thus, the reference time Tvth serving as a determination threshold of the foreign matter accumulation condition is a variable threshold that is variable according to an operating state of the circulation pump 12 or a change in the temperature of the coolant. Specifically, as shown in FIG. 16, the control device 100 is configured such that the arithmetic unit 100b sets the reference time Tvth on the basis of the pump rotational speed N of the circulation pump 12 and the coolant temperature Tw. The arithmetic unit 100b sets the reference time Tvth to a short time, for example, when the circulation pump 12 is continuously operated at low capacity or when the temperature of the coolant flowing into the circulation path 140 is continuously high. The arithmetic unit 100b sets the reference time Tvth to a long time, for example, when the circulation pump 12 is continuously operated at high capacity or when the temperature of the coolant flowing into the circulation path is continuously low.

Returning to FIG. 15, when the elapsed time Tv is the reference time Tvth or less, there is not much foreign matter accumulated in the circulation path 140, and presumably, the heat exchanger body 14 can sufficiently cool the electronic component 20. Thus, at step S130, the control device 100 executes the cooling process for the electronic component 20. This cooling process is the same as the cooling process described in the first embodiment.

On the other hand, when the elapsed time Tv exceeds the reference time Tvth, foreign matter is likely to be accumulated in the circulation path 140, and the cooling performance of the heat exchanger body 14 for the electronic component 20 may be deteriorated. Thus, control proceeds to step S140, and the control device 100 executes the foreign matter cleaning process of removing the foreign matter accumulated in the circulation path 140. This foreign matter cleaning process is basically the same as the foreign matter cleaning process described in the first embodiment. However, the control device 100 of the present embodiment is configured to continue the foreign matter cleaning process until time required to remove the foreign matter has elapsed.

When the foreign matter cleaning process at step S140 ends, control proceeds to step S190 and the control device 100 executes a timer reset process. In this process, the time measured by the timer unit 100d is reset.

The heat exchanger 1 of the present embodiment differs from the heat exchanger 1 of the first embodiment in the content of the process of determining satisfaction or dissatisfaction of the foreign matter accumulation condition, but the rest of the configuration and operation is the same as in the first embodiment. Thus, as in the first embodiment, the heat exchanger 1 of the present embodiment can achieve the same functions and effects achieved by the same configuration and operation as in the first embodiment.

The heat exchanger 1 of the present embodiment is configured to execute the foreign matter cleaning process when the elapsed time Tv from the start of use of the heat exchanger body 14 or the like exceeds the reference time Tvth. According to this, the foreign matter cleaning process can be executed while the foreign matter is accumulated in the circulation path 140. In other words, since the foreign matter cleaning process is not executed while no foreign matter is accumulated, an unnecessary performance of a foreign matter cleaning process can be prevented.

In particular, since the blockage degree OD of the circulation path 140 does not need to be calculated, the heat exchanger 1 of the present embodiment does not need to include the flow rate sensor 101 or the differential pressure sensor 102. Thus, the foreign matter accumulated in the circulation path 140 can be removed with a simpler configuration.

Modification of the Third Embodiment

The third embodiment shows an example in which the reference time Tvth serving as the determination threshold of the foreign matter accumulation condition is a variable threshold, but the present disclosure is not limited to this. The reference time Tvth may be, for example, a fixed threshold.

The third embodiment shows an example in which the foreign matter accumulation condition is a condition that is satisfied when the elapsed time Tv exceeds the predetermined reference time Tvth, but the present disclosure is not limited to this. The foreign matter accumulation condition may be, for example, a condition that is satisfied when the elapsed time Tv exceeds the predetermined reference time Tvth or when the blockage degree OD exceeds the blockage threshold ODth1. That is, the foreign matter accumulation condition may be a condition that is determined to be satisfied by taking into consideration both the elapsed time Tv and the blockage degree OD.

Fourth Embodiment

Figure 17:
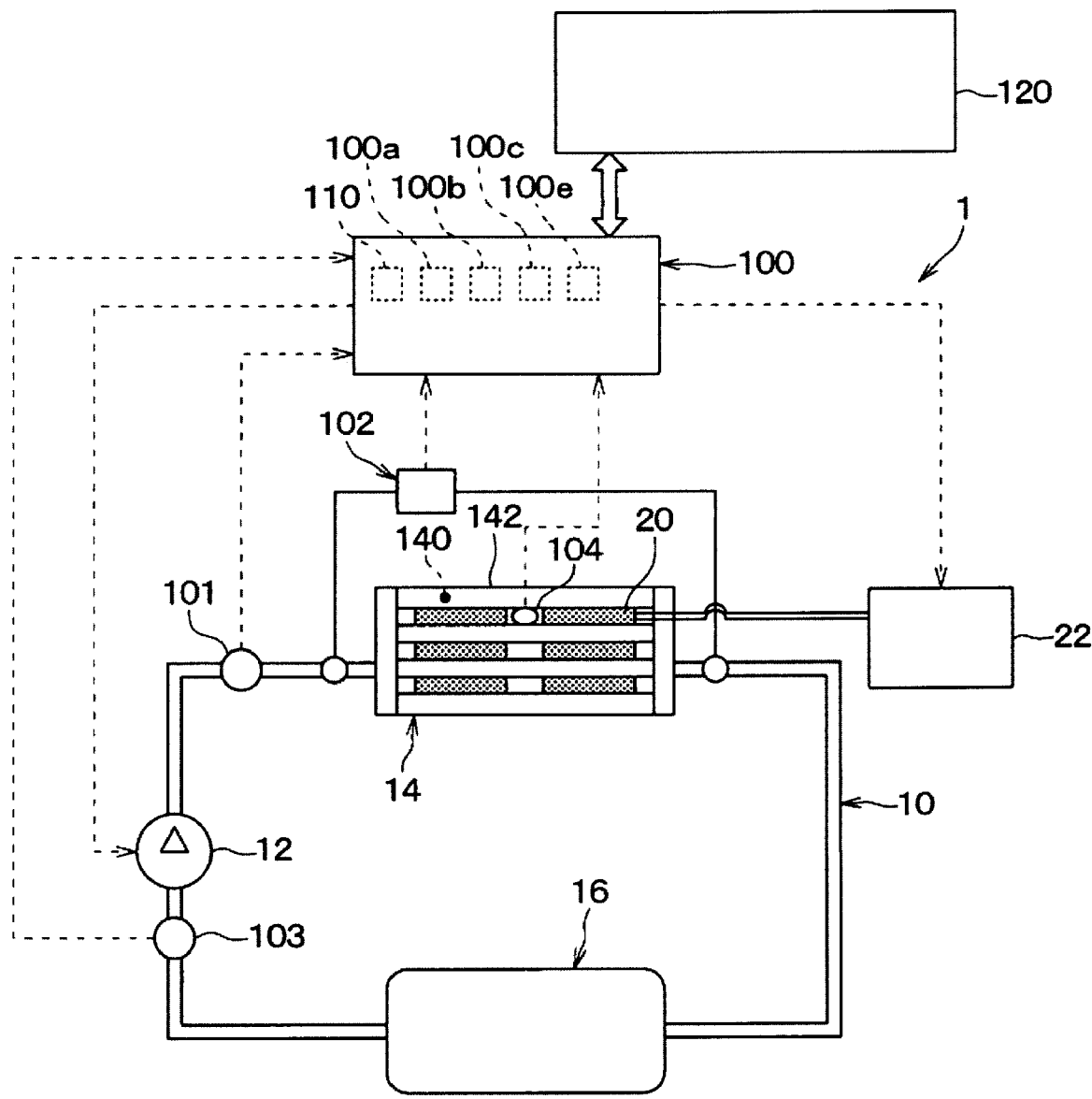
FIG. 17 is a schematic configuration diagram of a heat exchange device according to a fourth embodiment.

Next, a fourth embodiment will be described with reference to FIGS. 17 to 19. The present embodiment differs from the first embodiment in that the foreign matter cleaning process is executed by taking into consideration not only satisfaction or dissatisfaction of the foreign matter accumulation condition but also satisfaction or dissatisfaction of a low load condition. In the present embodiment, portions different from those of the first embodiment will be mainly described, and the same portions as in the first embodiment may not be described.

The heat exchanger 1 of the present embodiment is configured such that the control device 100 can determine satisfaction or dissatisfaction of the low load condition that is satisfied when a load on a device (e.g., inverter) including the electronic component 20 which is the cooled object is expected to be lower than a predetermined reference load. Specifically, as shown in FIG. 17, the control device 100 collectively includes a load determination unit 100e for determining satisfaction or dissatisfaction of the low load condition. The load determination unit 100e is implemented by hardware and software constituting the control device 100.

When the load on the device including the electronic component 20 which is the cooled object is high, a large amount of heat is expected to be generated by the cooled object, and thus higher priority needs to be placed on cooling of the cooled object than on foreign matter cleaning. Thus, the control device 100 of the present embodiment is configured to execute the foreign matter cleaning process in response to both the foreign matter accumulation condition and the low load satisfaction condition being satisfied.

An example of the control process executed by the control device 100 of the present embodiment will be described below with reference to FIG. 18. The control process shown in FIG. 18 is executed by the control device 100 at regular or irregular intervals, for example, after the vehicle is started. The processes at steps S100 to S160 shown in FIG. 18 are the same as the processes at steps S100 to S160 of the control process shown in FIG. 4, and thus will not be described again.

Figure 18:
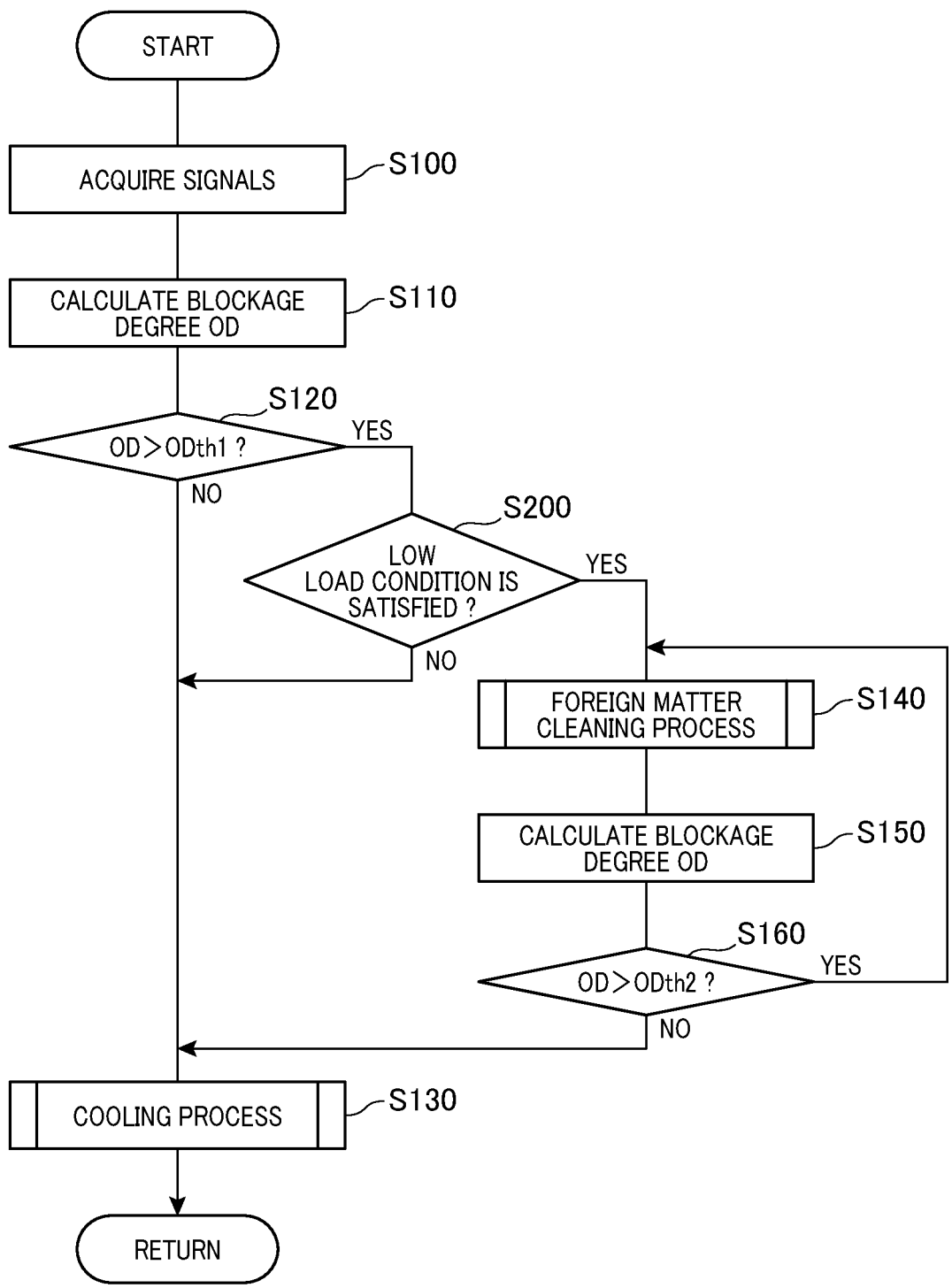
FIG. 18 is a flow chart showing an example of a control process executed by a control device of the heat exchange device according to the fourth embodiment.

As shown in FIG. 18, when it is determined in the determination process at step S120 that the blockage degree OD exceeds the blockage threshold ODth1, at step S200, the control device 100 determines whether the low load condition is satisfied. Then, when the low load condition is not satisfied, at step S130, the control device 100 executes the cooling process. On the other hand, when the low load condition is satisfied, at step S140, the control device 100 executes the foreign matter cleaning process.

When the load on the device including the electronic component 20 which is the cooled object is low, a small amount of heat is generated by the cooled object and a small amount of heat is received by the coolant, and thus in many cases, the coolant temperature Tw is presumably the saturation temperature Ts or less. Accordingly, the low load condition is a condition that is satisfied when the coolant temperature Tw immediately before execution of the foreign matter cleaning process is the saturation temperature Ts or less. The determination process of determining satisfaction or dissatisfaction of the low load condition executed by the control device 100 will be described below with reference to FIG. 19.

Figure 19:
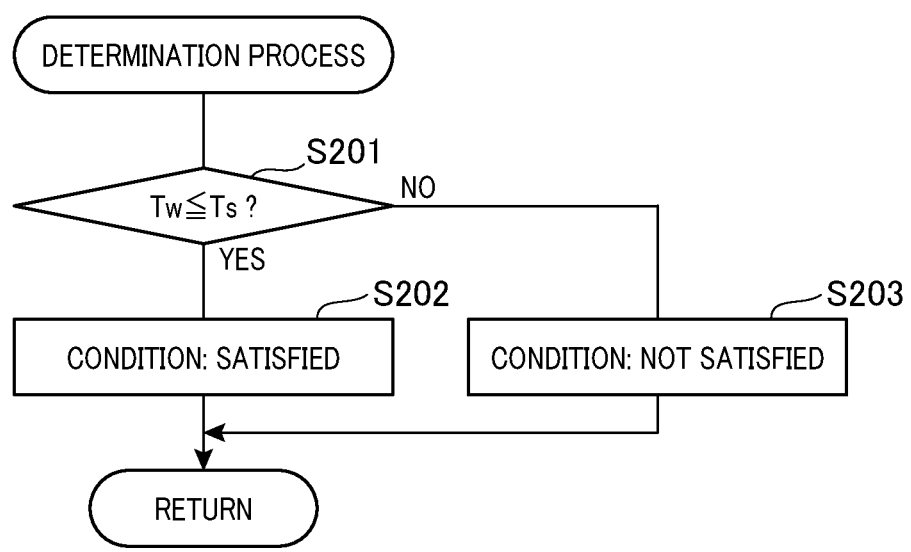
FIG. 19 is a flow chart showing an example of a process of determining satisfaction or dissatisfaction of a low load condition.

As shown in FIG. 19, at step S201, the control device 100 determines whether the coolant temperature Tw is the saturation temperature Ts set in advance or less. Then, when the coolant temperature Tw is the saturation temperature Ts or less, the control device 100 determines that the low load condition is satisfied. On the other hand, when the coolant temperature Tw exceeds the saturation temperature Ts, the control device 100 determines that the low load condition is not satisfied.

In the present embodiment, a configuration that executes the determination process at step S200 constitutes the load determination unit 100e that determines satisfaction or dissatisfaction of the low load condition. The low load condition is a condition that is satisfied when the coolant temperature Tw immediately before execution of the foreign matter cleaning process is the saturation temperature Ts or less.

As described above, the heat exchanger 1 of the present embodiment differs from the heat exchanger 1 of the first embodiment in that the determination process of determining satisfaction or dissatisfaction of the low load condition is added, but the rest of the configuration and operation is the same as in the first embodiment. Thus, as in the first embodiment, the heat exchanger 1 of the present embodiment can achieve the same functions and effects achieved by the same configuration and operation as in the first embodiment.

The heat exchanger 1 of the present embodiment is configured to execute the foreign matter cleaning process when the foreign matter accumulation condition is satisfied and the low load condition is satisfied. According to this, when the load on the device including the electronic component 20 which is the cooled object is high, higher priority is placed on cooling of the cooled object than on foreign matter cleaning, leading to sufficient protection of the cooled object.

Modification of the Fourth Embodiment

The fourth embodiment shows an example in which the low load condition is a condition that is satisfied when the coolant temperature Tw is the saturation temperature Ts or less, but the present disclosure is not limited to this. The low load condition may be, for example, a condition that is satisfied at the time of executing a process of stopping the device including the electronic component 20 (e.g., a drive stop process for the vehicle) or at the time when the device including the electronic component 20 is in an idle state (e.g., an idle state of the vehicle). The time of executing the process of stopping the device including the electronic component 20 and the idle state of the device including the electronic component 20 can be determined on the basis of the information acquired from the vehicle control device 120. The low load condition may be a condition that is satisfied at the time of executing an excessive discharge process executed during maintenance of the vehicle, or the like.

the fourth embodiment shows an example in which the determination process of determining satisfaction or dissatisfaction of the low load condition is added to the control process described in the first embodiment, but the present disclosure is not limited to this. The determination process of determining satisfaction or dissatisfaction of the low load condition may be added, for example, to the control process described in the third embodiment.

Fifth Embodiment

Next, the heat exchanger 1 of a fifth embodiment will be described with reference to FIG. 20. The present embodiment differs from the fourth embodiment in that the determination process of determining satisfaction or dissatisfaction of the low load condition is executed prior to the determination process of determining satisfaction or dissatisfaction of the foreign matter accumulation condition. In the present embodiment, portions different from those of the fourth embodiment will be mainly described, and the same portions as in the fourth embodiment may not be described.

Figure 20:
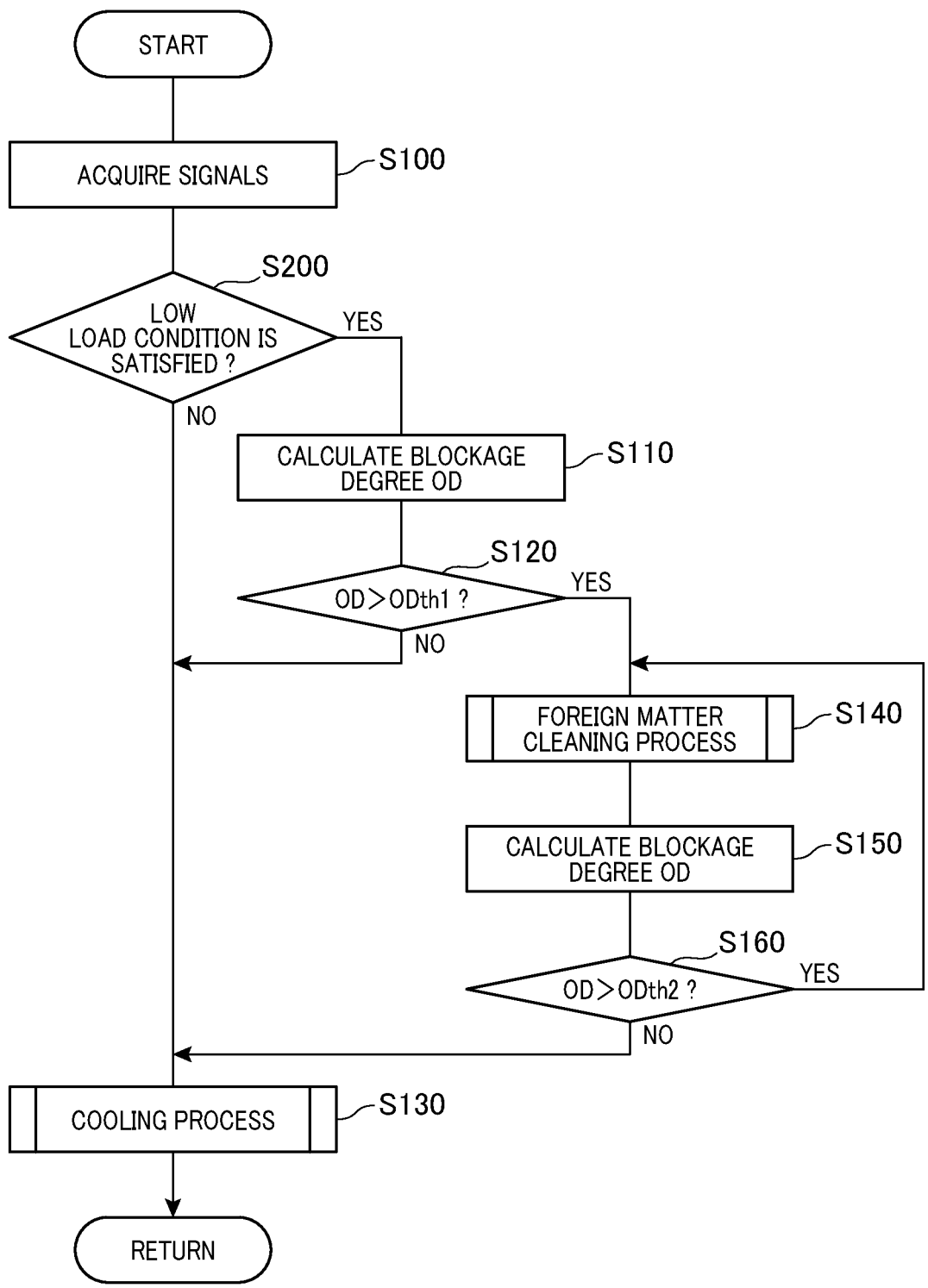
FIG. 20 is a flow chart showing an example of a control process executed by a control device of a heat exchange device according to a fifth embodiment.

As shown in FIG. 20, at step S100, the control device 100 acquires various signals from various sensors, the vehicle control device 120, or the like, then at step S200, the control device 100 determines whether the low load condition is satisfied. Then, when the low load condition is not satisfied, at step S130, the control device 100 executes the cooling process. On the other hand, when the low load condition is satisfied, at step S110, the control device 100 calculates the blockage degree OD of the circulation path 140.

As described above, the heat exchanger 1 of the present embodiment differs from the heat exchanger 1 of the fourth embodiment in that the determination process of determining satisfaction or dissatisfaction of the low load condition is executed prior to the determination process of determining satisfaction or dissatisfaction of the foreign matter accumulation condition, but the rest of the configuration and operation is the same as in the fourth embodiment. Thus, as in the fourth embodiment, the heat exchanger 1 of the present embodiment can achieve the same functions and effects achieved by the same configuration and operation as in the fourth embodiment.

Sixth Embodiment

Next, the heat exchanger 1 of a sixth embodiment will be described with reference to FIG. 21. The present embodiment differs from the first embodiment in that during execution of the foreign matter cleaning process, the control device 100 increases the amount of heat generated by the electronic component 20. In the present embodiment, portions different from those of the first embodiment will be mainly described, and the same portions as in the first embodiment may not be described.

Figure 21:
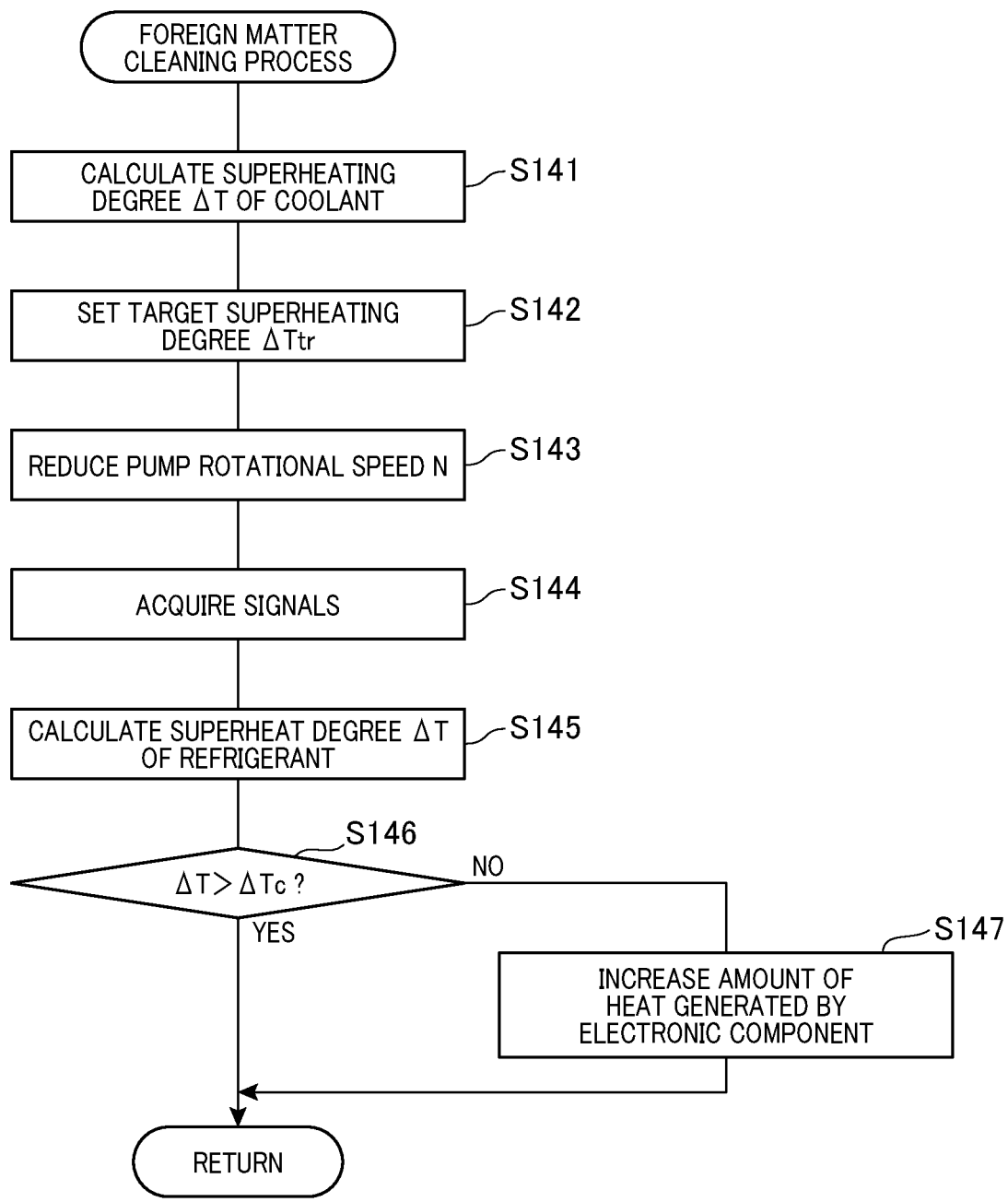
FIG. 21 a flow chart showing an example of a foreign matter cleaning process executed by a control device of a heat exchange device according to a sixth embodiment.

FIG. 21 is a flow chart showing an example of the foreign matter cleaning process executed by the control device 100 of the present embodiment. The processes at steps S141 to S143 shown in FIG. 21 are the same as the processes at steps S141 to S143 of the control process shown in FIG. 6, and thus may not be described.

As shown in FIG. 21, at step S143, the control device 100 reduces the pump rotational speed N, and then control proceeds to step S144. Thus, at step S144, the control device 100 acquires various signals from various sensors, the vehicle control device 120, or the like. Then, at step S145, the control device 100 calculates the superheating degree $\Delta T$ of the coolant flowing through the circulation path 140. The superheating degree $\Delta T$ of the coolant is calculated by the same method as in step S141, and thus will not be described.

Subsequently, at step S146, the control device 100 determines whether the superheating degree $\Delta T$ of the coolant exceeds the saturation start point $\Delta Ts$. That is, the control device 100 determines whether the coolant has a superheating degree in the nucleate boiling region.

Then, when the superheating degree $\Delta T$ of the coolant exceeds the saturation start point $\Delta Ts$, removal of the foreign matter is presumably possible. Thus, the control device 100 stops the foreign matter cleaning process without increasing the amount of heat generated by the electronic component 20.

On the other hand, when the superheating degree $\Delta T$ of the coolant is the saturation start point $\Delta Ts$ or less, the coolant does not have a superheating degree in the nucleate boiling region, and removal of the foreign matter is presumably difficult. Thus, at step S147, the control device 100 increases the amount of heat generated by the electronic component 20. Specifically, the control device 100 causes the drive circuit 22 to increase the energization amount to the electronic component 20 so that the amount of heat generated by the electronic component 20 is increased.

As described above, the heat exchanger 1 of the present embodiment differs from the heat exchanger 1 of the first embodiment in that during execution of the foreign matter cleaning process, the control device 100 increases the amount of heat generated by the electronic component 20, but the rest of the configuration and operation is the same as in the first embodiment. Thus, as in the first embodiment, the heat exchanger 1 of the present embodiment can achieve the same functions and effects achieved by the same configuration and operation as in the first embodiment.

In particular, since during execution of the foreign matter cleaning process, the heat exchanger 1 of the present embodiment increases the amount of heat generated by the electronic component 20 which is the cooled object, during execution of the foreign matter cleaning process, the temperature of the heat transfer portion between the electronic component 20 and the coolant is increased. The superheating degree $\Delta T$ of the coolant is increased accordingly, and thus the foreign matter accumulated in the circulation path 140 is easily removed.

Specifically, the heat exchanger 1 is configured to increase the amount of heat generated by the electronic component 20 when the adjustment of the amount of coolant supplied from the circulation pump 12 is insufficient for the coolant to have a superheating degree in the nucleate boiling region. According to this, during execution of the foreign matter cleaning process, the coolant is allowed to have a superheating degree in the nucleate boiling region, and thus the foreign matter accumulated in the circulation path 140 is easily removed.

Modification of the Sixth Embodiment

The sixth embodiment shows an example in which the amount of heat generated by the electronic component 20 is increased only when, after the pump rotational speed N of the circulation pump 12 is reduced in the foreign matter cleaning process, the superheating degree $\Delta T$ of the coolant exceeds the saturation start point $\Delta Ts$, but the present disclosure is not limited to this.

The heat exchanger 1 may be configured to increase the amount of heat generated by the electronic component 20, for example, regardless of the superheating degree $\Delta T$ of the coolant, after the pump rotational speed N of the circulation pump 12 is reduced in the foreign matter cleaning process. Alternatively, the heat exchanger 1 may be configured to increase the amount of heat generated by the electronic component 20, for example, when, after the pump rotational speed N of the circulation pump 12 is reduced in the foreign matter cleaning process, the device temperature Td of the electronic component 20 is a predetermined temperature or less.

When the load on the device including the electronic component 20 is high, if the amount of heat generated by the electronic component 20 is increased, there is a possibility that the increase in the amount of heat generated by the electronic component 20 may significantly influence operation of the device including the electronic component 20. Thus, the heat exchanger 1 is preferably configured to increase the amount of heat generated by the electronic component 20, for example, when, after the pump rotational speed N of the circulation pump 12 is reduced in the foreign matter cleaning process, the low load condition is satisfied.

Seventh Embodiment

Figure 23:
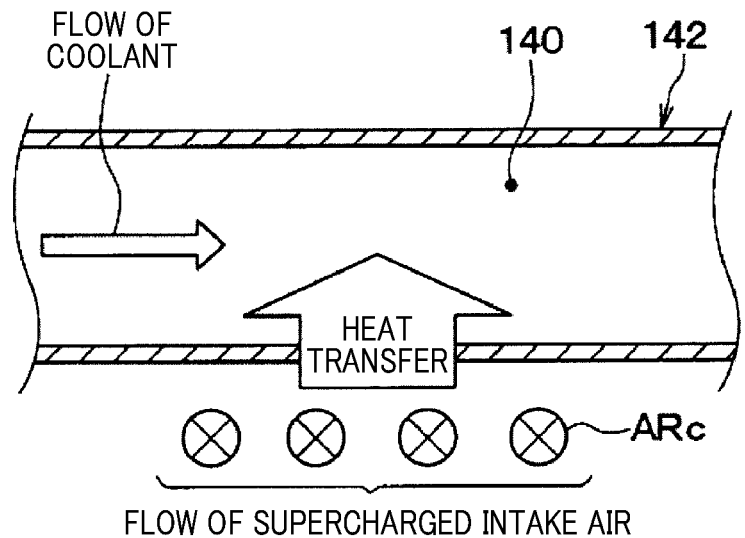
FIG. 23 is an explanatory diagram illustrating heat exchange between a coolant and an electronic component of the heat exchange device according to the seventh embodiment.
Figure 24:
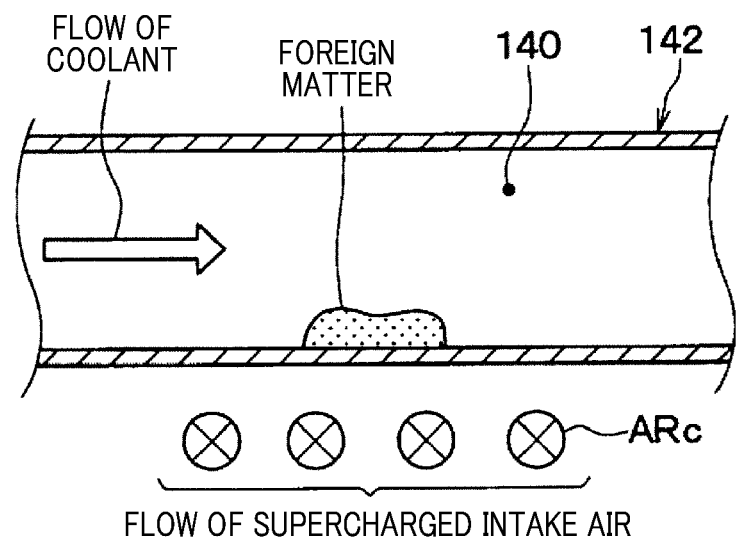
FIG. 24 is an explanatory diagram illustrating a state in which foreign matter is accumulated in a coolant circulation path of the heat exchange device according to the seventh embodiment.

Next, the heat exchanger 1 of a seventh embodiment will be described with reference to FIGS. 22 to 24. The heat exchanger 1 of the present embodiment differs from the heat exchanger 1 of the first embodiment in that the cooled object to be cooled by a heat exchanger body 14A is supercharged intake air ARc that is supercharged to an internal combustion engine EG by a supercharger SC mounted on the vehicle.

Figure 22:
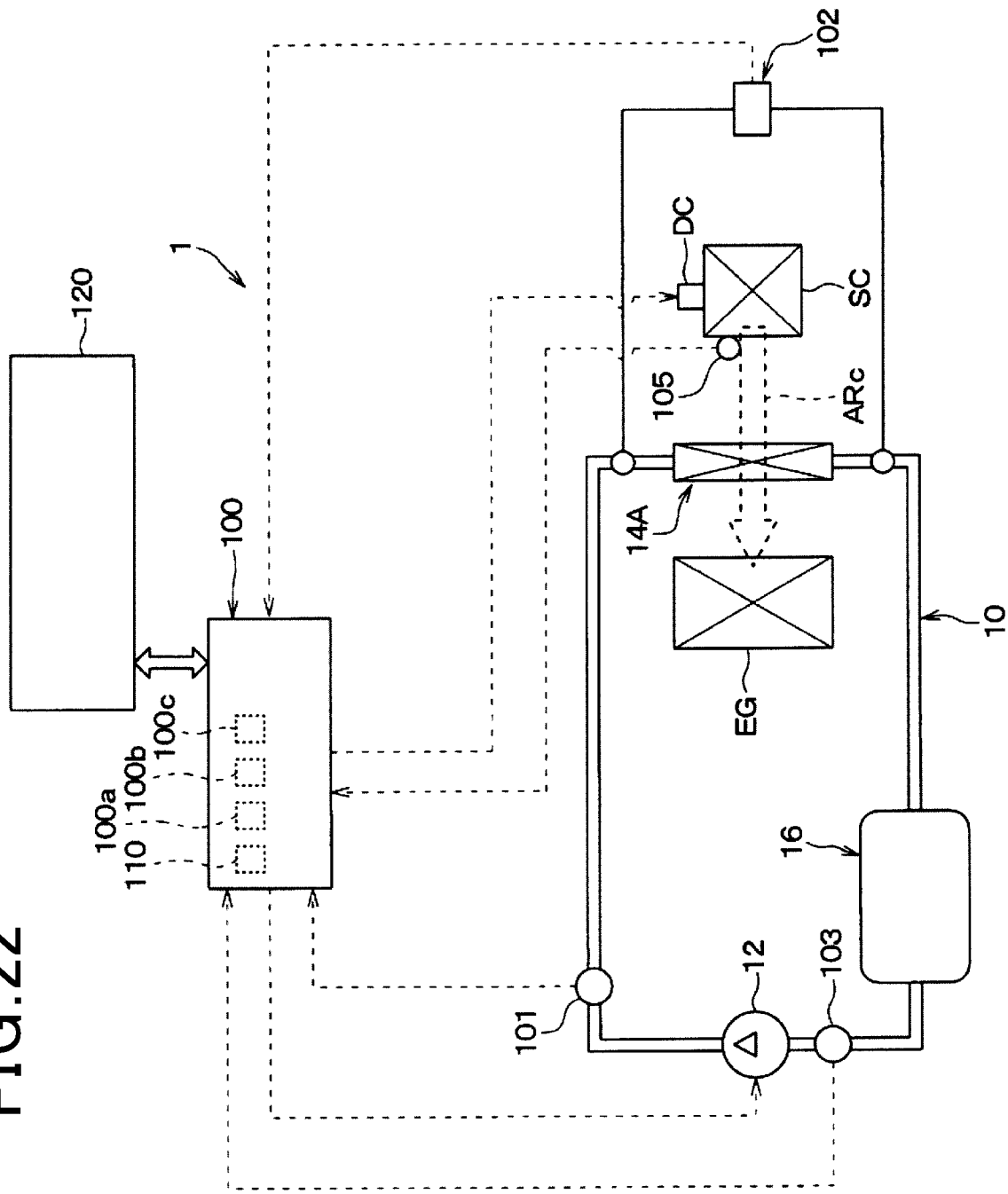
FIG. 22 is a schematic configuration diagram of a heat exchange device according to a seventh embodiment.

As shown in FIG. 22, in the vehicle on which the heat exchanger 1 is mounted, the supercharger SC is provided in an intake system of the internal combustion engine EG that drives the vehicle. The supercharger SC is provided to improve an output of the internal combustion engine EG by compressing air to be supplied to the internal combustion engine EG and increasing the density of the air.

In the heat exchanger 1, the heat exchanger body 14A is arranged between the internal combustion engine EG and the supercharger SC in the intake system of the internal combustion engine EG. Specifically, the heat exchanger body 14A is composed of an intercooler that is configured to cool, as the cooled object, the supercharged intake air ARc supercharged to the internal combustion engine EG by the supercharger SC and cools the supercharged intake air ARc by heat exchange between the supercharged intake air ARc and the coolant.

The supercharger SC is provided with a drive circuit DC for adjusting air compression capacity. The drive circuit DC can adjust the amount of heat generated by the supercharged intake air ARc compressed by the supercharger SC. In the present embodiment, the drive circuit DC constitutes an adjustment unit that adjusts the amount of heat generated by the supercharged intake air ARc which is the cooled object. The drive circuit DC is configured to be able to change the amount of heat generated by the supercharged intake air ARc according to a control signal from the control device 100.

Next, the control device 100 of the present embodiment will be described. The input side of the control device 100 is connected to the flow rate sensor 101, the differential pressure sensor 102, the coolant temperature sensor 103, and the like. Furthermore, the control device 100 is connected to the vehicle control device 120 so that the control device 100 can bidirectionally communicate with the vehicle control device 120.

The input side of the control device 100 is connected to an intake air temperature sensor 105 that detects an intake air temperature Ta, which is a temperature of the supercharged intake air ARc flowing into the heat exchanger body 14A. The intake air temperature sensor 105 is configured to directly detect the intake air temperature Ta. The intake air temperature sensor 105 is provided to obtain a temperature of a heat transfer portion between the coolant and the supercharged intake air. The intake air temperature Ta detected by the intake air temperature sensor 105 is used to calculate the superheating degree $\Delta T$ of the coolant and the like. The intake air temperature sensor 105 may be configured to indirectly detect the intake air temperature Ta on the basis of a temperature of the supercharger SC or the like.

On the other hand, the output side of the control device 100 is connected to the electric motor of the circulation pump 12, the drive circuit DC of the supercharger SC, and the like. The control device 100 controls the electric motor of the circulation pump 12, the drive circuit DC of the supercharger SC, and the like on the basis of information acquired from various sensors or the like. The rest of the configuration of the heat exchanger 1 of the present embodiment is the same as in the first embodiment.

Next, operation of the heat exchanger 1 of the present embodiment will be described. In the heat exchanger 1, for example, when the vehicle is started and the temperature of the supercharged intake air ARc becomes high, the control device 100 drives the circulation pump 12 to execute a cooling process for the supercharged intake air ARc. As shown in FIG. 23, the coolant discharged from the circulation pump 12 flows into the circulation path 140 of the heat exchanger body 14A. At this time, heat of the supercharged intake air ARc is transferred to the coolant flowing through the circulation path 140 to cool the supercharged intake air ARc. The coolant flowing out of the circulation path 140 of the heat exchanger body 14A radiates heat to outside air in the radiator 16, and is then sucked into the circulation pump 12.

The temperature of the coolant flowing through the circulation path 140 is increased by heat of the supercharged intake air ARc. When the supercharged intake air ARc is at high temperature, in some cases, the coolant temperature Tw is increased close to the saturation temperature Ts. Then, when the coolant temperature Tw is increased close to the saturation temperature Ts, in some cases, a part of the anticorrosive or impurities in the water contained in the coolant are deteriorated and solidified, and the solidified substance is accumulated as foreign matter in the circulation path 140 as shown in FIG. 24.

Thus, the heat exchanger 1 of the present embodiment is configured such that the control device 100 executes a control process including the foreign matter cleaning process. The control process executed by the control device 100 of the present embodiment is basically the same as the control process described in the first embodiment except that the cooled object is different. Thus, the control process executed by the control device 100 will not be described.

The heat exchanger 1 of the present embodiment described above differs from the heat exchanger 1 of the first embodiment in the cooled object, but has basically the same configuration as in the first embodiment. Thus, as in the first embodiment, the heat exchanger 1 of the present embodiment can achieve the same functions and effects achieved by the same configuration and operation as in the first embodiment.

In particular, in the heat exchanger 1 of the present embodiment, the heat exchanger body 14A is composed of an intercooler that is configured to cool the supercharged intake air ARc as the cooled object. According to this, insufficient cooling of the supercharged intake air due to the accumulation of foreign matter in the circulation path 140 of the heat exchanger body 14A can be prevented with a simple configuration.

Modification of the Seventh Embodiment

The seventh embodiment shows an example in which the cooled object to be cooled by the heat exchanger body 14 described in the first embodiment is changed from the electronic component 20 to the supercharged intake air ARc, but the present disclosure is not limited to this. For example, the heat exchanger 1 may be configured such that the cooled object to be cooled by the heat exchanger body 14 described in Embodiments 2 to 6 is changed from the electronic component 20 to the supercharged intake air ARc. The heat exchanger 1 may be configured such that in a case where, as in the sixth embodiment, the pump rotational speed N of the circulation pump 12 is reduced in the foreign matter cleaning process and then the amount of heat generated by the cooled object is increased, the control device 100 controls the drive circuit DC so that the temperature of the supercharged intake air ARc becomes high.

Other Embodiments

The representative embodiments of the present disclosure have been described, but the present disclosure is not limited to the above embodiments. For example, the present disclosure may be modified in various manners as follows.

The above embodiments show an example in which the heat exchanger 1 includes the circulation circuit 10 through which the coolant is circulated, but the present disclosure is not limited to this. For example, the heat exchanger 1 may be configured to include an open coolant circuit through which the coolant is not circulated.

The above embodiments show an example in which the target superheating degree $\Delta Ttr$ is set to a superheating degree closer to the burnout point $\Delta Tm$ than to the saturation start point $\Delta Ts$ indicated by the boiling curve, but the present disclosure is not limited to this. For example, the heat exchanger 1 may be configured such that the target superheating degree $\Delta Ttr$ is set to a superheating degree closer to the saturation start point $\Delta Ts$ than to the burnout point $\Delta Tm$.

The above embodiments show an example in which the coolant is a long-life coolant (i.e., an antifreeze containing an anticorrosive), but the present disclosure is not limited to this. Even when a coolant other than the long-life coolant is used, foreign matter such as oxide may be accumulated inside the heat exchanger body 14. Thus, in the heat exchanger 1, the coolant may be a liquid fluid other than the long-life coolant.

The above embodiments show an example in which electronic component 20 is composed of a SiC semiconductor device, but the present disclosure is not limited to this. The electronic component 20 may be composed of, for example, a Si semiconductor device.

The above embodiments show an example in which the heat exchanger 1 is mounted on the vehicle, but the present disclosure is not limited to this. The heat exchanger 1 does not necessarily need to be mounted on the vehicle, and may be mounted, for example, on a fixed device or the like.

It is unnecessary to say that in the above embodiments, an element constituting the embodiments is not necessarily essential unless the element is explicitly stated to be essential or the element is considered to be apparently essential in principle.

When a numerical value such as the number, numerical value, amount, or range associated with the component of the embodiments is mentioned in the above embodiments, the numerical value is not limited to the specific number unless the specific number is explicitly stated to be essential or the numerical value is obviously limited to the specific number in principle.

When a shape, positional relationship, or the like of the component or the like is mentioned in the above embodiments, the shape, positional relationship, or the like is not limited to the specific shape, positional relationship, or the like unless explicitly stated or the shape, positional relationship, or the like is limited to the specific shape, positional relationship, or the like in principle.

(Summary)

According to the first aspect shown in some or all of the above embodiments, the heat exchange device includes the heat exchanger, the coolant supply pump, the accumulation determination unit that determines satisfaction or dissatisfaction of the foreign matter accumulation condition, and the process execution unit that when the foreign matter accumulation condition is satisfied, executes the foreign matter cleaning process. In the foreign matter cleaning process, the process execution unit reduces the amount of coolant supplied from the coolant supply pump so that the coolant has a superheating degree in the nucleate boiling region.

According to the second aspect, in the foreign matter cleaning process, the process execution unit of the heat exchange device sets, as the target superheating degree in the range from the saturation start point to the burnout point indicated by the boiling curve of the coolant, a superheating degree closer to the burnout point than to the saturation start point. The process execution unit reduces the amount of coolant supplied from the coolant supply pump so that the superheating degree of the coolant approaches the target superheating degree.

When the coolant has a superheating degree closer to the burnout point than to the saturation start point, due to the increase in the number of points at which gas bubbles are generated or the like, a large force is generated when a volume change of the gas bubbles or disappearance of the gas bubbles occurs. Thus, when in the foreign matter cleaning process, the amount of coolant supplied to the heat exchanger is reduced so that the coolant has a superheating degree closer to the burnout point, the foreign matter accumulated in the circulation path is easily removed.

The "saturation start point" is the superheating degree at which generation of gas bubbles of the coolant is started. The "burnout point" is the superheating degree at which the heat transfer coefficient is maximum in the nucleate boiling region.

According to the third aspect, the heat exchange device includes the arithmetic unit that calculates the blockage degree of the circulation path on the basis of at least one of the flow rate of the coolant flowing into the heat exchanger and the pressure loss of the heat exchanger. The foreign matter accumulation condition includes a condition that is satisfied when the blockage degree exceeds the predetermined blockage threshold.

When foreign matter is accumulated in the circulation path and the blockage degree of the circulation path is increased, the flow rate of the coolant flowing into the heat exchanger is reduced, and the pressure loss of the heat exchanger is increased. Accordingly, the blockage degree of the circulation path is highly correlated with the flow rate of the coolant and the pressure loss. Thus, the blockage degree of the circulation path can be determined on the basis of the flow rate of the coolant and the pressure loss. When the blockage degree calculated on the basis of the flow rate of the coolant and the pressure loss is used as a factor that determines satisfaction or dissatisfaction of the foreign matter accumulation condition, the foreign matter cleaning process can be executed while the foreign matter is accumulated in the circulation path. In other words, since the foreign matter cleaning process is not executed while no foreign matter is accumulated, an unnecessary foreign matter cleaning process can be prevented, leading to efficient cooling of the cooled object.

According to the fourth aspect, the foreign matter accumulation condition of the heat exchange device includes a condition that is satisfied when the elapsed time from the start of use of the heat exchanger or the elapsed time from the previous foreign matter cleaning process exceeds the predetermined reference time.

According to findings by the inventors, foreign matter tends to be more likely to be accumulated in the circulation path as the elapsed time from the start of use of the heat exchanger or the elapsed time from the previous foreign matter cleaning process is increased. Thus, when the elapsed time from the start of use of the heat exchanger or the elapsed time from the previous foreign matter cleaning process is used as a factor that determines satisfaction or dissatisfaction of the foreign matter accumulation condition, the foreign matter cleaning process can be executed while the foreign matter is accumulated in the circulation path. In other words, since the foreign matter cleaning process is not executed while no foreign matter is accumulated, an unnecessary foreign matter cleaning process can be prevented, leading to efficient cooling of the cooled object.

Depending on the use mode of the devices or the like of the heat exchange device, even when the elapsed time from the start of use of the heat exchanger or the like is short, foreign matter may be accumulated in the circulation path. For example, when the coolant supply pump is operated at low capacity or when the temperature of the coolant flowing into the circulation path is continuously high, foreign matter may be accumulated in the circulation path in a short period of time.

Thus, the reference time serving as the determination threshold of the foreign matter accumulation condition is preferably a variable threshold that is variable according to an operating state of the coolant supply pump or a change in the temperature of the coolant. As an example of the method of setting the variable threshold, the reference time may be set to a short time when the coolant supply pump is continuously operated at low capacity or when the temperature of the coolant flowing into the circulation path is continuously high. As an example of the method of setting the variable threshold, the reference time may be set to a long time when the coolant supply pump is continuously operated at high capacity or when the temperature of the coolant flowing into the circulation path is continuously low.

According to the fifth aspect, the heat exchange device includes the adjustment unit that adjusts the amount of heat generated by the cooled object. In the foreign matter cleaning process, the process execution unit causes the adjustment unit to increase the amount of heat generated by the cooled object. Thus, when the amount of heat generated by the cooled object is increased during execution of the foreign matter cleaning process, the temperature of the heat transfer portion between the cooled object and the coolant is increased and the superheating degree of the coolant is increased, and thus the foreign matter accumulated in the circulation path is easily removed.

According to the sixth aspect, when, even after the amount of coolant supplied from the coolant supply pump is reduced, the coolant does not have a superheating degree in the nucleate boiling region, the process execution unit of the heat exchange device causes the adjustment unit to increase the amount of heat generated by the cooled object. Thus, with the configuration in which the amount of heat generated by the cooled object is increased when the adjustment of the supply amount of coolant is insufficient for the coolant to have a superheating degree in the nucleate boiling region, the coolant is allowed to have a superheating degree in the nucleate boiling region.

According to the seventh aspect, the heat exchange device includes the load determination unit that determines satisfaction or dissatisfaction of the low load condition that is satisfied when the load on the device including the cooled object is expected to be lower than the predetermined reference load. The process execution unit executes the foreign matter cleaning process when the foreign matter accumulation condition is satisfied and the low load condition is satisfied.

When the load on the device including the cooled object is high, a large amount of heat is expected to be generated by the cooled object, and thus higher priority needs to be placed on cooling of the cooled object than on foreign matter cleaning. Thus, the foreign matter cleaning process is preferably executed when both the foreign matter accumulation condition and the low load satisfaction condition are satisfied.

According to the eighth aspect, the low load condition of the heat exchange device includes a condition that is satisfied when the temperature of the coolant before execution of the foreign matter cleaning process is the saturation temperature or less. When the load on the device including the cooled object is low, a small amount of heat is generated by the cooled object and a small amount of heat is received by the coolant, and thus in many cases, the temperature of the coolant is presumably the saturation temperature or less. Accordingly, the low load condition may be a condition that is satisfied when the temperature of the coolant before execution of the foreign matter cleaning process is the saturation temperature or less.

According to the ninth aspect, the heat exchanger of the heat exchange device is composed of a component cooler that is configured to cool, as the cooled object, an electronic component generating heat by energization and cools the electronic component by heat exchange between the electronic component and the coolant. According to this, insufficient cooling of the electronic component due to the accumulation of foreign matter in the circulation path of the heat exchanger can be prevented with a simple configuration.

According to the tenth aspect, the heat exchanger of the heat exchange device is composed of an intercooler that is configured to cool, as the cooled object, supercharged intake air supercharged to the internal combustion engine by the supercharger and cools the supercharged intake air by heat exchange between the supercharged intake air and the coolant. According to this, insufficient cooling of the supercharged intake air due to the accumulation of foreign matter in the circulation path of the heat exchanger can be prevented with a simple configuration.

According to the eleventh aspect, the coolant used in the heat exchange device is composed of an antifreeze containing an anticorrosive that prevents generation of rust.

The inventors have considered using an antifreeze containing an anticorrosive as the coolant, and cooling the cooled object by the antifreeze. However, in a case where the antifreeze is used as the coolant, when the temperature of the coolant is increased close to the saturation temperature, in some cases, a part of the anticorrosive is deteriorated and solidified, and the solidified substance is accumulated as foreign matter. Unlike the case of foreign matter entering from outside, it is difficult to predict a part of the heat exchanger at which such foreign matter is accumulated, and thus it is difficult to address the foreign matter by using a filter or the like.

In this regard, the heat exchange device of the present disclosure is configured such that the amount of coolant supplied to the heat exchanger is reduced to generate gas bubbles in the circulation path and the gas bubbles are used to remove the foreign matter accumulated in the circulation path, leading to efficient foreign matter cleaning.

Next, eighth to sixteenth embodiments of the heat exchanger of the second aspect of the present disclosure will be described with reference to the drawings. An object of the disclosure is to provide a heat exchanger capable of preventing an imbalance in pressure between a plurality of channels formed by partitioning a channel pipe, thereby improving heat exchanger performance.

In the drawings for explaining the embodiments, unless otherwise specified, arrow X indicates a lamination direction of a plurality of channel pipes constituting the heat exchanger, arrow Y indicates a width direction orthogonal to the lamination direction X, and arrow Z indicates a height direction orthogonal to both the lamination direction X and the width direction Y.

Eighth Embodiment

Figure 25:
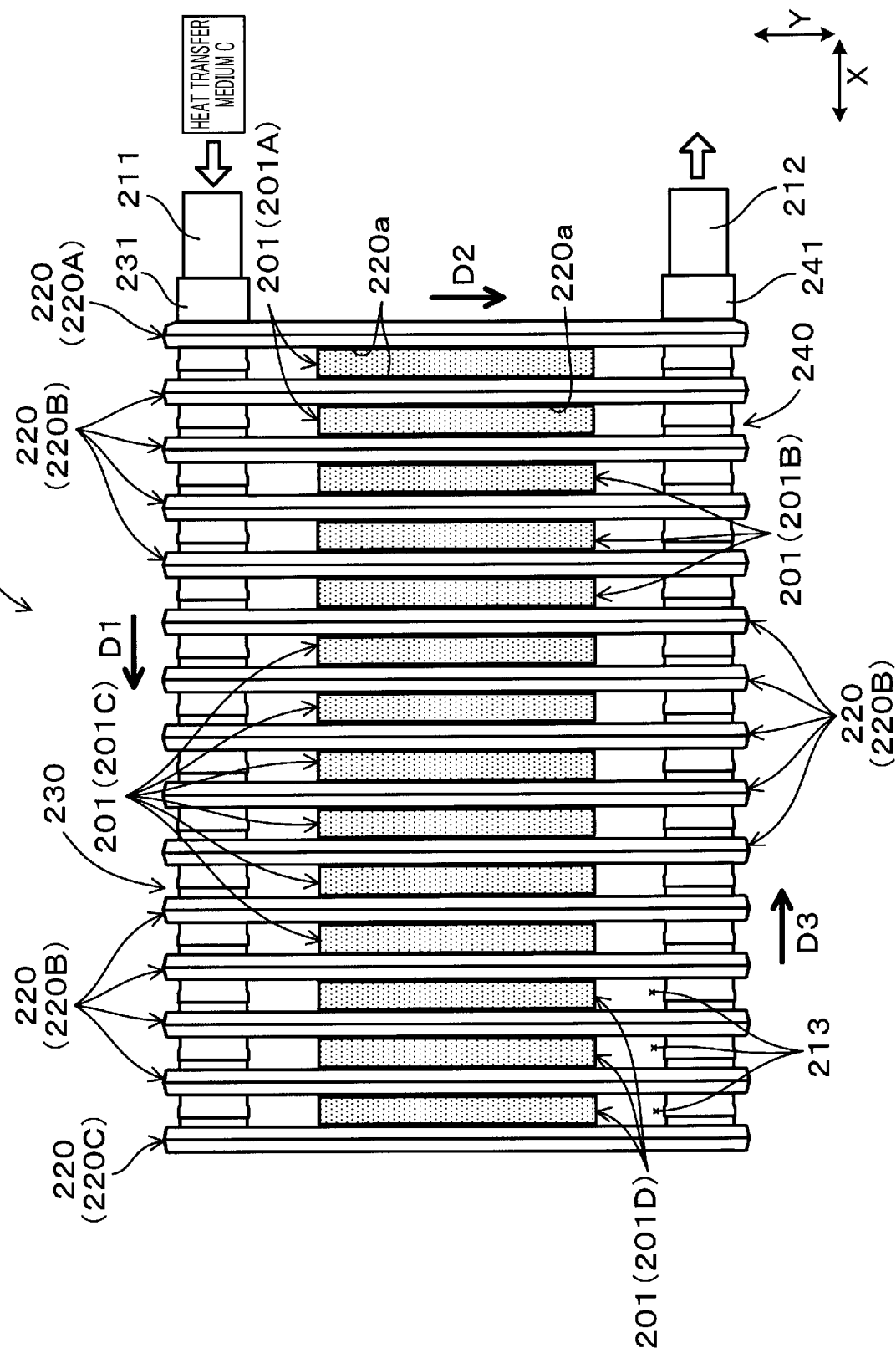
FIG. 25 is a plan view showing an overview of a heat exchanger according to an eighth embodiment.
Figure 26:
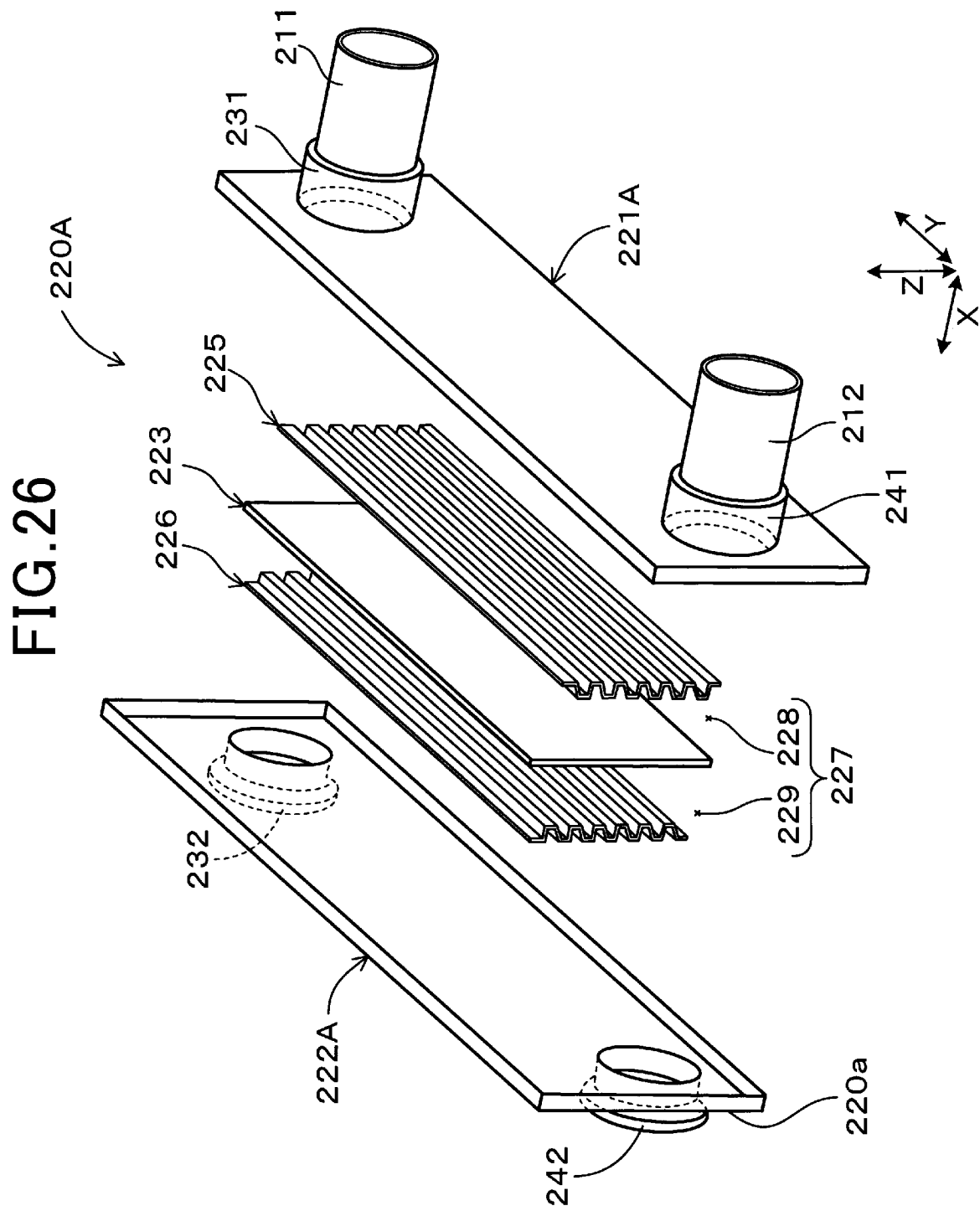
FIG. 26 is an exploded perspective view of a first channel pipe of the heat exchanger in FIG. 25.

As shown in FIGS. 25 and 26, a heat exchanger 210 of an eighth embodiment is used for cooling a plurality of external semiconductor modules 201 each of which is a heat generating component. Thus, the heat exchanger 210 can also be referred to as "cooler" or "cooling device".

The semiconductor module 201 is an electronic component mounted on a hybrid automobile or the like, and is configured to include an integrated semiconductor device such as an IGBT that converts DC power into AC power. The semiconductor module 201 has a flat shape. Although not shown in particular, the semiconductor module 201 includes a power terminal, and a control terminal that is electrically connected to a control circuit board.

The plurality of semiconductor modules 201 include two first semiconductor modules 201A, three second semiconductor modules 201B, six third semiconductor modules 201C, and three fourth semiconductor modules 201D.

The first semiconductor module 201A is used as a boosting converter. The second semiconductor module 201B is used as an inverter for a motor generator that is driven by an engine (not shown) and operated as an engine starting motor. The third semiconductor module 201C is used as an inverter for a motor generator that drives front wheels (not shown) as main drive wheels. The fourth semiconductor module 201D is used as an inverter for a motor generator that drives rear wheels (not shown) as driven wheels. The plurality of semiconductor modules 201 are integrally assembled to the heat exchanger 210 to form a heat exchange unit.

The applications and the number of the semiconductor modules 201 are not limited to these, and may be appropriately changed as necessary. According to the number of semiconductor modules 201 and other conditions, the number of channel pipes 220 is appropriately set.

The heat exchanger 210 includes the plurality of channel pipes 220, an inflow header unit 230 through which a heat transfer medium C flows in an inflow direction D1, and an outflow header unit 240 through which the heat transfer medium C flows in an outflow direction D3. These components of the heat exchanger 210 are preferably made of a material having good thermal conductivity such as aluminum.

The channel pipe 220 is configured as a flat-shaped pipe whose thickness direction is the lamination direction X and whose longitudinal direction is the width direction Y. The plurality of channel pipes 220 are laminated at equal intervals and separated from each other with a space 213 for sandwiching the semiconductor module 201 from both sides. Thus, the semiconductor module 201 inserted into the space 213 is cooled by the flows of heat transfer medium C through the respective two channel pipes 220 on both sides in the lamination direction X.

Examples of the heat transfer medium C flowing through the channel pipe 220 include cooling media such as natural coolants such as water and ammonia, fluorocarbon coolants such as water mixed with an ethylene glycol antifreeze, and Fluorinert (registered trademark), chlorofluorocarbon coolants such as HCFC123 and HFC134a, alcohol coolants such as methanol and alcohol, and ketone coolants such as acetone.

The inflow header unit 230 and the outflow header unit 240 are both configured as pipes whose longitudinal direction is the lamination direction X and that are separated from each other in the width direction Y and extend parallel to each other.

The inflow header unit 230 is connected to an inlet pipe 211 into which the heat transfer medium C flows. A connection pipe 231 between the inflow header unit 230 and the inlet pipe 211 is provided on one of both end surfaces in the lamination direction X of the plurality of channel pipes 220. The inflow header unit 230 communicates with an inlet opening of each of the plurality of channel pipes 220.

The outflow header unit 240 is connected to an outlet pipe 212 out of which the heat transfer medium C flows. A connection pipe 241 between the outflow header unit 240 and the outlet pipe 212 is provided on the end surface in the lamination direction X of the plurality of channel pipes 220 on which the connection pipe 231 is provided. The outflow header unit 240 communicates with an outlet opening of each of the plurality of channel pipes 220.

Thus, the heat transfer medium C flowing from the inlet pipe 211 flows in the inflow direction D1 through the inflow header unit 230 and is divided into flows of heat transfer medium in a parallel flow direction D2 through the respective plurality of channel pipes 220. The flows of heat transfer medium from the respective plurality of channel pipes 220 are merged in the outflow header unit 240. Then, the heat transfer medium flows in the outflow direction D3 through the outflow header unit 240 toward the outlet pipe 212, and flows out of the outlet pipe 212.

A first channel pipe 220A is one of the plurality of channel pipes 220 that is located at the position closest to the inlet pipe 211 and the outlet pipe 212. A third channel pipe 220C is one of the plurality of channel pipes 220 that is located at the position farthest from the inlet pipe 211 and the outlet pipe 212. A second channel pipe 220B is a channel pipe that is located between the channel pipe 220A and the channel pipe 220C.

As shown in FIG. 26, the first channel pipe 220A includes a first case member 221A and a second case member 222A that are arranged to face each other in the lamination direction X, a plate-shaped partition member 223 that is provided between the first case member 221A and the second case member 222A, and two internal fins 225 and 226 that are arranged on both sides in the lamination direction X with the partition member 223 interposed therebetween.

The first case member 221A is provided with the connection pipe 231 and the connection pipe 241. The second case member 222A is provided with a connection pipe 232 constituting the inflow header unit 230 and a connection pipe 242 constituting the outflow header unit 240. An outer surface of the second case member 222A serves as a heat exchange surface 220a for the semiconductor module 201.

The first case member 221A and the second case member 222A are joined to each other by brazing to form a sealed internal space 227 in which the partition member 223 is arranged. At this time, the internal space 227 in the first channel pipe 220A is partitioned by the partition member 223 so that the flows of heat transfer medium C through two channels 228 and 229 are parallel to each other.

Figure 27:
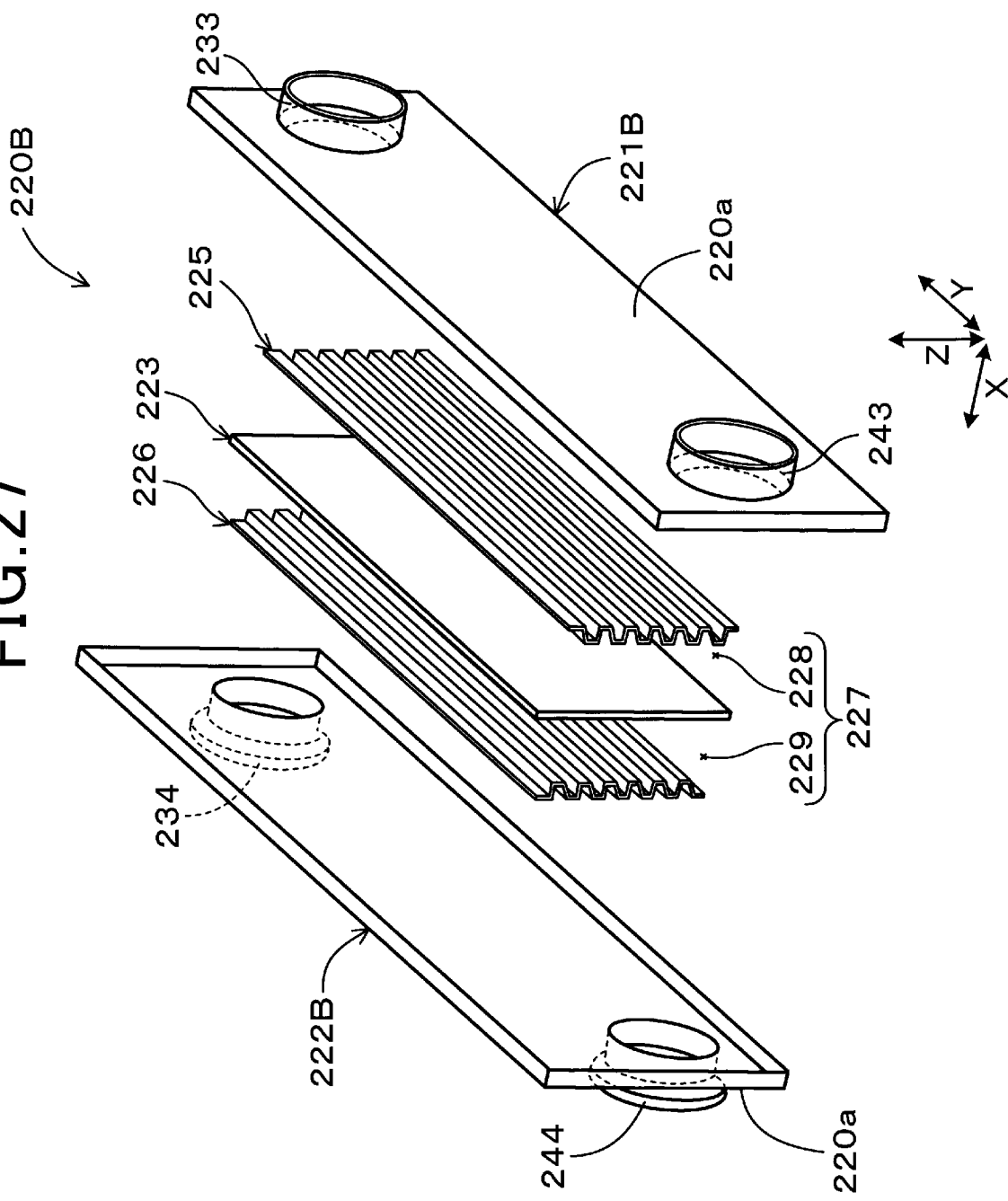
FIG. 27 is an exploded perspective view of a second channel pipe of the heat exchanger in FIG. 25.

As shown in FIG. 27, the second channel pipe 220B includes a first case member 221B and a second case member 222B that are arranged to face each other in the lamination direction X, and the partition member 223 and the internal fins 225 and 226 that have the same structure as in the first channel pipe 220A.

The first case member 221B is provided with a connection pipe 233 constituting the inflow header unit 230 and a connection pipe 243 constituting the outflow header unit 240. The second case member 222B is provided with a connection pipe 234 constituting the inflow header unit 230 and a connection pipe 244 constituting the outflow header unit 240. An outer surface of each of the first case member 221B and the second case member 222B serves as the heat exchange surface 220a for the semiconductor module 201.

The first case member 221B and the second case member 222B are joined to each other by brazing to form the sealed internal space 227 in which the partition member 223 is arranged. At this time, as in the first channel pipe 220A, the internal space 227 in the second channel pipe 220B is partitioned by the partition member 223 so that the flows of heat transfer medium C through the two channels 228 and 229 are parallel to each other.

Figure 28:
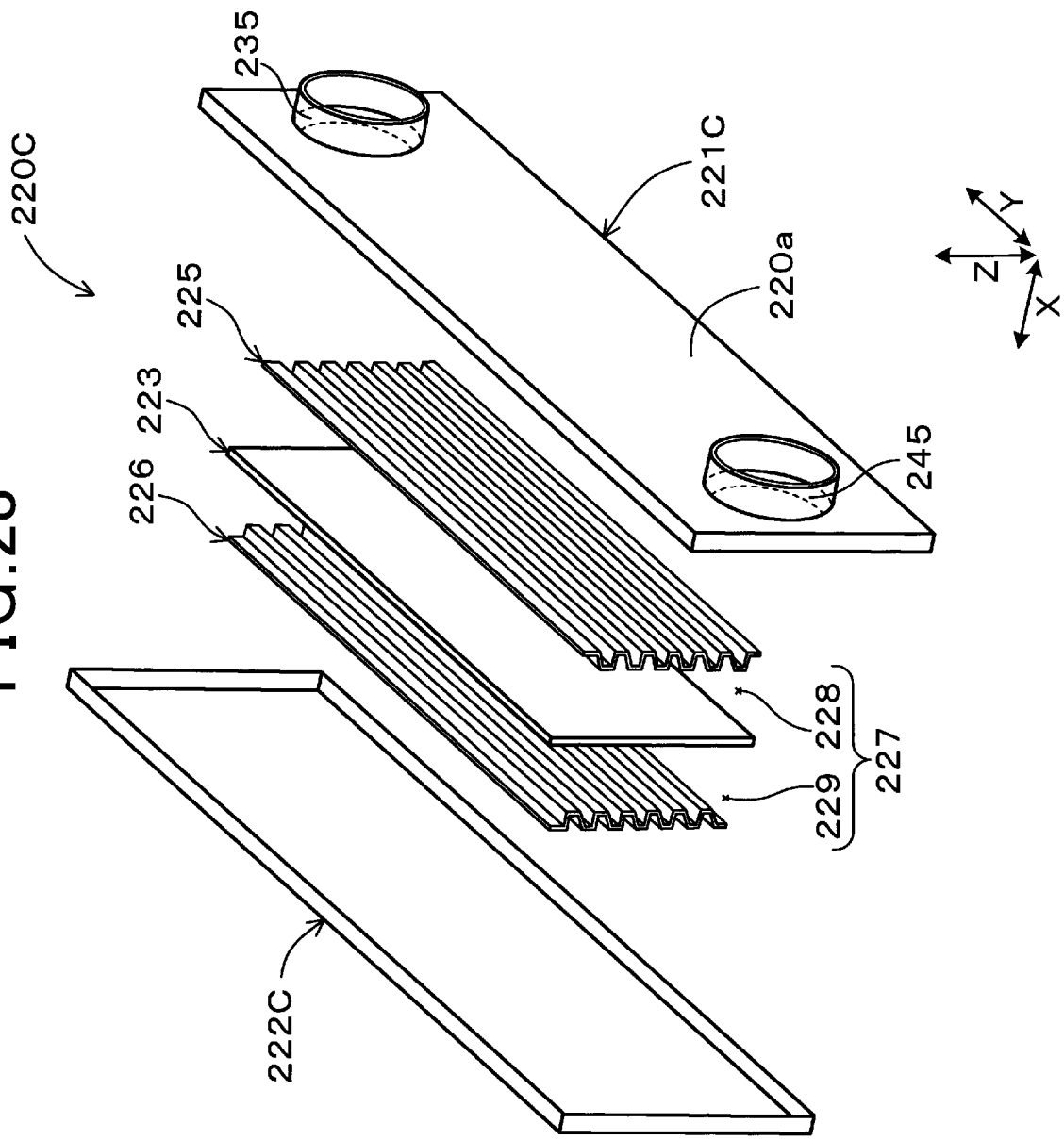
FIG. 28 is an exploded perspective view of a third channel pipe of the heat exchanger in FIG. 25.

As shown in FIG. 28, the third channel pipe 220C includes a first case member 221C and a second case member 222C that are arranged to face each other in the lamination direction X, and the partition member 223 and the internal fins 225 and 226 that have the same structure as in the first channel pipe 220A.

The first case member 221C is provided with a connection pipe 235 constituting the inflow header unit 230 and a connection pipe 245 constituting the outflow header unit 240. An outer surface of the first case member 221C serves as the heat exchange surface 220a for the semiconductor module 201.

The first case member 221C and the second case member 222C are joined to each other by brazing to form the sealed internal space 227 in which the partition member 223 is arranged. At this time, as in the first channel pipe 220A, the internal space 227 in the third channel pipe 220C is partitioned by the partition member 223 so that the flows of heat transfer medium C through the two channels 228 and 229 are parallel to each other.

Internal structures of the three channel pipes 220A, 220B, and 220C will be described below. The channel pipes 220A, 220B, and 220C have the same internal structure, and thus only the internal structure of the second channel pipe 220B will be described with reference to FIG. 29, and the internal structures of the remaining two channel pipes 220A and 220C will not be described.

Figure 29:
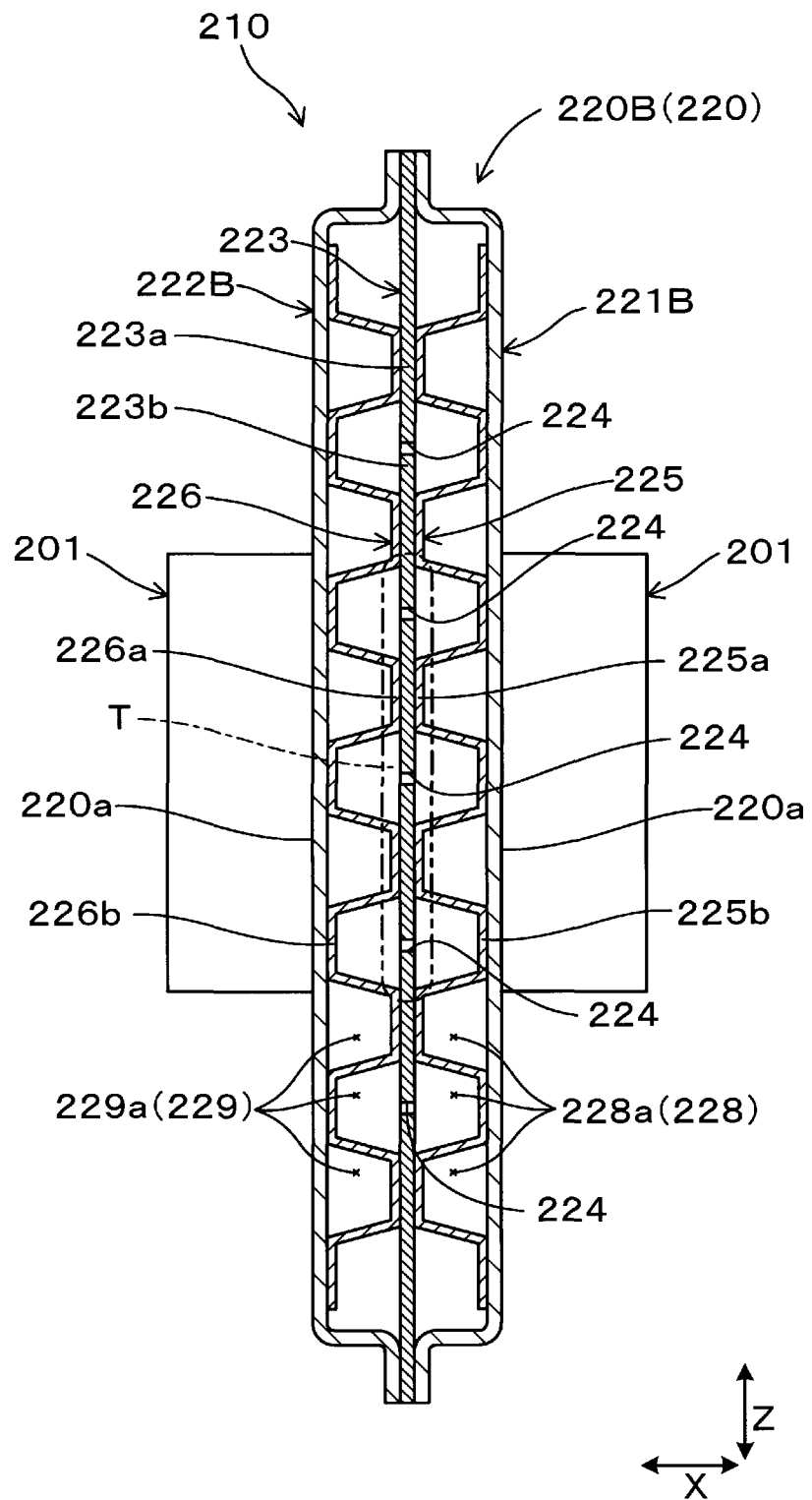
FIG. 29 is a cross-sectional view showing a cross-sectional structure of the second channel pipe in FIG. 27.

As shown in FIG. 29, the two internal fins 225 and 226 are both configured such that a cross section in a plane defined by the lamination direction X and the height direction Z has a corrugated shape. Specifically, the internal fin 225 on the right side in FIG. 29 has a corrugated cross-sectional shape in which a plurality of convex portions 225 and a plurality of concave portions 225b facing the partition member 223 are alternately formed. Similarly, the internal fin 226 on the left side in FIG. 29 has a corrugated cross-sectional shape in which a plurality of convex portions 226 and a plurality of concave portions 226b facing the partition member 223 are alternately formed.

At each of the plurality of convex portions 225a, the internal fin 225 is joined to a joining portion 223a of the partition member 223 by brazing, and at each of the plurality of concave portions 225b, the internal fin 225 is joined to an inner surface of the first case member 221B by brazing. Since the convex portions 225a and the concave portions 225b of the internal fin 225 are alternately arranged in the height direction Z, the first channel 228 formed by partitioning the internal space 227 by the partition member 223 is divided into a plurality of narrow channels 228a by the internal fin 225.

At each of the plurality of convex portions 226a, the internal fin 226 is joined to the joining portion 223a of the partition member 223 by brazing, and at each of the plurality of concave portions 226b, the internal fin 226 is joined to an inner surface of the second case member 222B by brazing. Since the convex portions 226 and the concave portions 226b of the internal fin 226 are alternately arranged in the height direction Z, the second channel 229 formed by partitioning the internal space 227 by the partition member 223 is divided into a plurality of narrow channels 229a by the internal fin 226.

In the channel 228, the heat transfer medium C can be moved between the plurality of narrow channels 228a. Thus, the pressure is the same in the plurality of narrow channels 228a, and the pressure in the plurality of narrow channels 228a is the pressure in the channel 228. Similarly, in the channel 229, the heat transfer medium C can be moved between the plurality of narrow channels 229a. Thus, the pressure is the same in the plurality of narrow channels 229a, and the pressure in the plurality of narrow channels 229a is the pressure in the channel 229.

The partition member 223 is provided with a plurality of communication holes 224 spaced from each other in the height direction Z. The plurality of communication holes 224 are each provided at a non-joining portion 223b of the partition member 223 to which the convex portion 225a of the internal fin 225 or the convex portion 226a of the internal fins 226 is not joined. The communication hole 224 is configured to pass through the partition member 223 in the lamination direction X, which is a thickness direction of the partition member 223, so that the first channel 228 and the second channel 229 communicate with each other. The communication hole 224 is a through hole having a constant inner diameter in the lamination direction X.

According to this configuration, through the plurality of communication holes 224, the heat transfer medium C can be moved between the first channel 228 and the second channel 229. In this case, the communication holes 224 have a function of preventing an imbalance in the pressure and the flow rate between the first channel 228 and the second channel 229. The number of communication holes 224 may be appropriately set as necessary.

The plurality of communication holes 224 are provided at least in a facing region T of the partition member 223 that faces the semiconductor module 201 in the lamination direction X. The facing region T is a region in which, due to an influence of heat entering from the semiconductor module 201, in particular, an increase in the pressure by boiling of the heat transfer medium C is more likely to occur.

Figure 30:
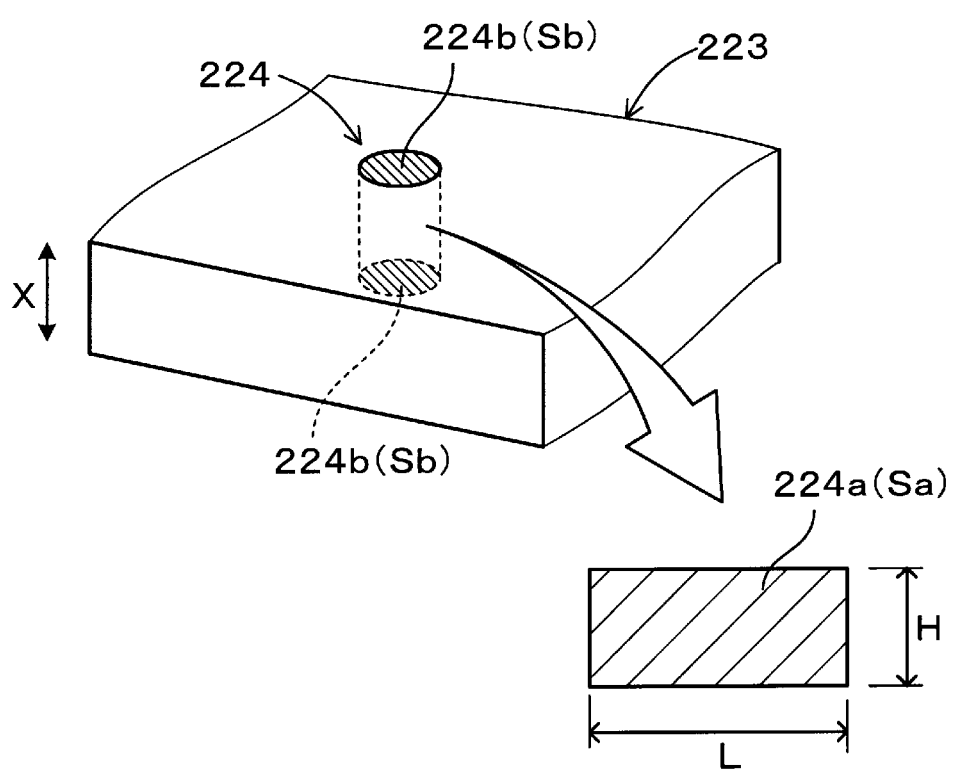
FIG. 30 is a diagram illustrating a surface area of an inner peripheral surface and an opening area of an opening of a communication hole in FIG. 29.

As shown in FIG. 30, the communication hole 224 is configured such that a surface area Sa of an inner peripheral surface 224a exceeds twice an opening area Sb of an opening 224b (see a hatched region in FIG. 30). A longitudinal dimension of the inner peripheral surface 224a corresponds to a thickness dimension H of the partition member 223, and a lateral dimension of the inner peripheral surface 224a corresponds to a circumferential length L of the opening 224b of the communication hole 224. The opening area Sb corresponds to a surface area of one surface of the partition member 223 before the communication hole 224 is provided.

Thus, it can be said that in this configuration, a surface area of the entire partition member 223 including the surface area Sa of the inner peripheral surface 224a of the communication hole 224 exceeds a surface area of the entire partition member 223 that is not provided with the communication hole 224.

Next, functions and effects of the eighth embodiment will be described.

Heat transfer between the heat transfer medium C of the heat exchanger 210 and the semiconductor module 201 will be described, in particular, by using the second channel pipe 220B as an example.

As shown in FIG. 25, the heat transfer medium C flows from the inflow header unit 230 into the second channel pipe 220B of the heat exchanger 210. The heat transfer medium C flowing in the second channel pipe 220B exchanges heat with the external semiconductor module 201 through the heat exchange surfaces 220a which are the outer surfaces on both sides of the second channel pipe 220B.

As shown in FIG. 29, the second channel pipe 220B is partitioned by the plate-shaped partition member 223 into the first channel 228 and the second channel 229, and the flows of heat transfer medium C through the two channels 228 and 229 are parallel to each other in the same parallel flow direction D2 (see FIG. 25).

Figure 31:
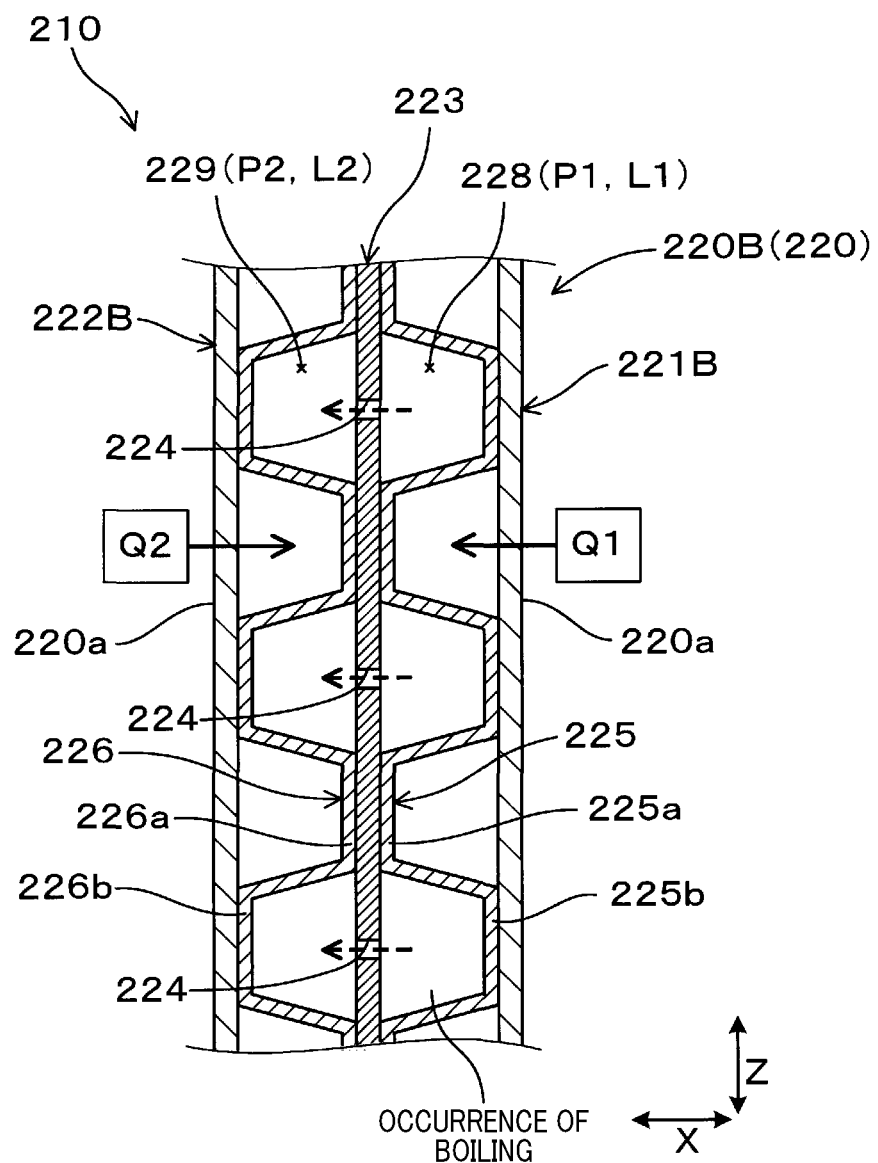
FIG. 31 is a diagram illustrating an effect of the communication hole in FIG. 29.

As shown in FIG. 31, generated heat Q1 from the semiconductor module 201 on the right side enters the first channel 228 through the heat exchange surface 220a of the first case member 221B. Similarly, generated heat Q2 from the semiconductor module 201 on the left side enters the second channel 229 through the heat exchange surface 220a of the second case member 222B.

When the heat transfer medium C does not boil either in the first channel 228 or the second channel 229, a pressure P1 in the first channel 228 and a pressure P2 in the second channel 229 have approximately the same value, and a flow rate L1 of the heat transfer medium C flowing through the first channel 228 and a flow rate L2 of the heat transfer medium C flowing through the second channel 229 also have approximately the same value.

On the other hand, when the amount of generated heat Q1 exceeds the amount of generated heat Q2 and the heat transfer medium C boils only in the first channel 228, the pressure P1 in the first channel 228 exceeds the pressure P2 in the second channel 229, resulting in an imbalance in the pressure. Due to the imbalance in the pressure, an imbalance in the flow rate occurs in which the flow rate L1 of the heat transfer medium C in the first channel 228 is reduced and the flow rate L2 of the heat transfer medium C in the second channel 229 is increased. The imbalance in the flow rate is a factor that deteriorates the heat exchange performance between the semiconductor module 201 and the heat exchanger 210.

In this regard, in the present embodiment, the two channels 228 and 229 communicate with each other through the communication hole 224 provided in the partition member 223. Thus, even when an imbalance in the pressure occurs between the two channels 228 and 229, by distributing the pressure so that the pressure P1 in the first channel 228 on the high-pressure side is shared with the second channel 229 on the low-pressure side through the communication hole 224 of the partition member 223, the imbalance in the pressure can be reduced. When the pressure P1 approaches the pressure P2 and the imbalance in the pressure is eliminated, the imbalance in the flow rate is reduced and the flow rate L1 of the heat transfer medium C in the first channel 228 is recovered. As a result, as compared with the case where the partition member 223 is not provided with the communication hole 224, the heat exchange performance between the semiconductor module 201 and the heat exchanger 210 can be improved.

The disappearance of the imbalance in the pressure using the communication hole 224 of the partition member 223 can achieve an effect of protecting the heat exchanger 210.

Although not shown in particular, the above description of the second channel pipe 220B can be referred to for the first channel pipe 220A and the third channel pipe 220C. One surface in the lamination direction X of each of the first channel pipe 220A and the third channel pipe 220C is the heat exchange surface 220a. Thus, as compared with the second channel pipe 220B having the heat exchange surfaces 220a on both sides, in the first channel pipe 220A and the third channel pipe 220C, the heat transfer medium C is more likely to boil in one of the two channels 228 and 229 and an imbalance in the pressure is more likely to occur between the two channels 228 and 229.

In the heat exchanger 210, since the heat exchanger 210 is provided with the internal fin 225 that divides the channel 228 into the plurality of narrow channels 228 and the internal fin 226 that divides the channel 229 into the plurality of narrow channels 229a, the heat transfer area for heat exchange of the heat transfer medium C is increased and the heat exchange performance is improved.

In the heat exchanger 210, since the internal fins 225 and 226 having a corrugated cross-sectional shape are used, it is possible to simplify the structure for dividing the two channels 228 and 229 into the plurality of narrow channels 228 and the plurality of narrow channels 229a, respectively.

In the heat exchanger 210, since the communication hole 224 is provided at the non-joining portion 223b of the partition member 223, only the partition member 223 needs to be processed to have a through hole, leading to easy processing of the communication hole 224.

In the heat exchanger 210, since the communication hole 224 is configured such that the surface area Sa of the inner peripheral surface 224a exceeds twice the opening area Sb of the opening 224b, the surface area of the partition member 223 can be increased as compared with before the communication hole 224 is provided. In this case, the surface area of the partition member 223 serves as the heat transfer area, and thus the heat exchange performance can be improved as compared with the heat exchange performance before the communication hole 224 is provided.

In the heat exchanger 210, since the communication hole 224 is provided in the region such as the facing region T of the partition member 223 in which an increase in the pressure by boiling of the heat transfer medium C is more likely to occur, the pressure can be distributed with good responsiveness so that the pressure in the channel on the high-pressure side is shared with the channel on the low-pressure side through the communication hole 224.

The communication hole 224 is not premised on boiling of the heat transfer medium C, and even when the heat transfer medium C does not boil, the communication hole 224 reliably has the effect of distributing the pressure so that the pressure on the high-pressure side is shared with the low-pressure side.

Other embodiments related to the eighth embodiment will be described below with reference to the drawings. In the other embodiments, the same elements as in the eighth embodiment are given the same reference numerals and are not described.

Ninth Embodiment

Figure 32:
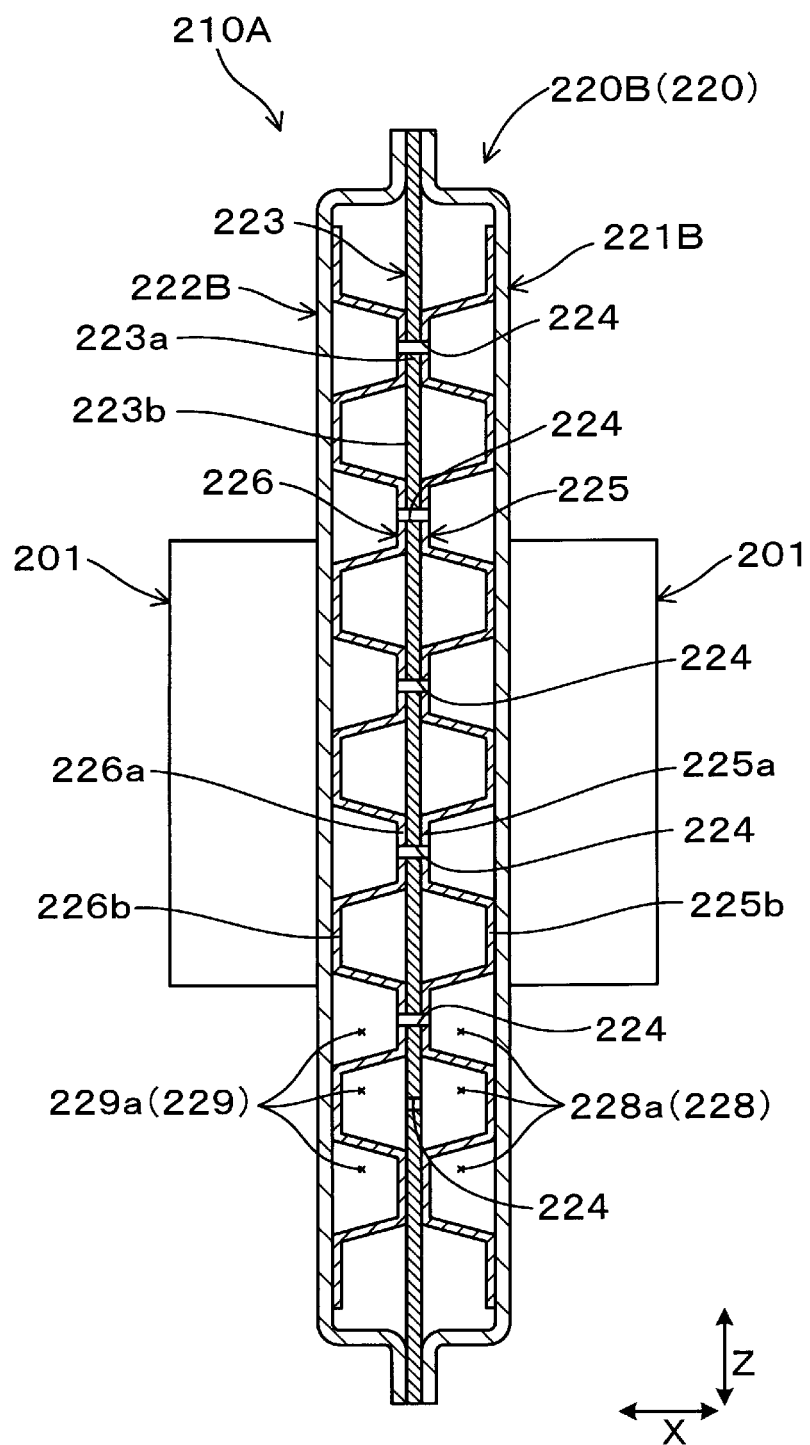
FIG. 32 is a cross-sectional view corresponding to FIG. 29 for a heat exchanger according to a ninth embodiment.

As shown in FIG. 32, a heat exchanger 210A of a ninth embodiment differs from the heat exchanger 210 of the eighth embodiment in the position of the communication holes 224 provided in the partition member 223 of the second channel pipe 220B. Although not shown in particular, in the heat exchanger 210A, the first channel pipe 220A and the third channel pipe 220C also have the same structure as the second channel pipe 220B.

The communication hole 224 is provided at the joining portion 223a of the partition member 223 joined to the convex portion 225a of the internal fin 225 and the convex portion 226a of the internal fin 226, and is not provided at the non-joining portion 223b of the internal fin 226. Thus, the communication hole 224 is configured to pass through the partition member 223 and the two convex portions 225 and 226a on both sides of the partition member 223. The joining portion 223a at which the communication hole 224 is provided is a portion at which the introduction of heat from the semiconductor module 201 is more likely to occur through the convex portion 225a of the internal fin 225 and the convex portion 226a of the internal fin 226 and the heat transfer medium C tends to be generated.

The rest of the configuration is the same as in the eighth embodiment.

In the heat exchanger 210A, since the communication hole 224 is provided in the region in which an increase in the pressure by boiling of the heat transfer medium C is more likely to occur, the pressure can be distributed with good responsiveness so that the pressure in the channel on the high-pressure side is shared with the channel on the low-pressure side through the communication hole 224.

Other than this, the present embodiment has the same functions and effects as in the eighth embodiment.

Tenth Embodiment

Figure 33:
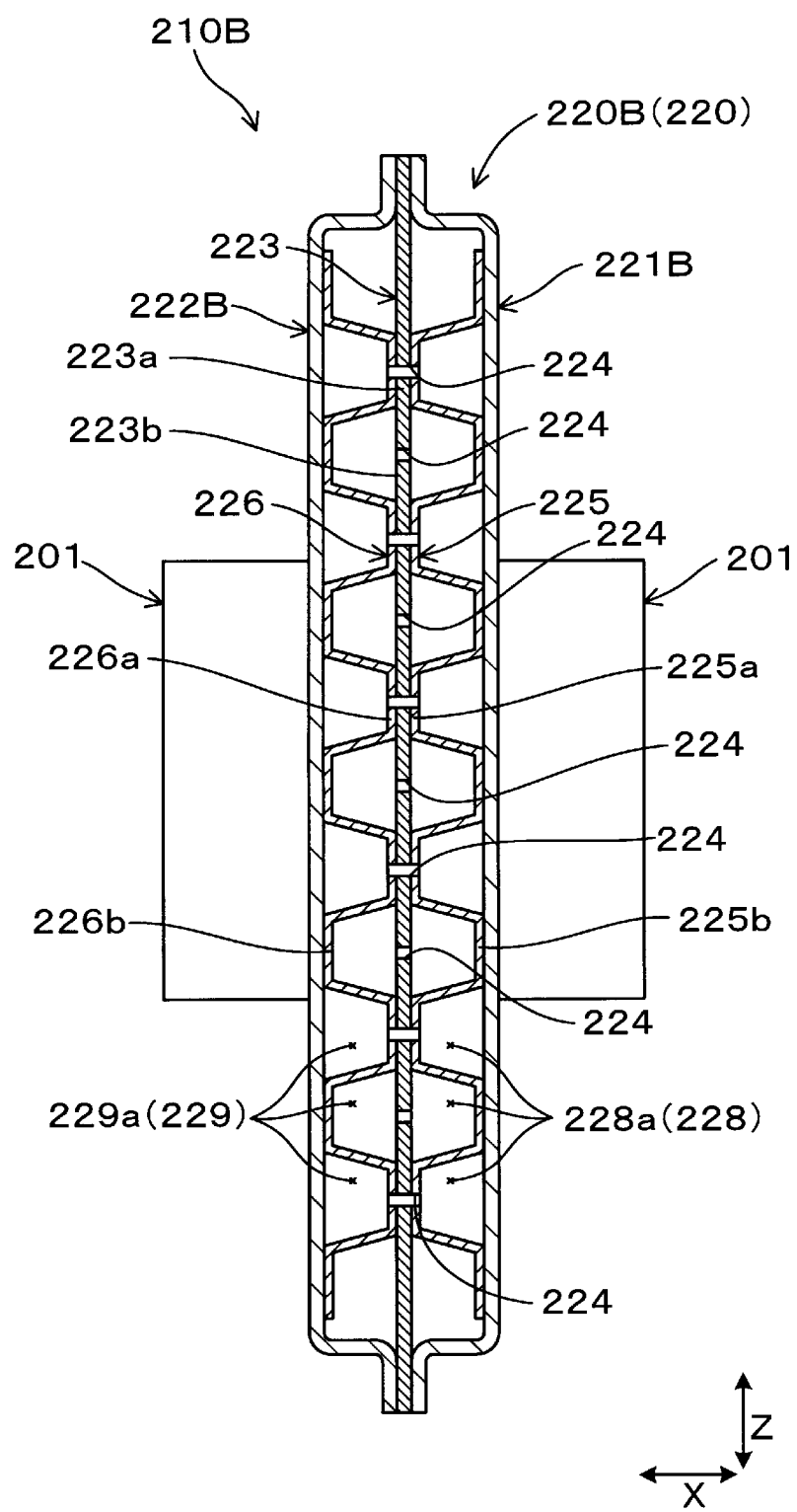
FIG. 33 is a cross-sectional view corresponding to FIG. 29 for a heat exchanger according to a tenth embodiment.

As shown in FIG. 33, a heat exchanger 210B of a tenth embodiment differs from the heat exchanger 210 of the eighth embodiment in the position of the communication holes 224 provided in the partition member 223 of the second channel pipe 220B. Although not shown in particular, in the heat exchanger 210B, the first channel pipe 220A and the third channel pipe 220C also have the same structure as the second channel pipe 220B.

The communication hole 224 is provided at both the joining portion 223a of the partition member 223 joined to the convex portion 225a of the internal fin 225 and the convex portion 226a of the internal fin 226, and the non-joining portion 223b of the partition member 223.

The rest of the configuration is the same as in the eighth embodiment.

In the heat exchanger 210B, since the communication holes 224 are almost uniformly arranged in the partition member 223, it is possible to improve the responsiveness for distributing the pressure so that the pressure in the channel on the high-pressure side is shared with the channel on the low-pressure side.

Other than this, the present embodiment has the same functions and effects as in the eighth embodiment.

Eleventh Embodiment

Figure 34:
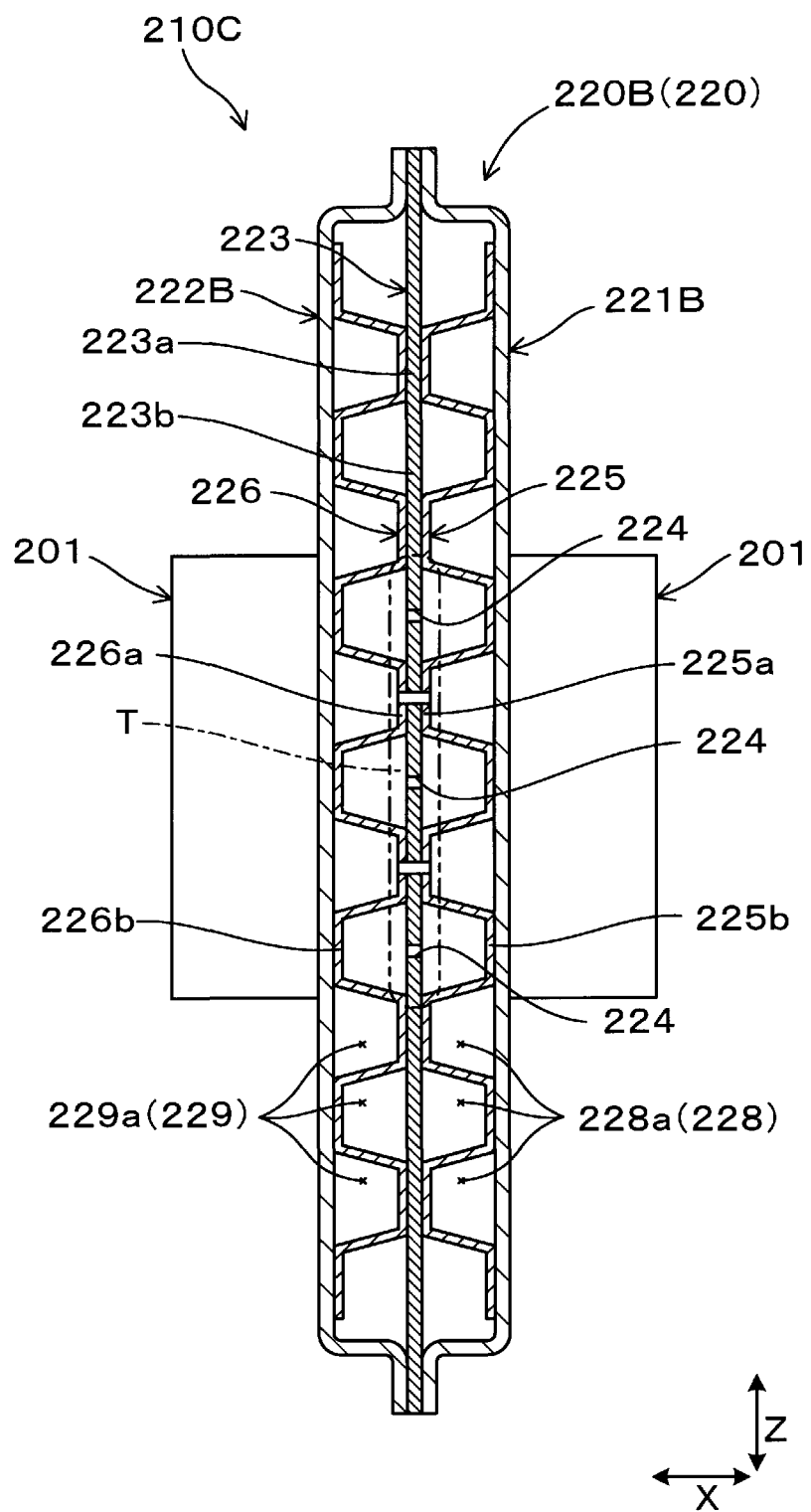
FIG. 34 is a cross-sectional view corresponding to FIG. 29 for a heat exchanger according to an eleventh embodiment.

As shown in FIG. 34, a heat exchanger 210C of an eleventh embodiment differs from the heat exchanger 210B of the tenth embodiment in the position of the communication holes 224 provided in the partition member 223 of the second channel pipe 220B. Although not shown in particular, in the heat exchanger 210C, the first channel pipe 220A and the third channel pipe 220C also have the same structure as the second channel pipe 220B.

Unlike the case of the heat exchanger 210B of the tenth embodiment, the communication holes 224 are provided only in the facing region T of the partition member 223.

The rest of the configuration is the same as in the tenth embodiment.

In the heat exchanger 210C, since the number of communication holes 224 is reduced, the cost required for processing the communication holes 224 can be reduced. Furthermore, since the communication holes 224 are retained in the facing region T in which an increase in the pressure by boiling of the heat transfer medium C is more likely to occur, it is possible to prevent deterioration of the responsiveness for distributing the pressure so that the pressure in the channel on the high-pressure side is shared with the channel on the low-pressure side.

Other than this, the present embodiment has the same functions and effects as in the tenth embodiment.

Twelfth Embodiment

Figure 35:
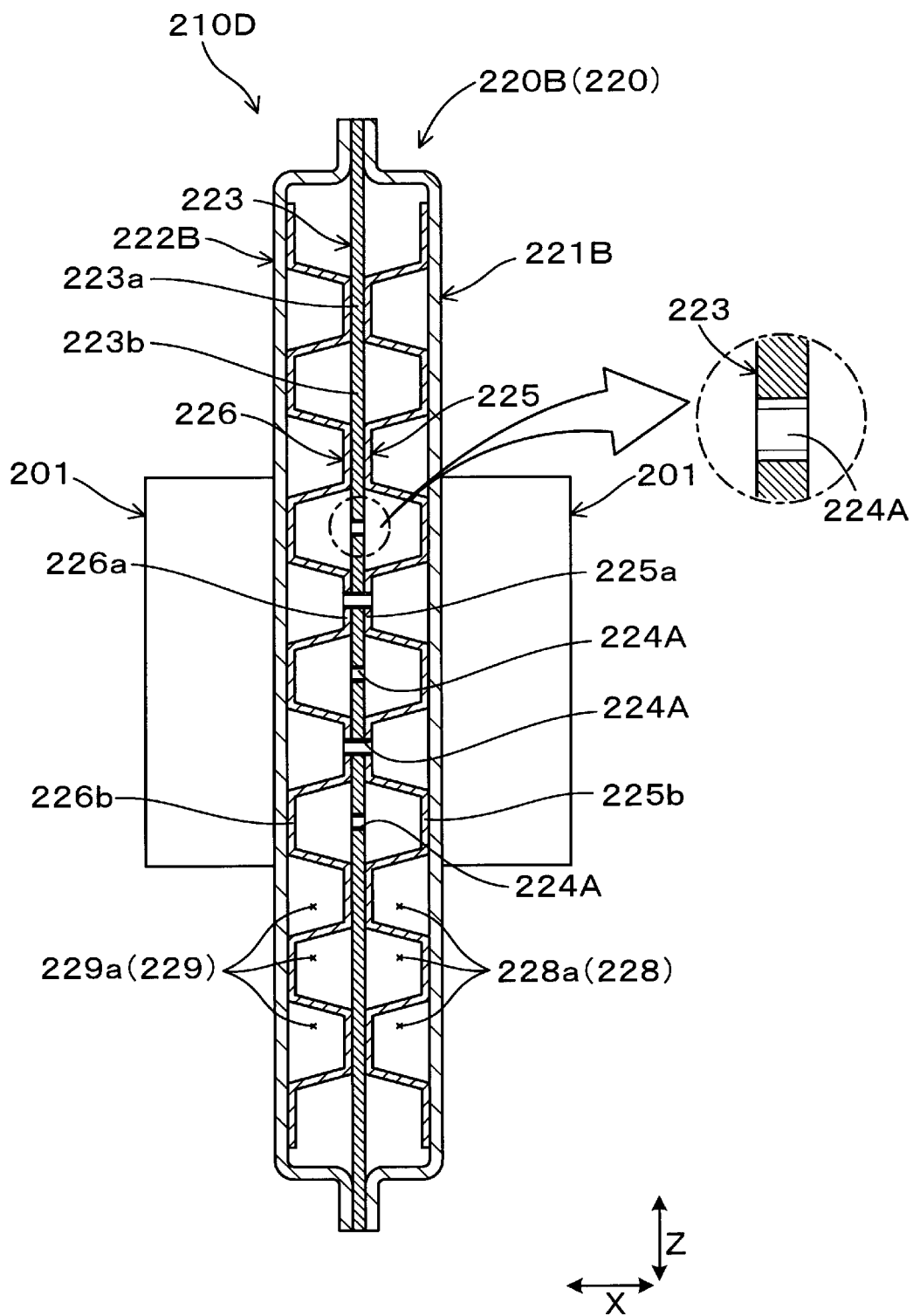
FIG. 35 is a cross-sectional view corresponding to FIG. 29 for a heat exchanger according to a twelfth embodiment.

As shown in FIG. 35, a heat exchanger 210D of a twelfth embodiment differs from the heat exchanger 210C of the eleventh embodiment in the structure of communication holes 224A provided in the partition member 223 of the second channel pipe 220B. Although not shown in particular, in the heat exchanger 210D, the first channel pipe 220A and the third channel pipe 220C also have the same structure as the second channel pipe 220B.

The communication hole 224A is configured as a screw hole having an inner peripheral surface with a screw thread, and differs from the communication hole 224 having a constant inner diameter in the lamination direction X. The inner peripheral surface of the communication hole 224A has a larger surface area (heat transfer area) than the inner peripheral surface of the communication hole 224.

The rest of the configuration is the same as in the eleventh embodiment.

In the heat exchanger 210D, since the partition member 223 is provided with the communication holes 224A having a larger heat transfer area than the communication holes 224, the heat exchange performance can be improved.

Other than this, the present embodiment has the same functions and effects as in the eleventh embodiment.

A modification particularly related to the twelfth embodiment may have a structure in which the communication holes 224 of each of Embodiments 8 to 10 are replaced with the communication holes 224A.

Thirteenth Embodiment

Figure 36:
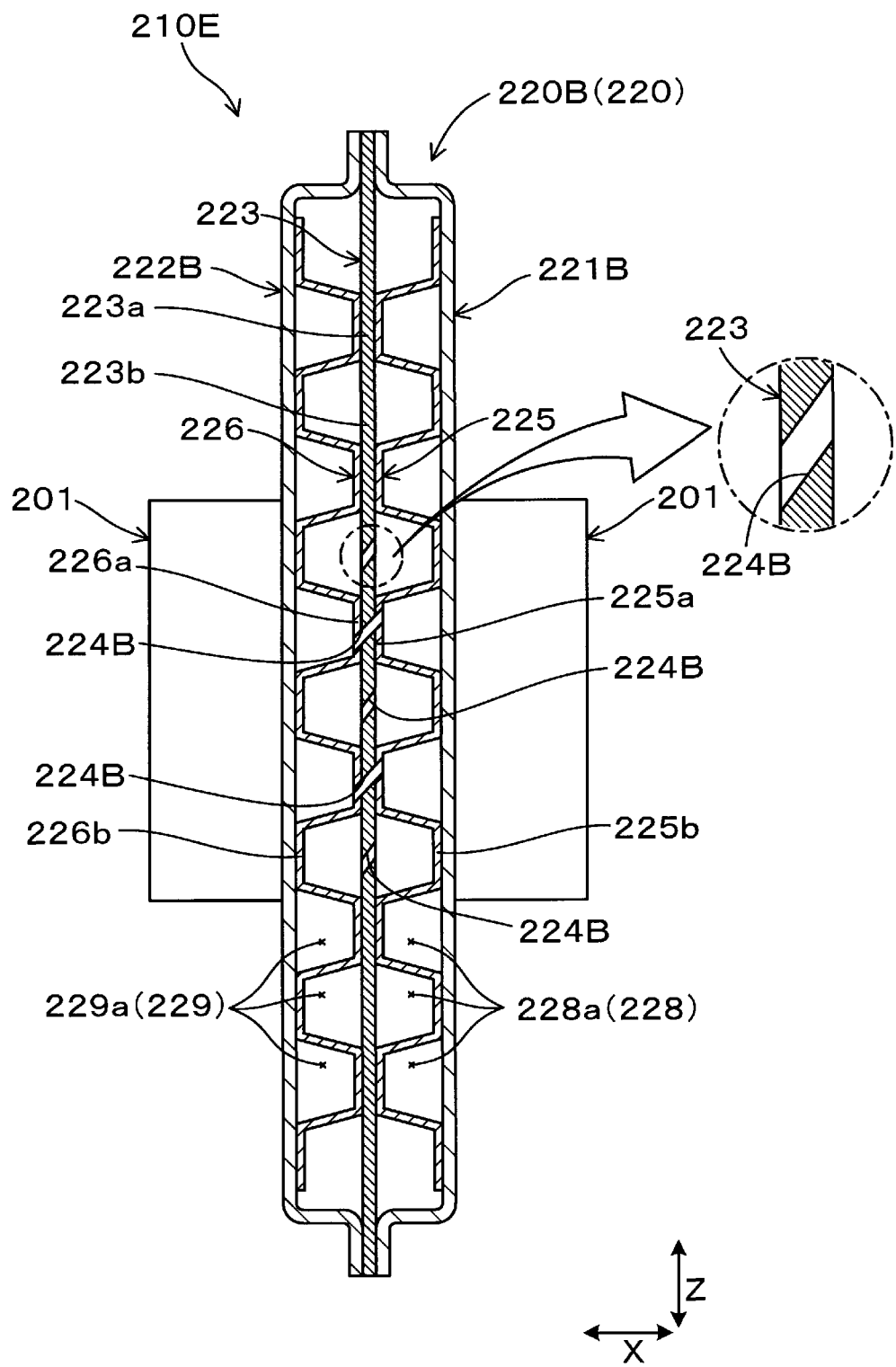
FIG. 36 is a cross-sectional view corresponding to FIG. 29 for a heat exchanger according to a thirteenth embodiment.

As shown in FIG. 36, a heat exchanger 210E of a thirteenth embodiment differs from the heat exchanger 210C of the eleventh embodiment in the structure of communication holes 224B provided in the partition member 223 of the second channel pipe 220B. Although not shown in particular, in the heat exchanger 210E, the first channel pipe 220A and the third channel pipe 220C also have the same structure as the second channel pipe 220B.

The communication hole 224B is configured to extend obliquely with respect to the lamination direction X, which is the thickness direction of the partition member 223. The inner peripheral surface of the communication hole 224B has a larger surface area (heat transfer area) than the inner peripheral surface of the communication hole 224.

The rest of the configuration is the same as in the eleventh embodiment.

In the heat exchanger 210E, since the partition member 223 is provided with the communication holes 224B having a larger heat transfer area than the communication holes 224, the heat exchange performance can be improved.

Other than this, the present embodiment has the same functions and effects as in the eleventh embodiment.

A modification particularly related to the thirteenth embodiment may have a structure in which the communication holes 224 of each of Embodiments 8 to 10 are replaced with the communication holes 224B.

Fourteenth Embodiment

Figure 37:
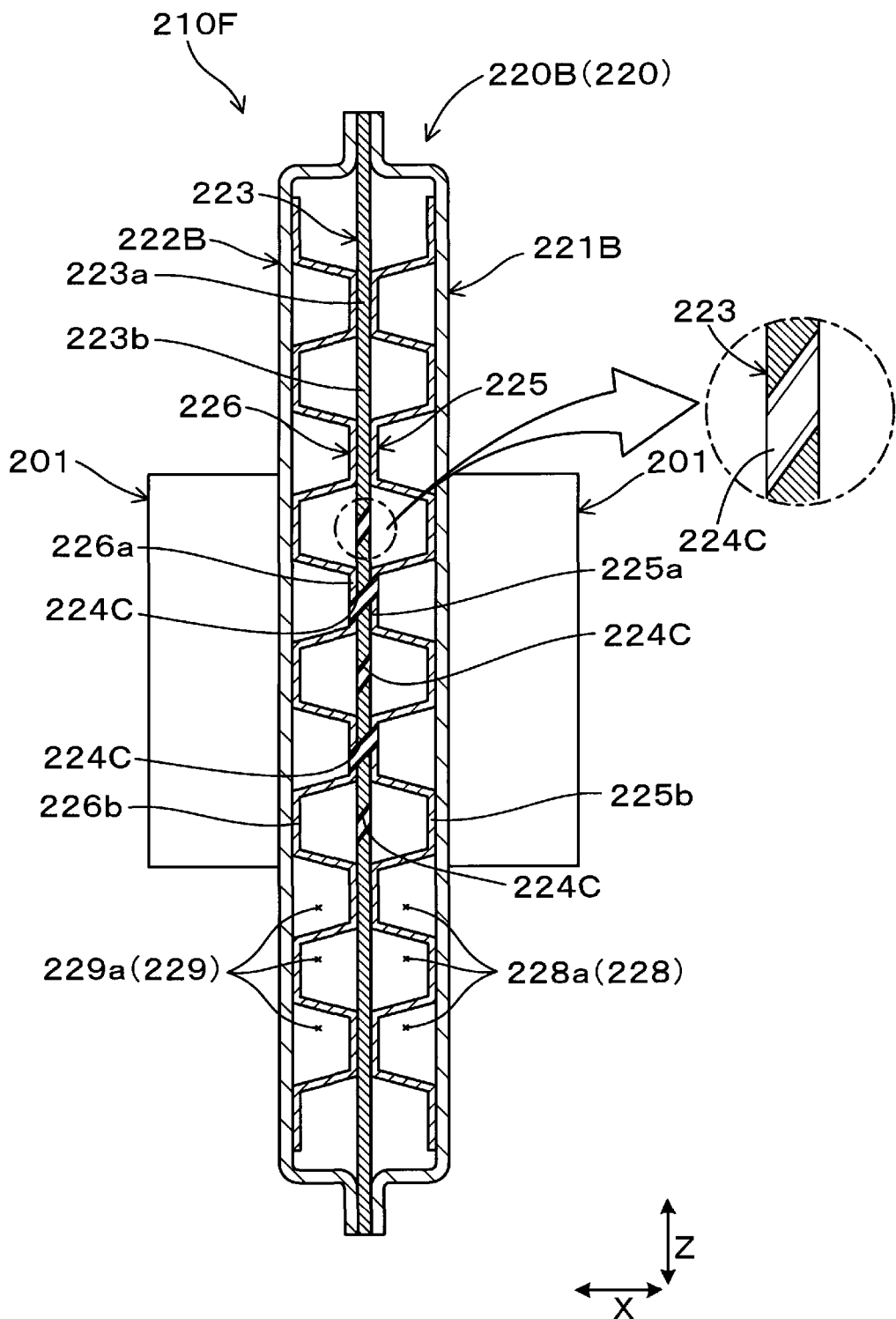
FIG. 37 is a cross-sectional view corresponding to FIG. 29 for a heat exchanger according to a fourteenth embodiment.

As shown in FIG. 37, a heat exchanger 210F of a fourteenth embodiment differs from the heat exchanger 210E of the thirteenth embodiment in the structure of communication holes 224C provided in the partition member 223 of the second channel pipe 220B. Although not shown in particular, in the heat exchanger 210F, the first channel pipe 220A and the third channel pipe 220C also have the same structure as the second channel pipe 220B.

The communication hole 224C is configured as a screw hole that extends obliquely with respect to the lamination direction X, which is the thickness direction of the partition member 223, and has an inner peripheral surface with a screw thread. The inner peripheral surface of the communication hole 224C has a larger surface area (heat transfer area) than the inner peripheral surface of the communication hole 224B.

The rest of the configuration is the same as in the thirteenth embodiment.

In the heat exchanger 210F, since the partition member 223 is provided with the communication holes 224C having a larger heat transfer area than the communication holes 224B, the heat exchange performance can be improved.

Other than this, the present embodiment has the same functions and effects as in the thirteenth embodiment.

A modification particularly related to the fourteenth embodiment may have a structure in which the communication holes 224 of each of Embodiments 8 to 10 are replaced with the communication holes 224C.

Fifteenth Embodiment

Figure 38:
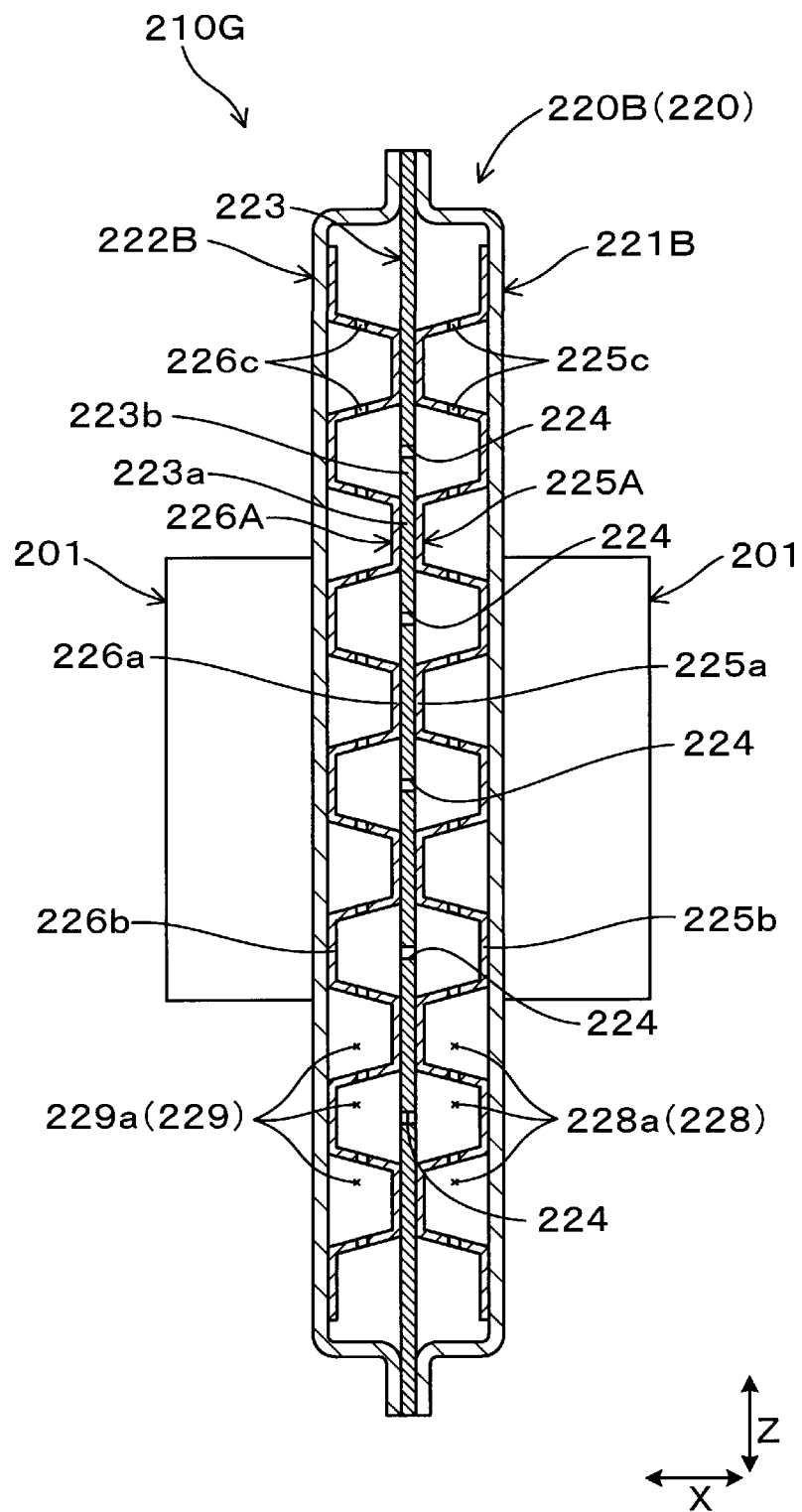
FIG. 38 is a cross-sectional view corresponding to FIG. 29 for a heat exchanger according to a fifteenth embodiment.

As shown in FIG. 38, a heat exchanger 210G of a fifteenth embodiment differs from the heat exchanger 210 of the eighth embodiment in the structure of two internal fins 225A and 226A provided in the second channel pipe 220B. Although not shown in particular, in the heat exchanger 210G, the first channel pipe 220A and the third channel pipe 220C also have the same structure as the second channel pipe 220B.

When the communication hole 224 of the partition member 223 is a first communication hole, the internal fin 225A is provided with a second communication hole 225c through which two adjacent narrow channels of the plurality of narrow channels 228a communicate with each other. Similarly, the internal fin 226A is provided with a second communication hole 226c through which two adjacent narrow channels of the plurality of narrow channels 229a communicate with each other.

The rest of the configuration is the same as in the eighth embodiment.

In the heat exchanger 210G, in addition to the effect that the communication hole 224 prevents an imbalance in the pressure and the flow rate between the first channel 228 and the second channel 229, the second communication hole 225c can prevent an imbalance in the pressure and the flow rate between the plurality of narrow channels 228a of the first channel 228, and the second communication hole 226c can prevent an imbalance in the pressure and the flow rate between the plurality of narrow channels 229a of the second channel 229.

Other than this, the present embodiment has the same functions and effects as in the eighth embodiment.

A modification particularly related to the fifteenth embodiment may have a structure in which the internal fins 225 and 226 of each of Embodiments 9 to 14 are replaced with the internal fins 225A and 226A.

Sixteenth Embodiment

Figure 39:
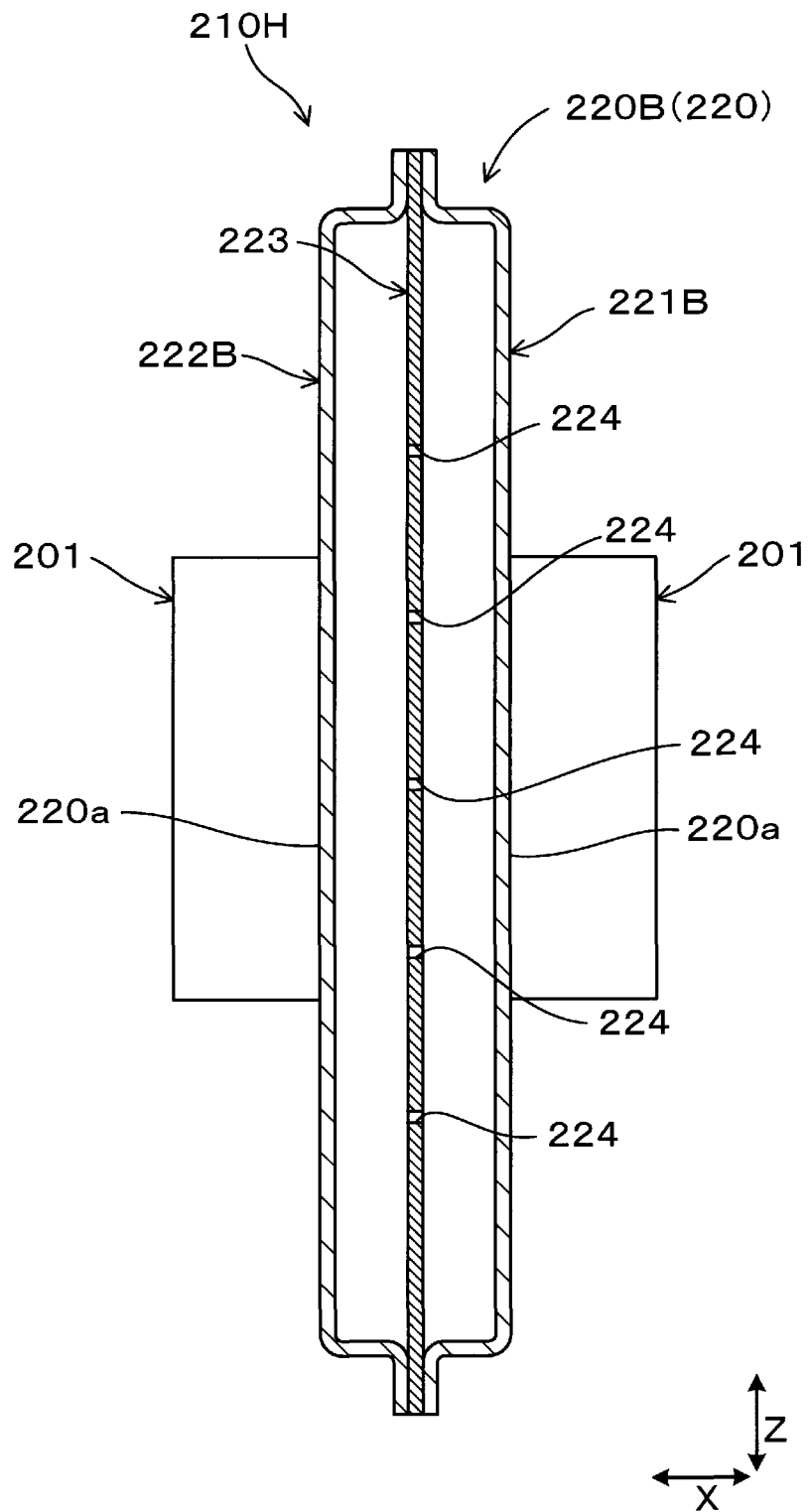
FIG. 39 is a cross-sectional view corresponding to FIG. 29 for a heat exchanger according to a sixteenth embodiment.

As shown in FIG. 39, a heat exchanger 210H of a sixteenth embodiment differs from the heat exchanger 210 of the eighth embodiment in the structure of the second channel pipe 220B. Although not shown in particular, in the heat exchanger 210H, the first channel pipe 220A and the third channel pipe 220C also have the same structure as the second channel pipe 220B.

In the second channel pipe 220B, the internal fins 225 and 226 are not provided.

The rest of the configuration is the same as in the eighth embodiment.

The heat exchanger 210H allows a more simplified structure than the heat exchanger 210.

Other than this, the present embodiment has the same functions and effects as in the eighth embodiment.

A modification particularly related to the sixteenth embodiment may have a structure in which the internal fins 225 and 226 or the internal fins 225A and 226A of each of Embodiments 9 to 15 are omitted.

The present disclosure is not limited to only the typical embodiments described above, but may be subjected to various applications or changes without departing from the object of the present disclosure. For example, the following embodiments can be implemented by applying the above embodiments.

The above embodiments show an example in which the heat exchanger exchanges heat with the semiconductor module 201 as the heat exchange object. Instead, the heat exchange object may be an object other than the semiconductor module 201.

The above embodiments show an example in which a structure including the partition member 223 provided with the communication hole 224, 224A, 224B, or 224C is applied to the heat exchanger using the cooling medium as the heat transfer medium C. Instead, this structure may be applied to a heat exchanger using a heating medium.

The above embodiments show an example in which the channel pipe is partitioned by the partition member 223 into two channels. Instead, the heat exchanger may have a structure in which the channel pipe is partitioned by the partition member 223 into three or more channels. In this case, the heat exchanger is configured such that at least two of the three or more channels communicate with each other through a region corresponding to the communication hole 224, 224A, 224B, or 224C.

Next, Embodiments 17 to 42 of the heat exchanger of the third aspect and the fourth aspect of the present disclosure will be described with reference to the drawings. An object of the disclosure is to provide a heat exchanger capable of ensuring a smooth flow of coolant to improve the cooling performance for an electronic component, thereby improving heat exchanger performance.

Seventeenth Embodiment

Figure 40:
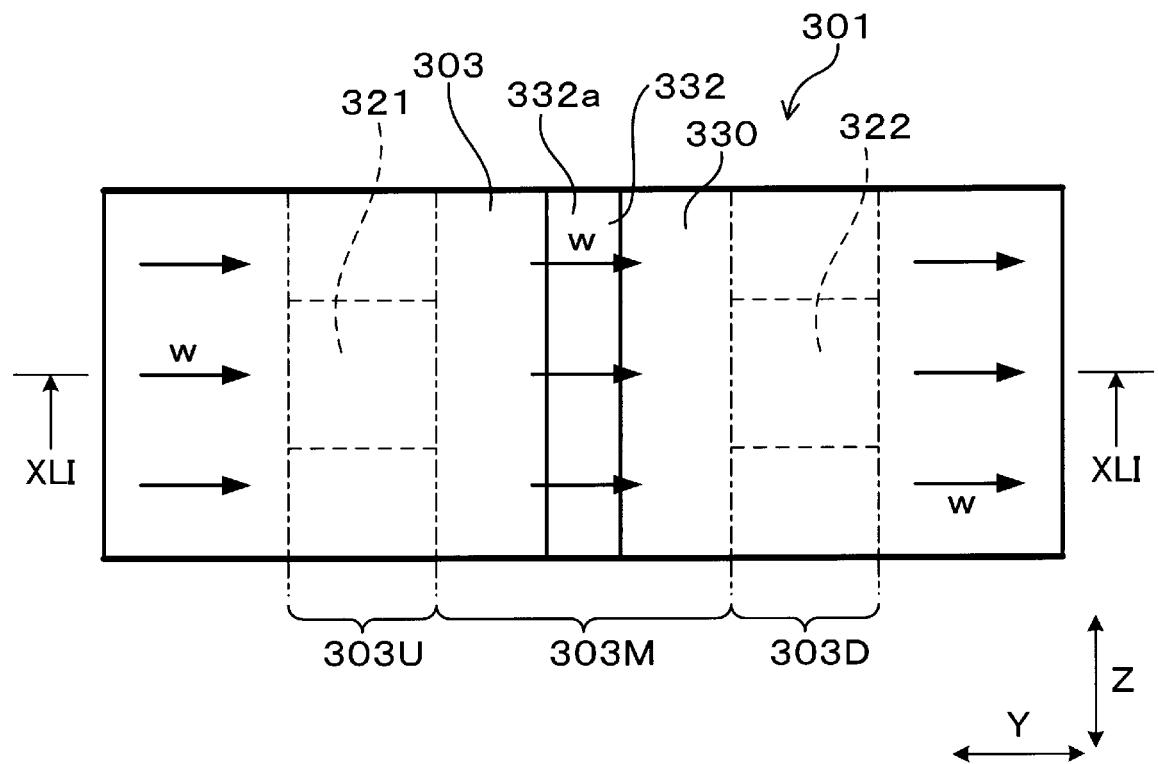
FIG. 40 is an explanatory plan view of a heat exchanger according to a seventeenth embodiment.
Figure 41:
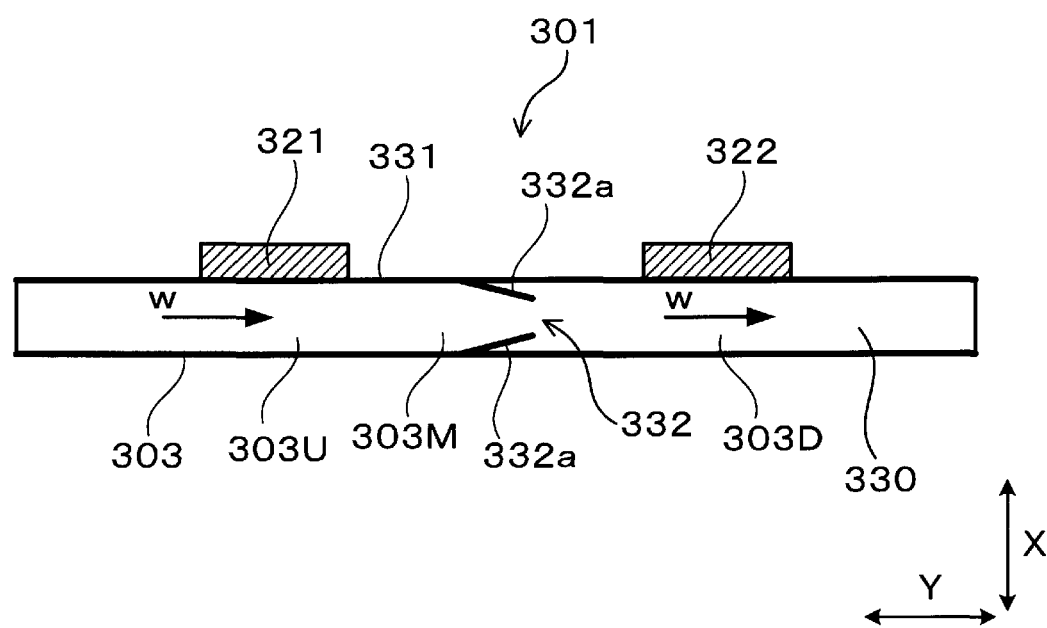
FIG. 41 is a cross-sectional view taken along line XLI-XLI in FIG. 40.
Figure 42:
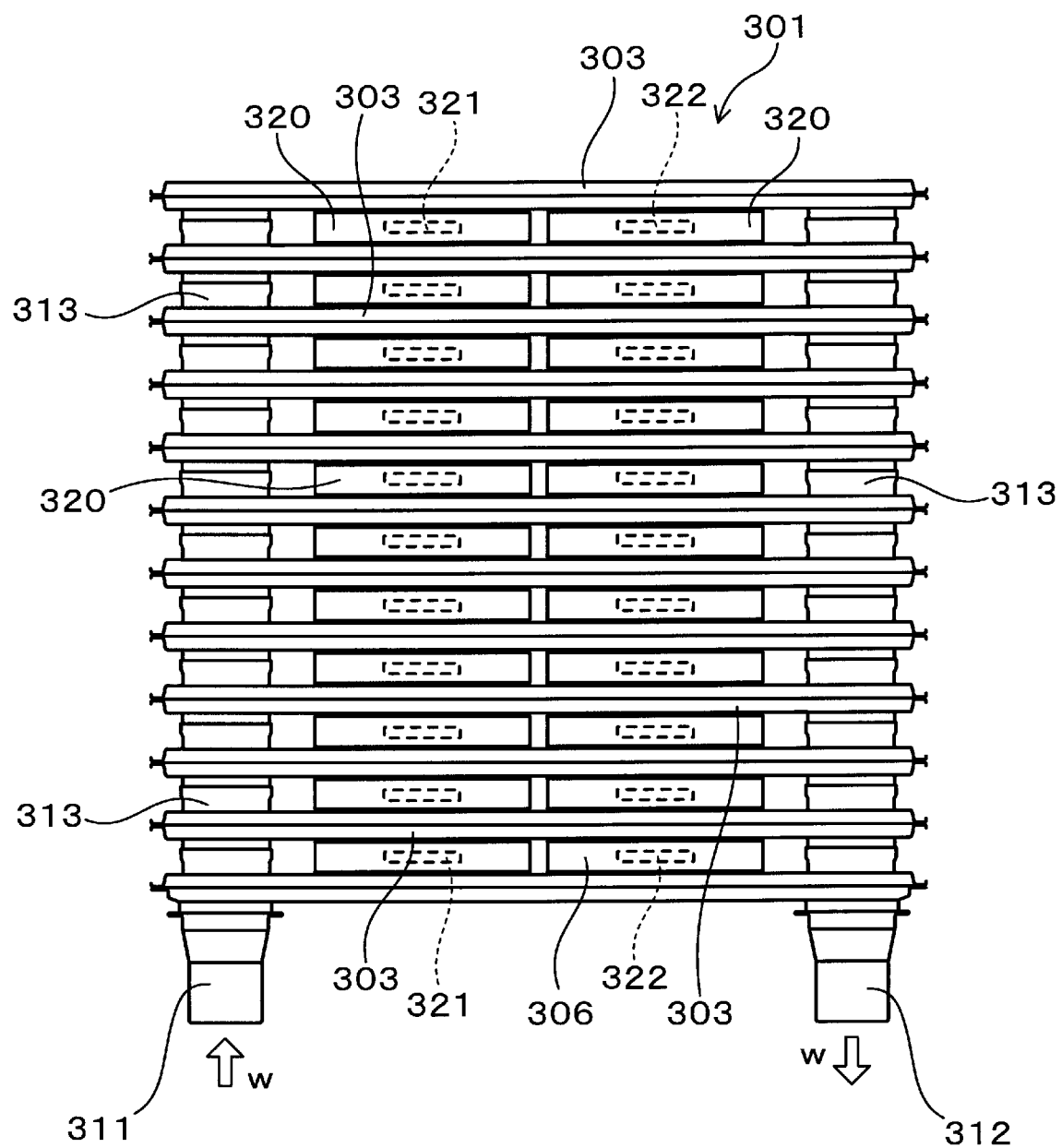
FIG. 42 is an explanatory plan view of a heat exchanger according to an eighteenth embodiment.

As shown in FIGS. 40 and 41, a component cooling device 301 of the present embodiment includes a cooling pipe 303, a first electronic component 321, and a second electronic component 322. The cooling pipe 303 is provided inside with a coolant channel 330 through which a coolant is circulated. The first electronic component 321 and the second electronic component 322 are arranged thermally in contact with a cooling surface 331 of the cooling pipe 303. Arrows w shown in FIGS. 40 and 41 indicate the flows of coolant when no boiling occurs. The same applies to the subsequent figures.

The first electronic component 321 is arranged on an upstream side of the second electronic component 322 in the coolant channel 330.

The coolant channel 330 has an intermediate region 303M, an upstream region 303U, and a downstream region 303D that are defined as follows. The intermediate region 303M is a region of the coolant channel 330 that is located on a downstream side of the first electronic component 321 and an upstream side of the second electronic component 322. The upstream region 303U is a region of the coolant channel 330 that is located between an upstream end and a downstream end of the first electronic component. The downstream region 303D is a region of the coolant channel 330 that is located between an upstream end of the second electronic component and a downstream end of the second electronic component.

In the intermediate region 303M, a fluid diode unit 332 is provided. The fluid diode unit 332 causes a channel resistance in a direction from the downstream region 303D toward the upstream region 303U to be higher than a channel resistance in a direction from the upstream region 303U toward the downstream region 303D.

The channel resistance in the direction from the downstream region 303D toward the upstream region 303U indicates a channel resistance to a flow of coolant from the downstream region 303D toward the upstream region 303U. The channel resistance in the direction from the upstream region 303U toward the downstream region 303D indicates a channel resistance to a flow of coolant from the upstream region 303U toward the downstream region 303D.

The component cooling device 301 of the present embodiment has the cooling surface 331 on one of main surfaces of the cooling pipe 303. The first electronic component 321 and the second electronic component 322 are arranged in contact with the cooling surface 331. The cooling pipe 303 is provided inside with the coolant channel 330 so that the coolant flows in a longitudinal direction of the cooling pipe 303.

A normal direction of the cooling surface 331, that is, a lamination direction of the cooling pipe 303 and each of the first electronic component 321 and the second electronic component 322 is referred to as X direction as appropriate. A channel direction in which the coolant is circulated through the coolant channel 330 is referred to also as Y direction as appropriate. A direction orthogonal to both the X direction and the Y direction is referred to as Z direction as appropriate. The first electronic component 321 and the second electronic component 322 are arranged side by side in the Y direction.

In the present embodiment, the fluid diode unit 332 is composed of a pair of protruding pieces 332a that protrude inward from respective inner wall surfaces of the coolant channel 330 at both ends in the X direction. The protruding piece 332a may be a plate-shaped member that is inclined so that a part of the plate-shaped member closer to the inner side of the coolant channel 330 in the Z direction is located closer to the downstream side. Thus, the fluid diode unit 332 has the function described above.

The fluid diode unit 332 is not particularly limited as long as the fluid diode unit 332 has the predetermined function described above, and may be composed of, for example, a single protruding piece 332a. The fluid diode unit 332 may be integrally formed with the cooling pipe 303, or may be joined to the cooling pipe 303.

The first electronic component 321 and the second electronic component 322 may be, for example, a power semiconductor device. The first electronic component 321 and the second electronic component 322 may be, for example, a power semiconductor device constituting a switching circuit unit of a power conversion device. The power conversion device may be, for example, a power conversion device configured to be mounted on the vehicle and perform power conversion between DC power and AC power.

The coolant circulated through the coolant channel 330 is, for example, a liquid coolant such as water. However, in some cases, a part of the liquid coolant may boil and be vaporized.

Next, functions and effects of the present embodiment will be described.

In the component cooling device 301, the fluid diode unit 332 is provided in the intermediate region 303M. Thus, even when a part of the liquid coolant in the downstream region 303D is evaporated to be vapor by heat of the second electronic component 322 on the downstream side, the vapor can be prevented from flowing backward to the upstream region 303U. As a result, the vapor is easily discharged from a downstream end of the coolant channel 330 at an early timing, leading to smooth introduction and circulation of the liquid coolant in the coolant channel.

Therefore, a smooth flow of liquid coolant from the upstream side toward the downstream side of the coolant channel 330 can be ensured. As a result, the cooling performance for the first electronic component 321 and the second electronic component 322 can be improved.

As described above, the present embodiment can provide a component cooling device capable of ensuring a smooth flow of coolant to improve the cooling performance for an electronic component.

Eighteenth Embodiment

As shown in FIGS. 42 to 46, the present embodiment is an embodiment in which the component cooling device 301 includes the plurality of cooling pipes 303 laminated together with the first electronic component 321 and the second electronic component 322.

Specifically, the plurality of cooling pipes 303 are arranged substantially parallel to each other in the X direction, and the first electronic component 321 and the second electronic component 322 are arranged between adjacent cooling pipes 303. Accordingly, the first electronic component 321 and the second electronic component 322 are sandwiched between two cooling pipes 303 adjacent to each other in the X direction. Thus, the first electronic component 321 and the second electronic component 322 are cooled from both sides.

Each of the first electronic component 321 and the second electronic component 322 is molded with resin and constitutes a component module 320. Both main surfaces of the component module 320 are radiation surfaces thermally connected to the first electronic component 321 or the second electronic component 322. The component module 320 is arranged so that the radiation surfaces are thermally in contact with the cooling pipe 303.

Figure 44:
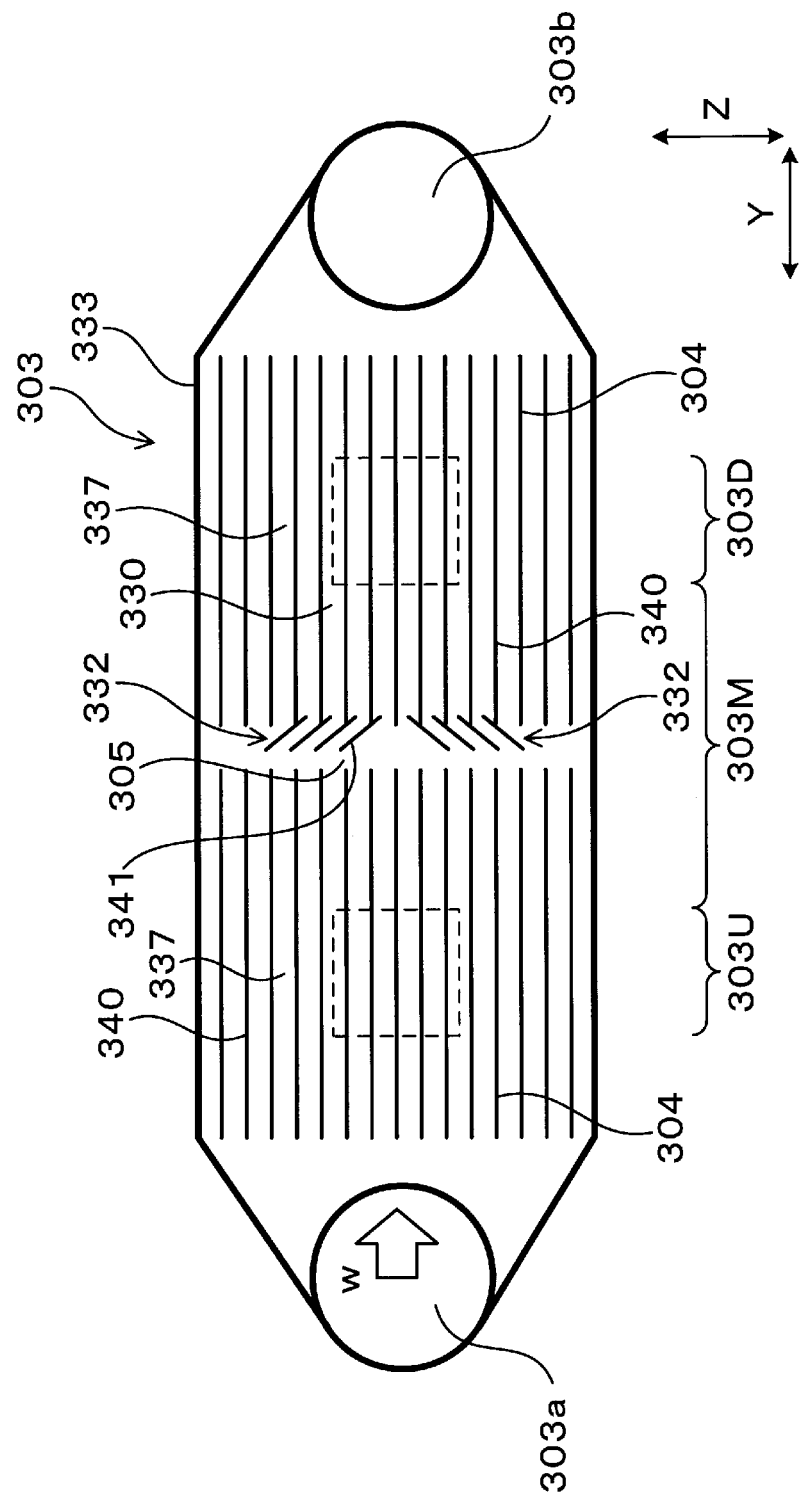
FIG. 44 is a cross-sectional view taken along line XLIV-XLIV in FIG. 43.

The cooling pipes 303 are connected to each other via a connecting pipe 313 in the vicinity of both end portions in the Y direction so that a first cooling pipe 303 is connected to a second cooling pipe 303 adjacent to the first cooling pipe 303 in the X direction. The cooling pipe 303 arranged at one end in the X direction is provided with an introduction port 311 from which the coolant is introduced and a discharge port 312 from which the coolant is discharged. As shown in FIG. 44, at a portion of each of the cooling pipes 303 connected to the connecting pipe 313, the cooling pipe 303 has an introduction portion 303a from which the coolant is introduced and a discharge portion 303b from which the coolant is discharged.

Figure 43:
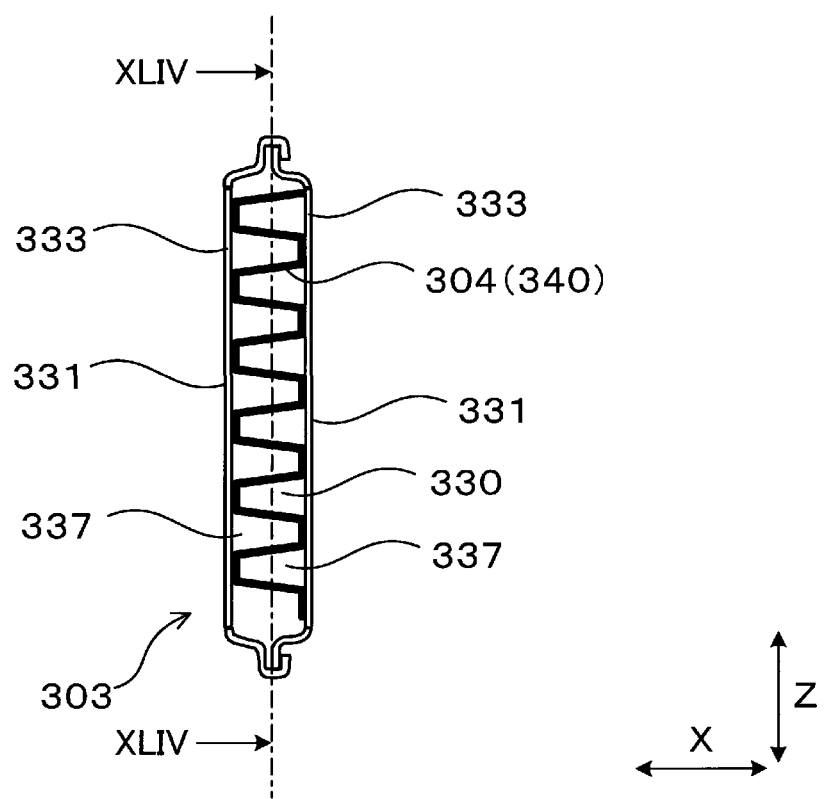
FIG. 43 is an explanatory plan view of a cooling pipe of the eighteenth embodiment.

As shown in FIGS. 43 and 44, each of the cooling pipes 303 is provided inside with an internal fin 304. The internal fin 304 is composed of a member separate from outer shell plates 333 constituting an outer shell of the cooling pipe 303. Specifically, as shown in FIG. 43, the cooling pipe 303 is composed of the pair of outer shell plates 333, and the internal fin 304 arranged in an internal space formed between the pair of outer shell plates 333.

The pair of outer shell plates 333 are joined to each other at end edges. The internal fin 304 has a fin body 340 that is formed to extend in the Y direction. As shown in FIG. 43, a cross section of the fin body 340 orthogonal to the Y direction has a continuous concave and convex shape. The convex portions of the fin body 340 are in contact with an inner surface of the outer shell plate 333. The internal fin 304 is joined to the outer shell plate 333 at the convex portions.

Figure 45:
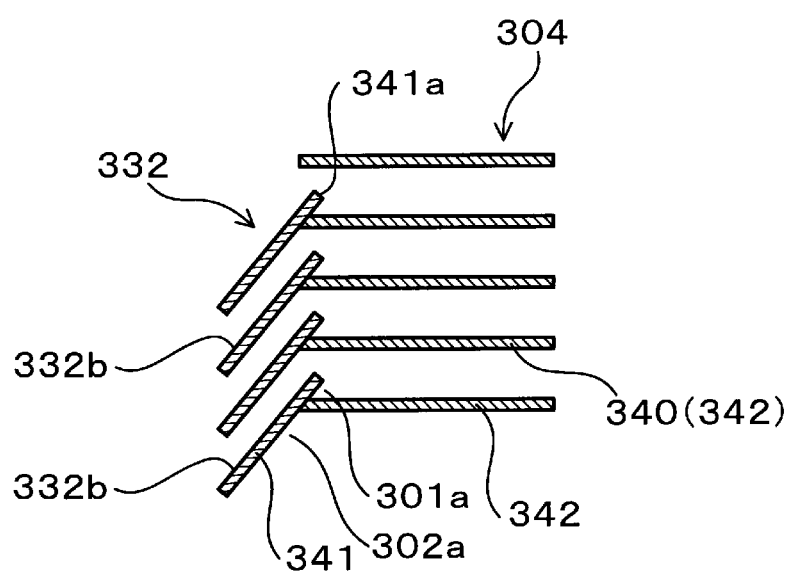
FIG. 45 is an enlarged explanatory view of a fluid diode unit of the eighteenth embodiment.

In the present embodiment, as shown in FIGS. 44 and 45, the fluid diode unit 332 is formed as a part of the internal fin 304. Specifically, the fluid diode unit 332 is composed of an inclined fin 341 and a connection fin 342. The inclined fin 341 has a portion inclined with respect to the channel direction (i.e., Y direction) of the coolant channel 330. The connection fin 342 is connected to the inclined fin 341 on an upstream side of a downstream end portion 341a of the inclined fin 341. The connection fin 342 is formed to extend from the portion connected to the inclined fin 341 toward a downstream side. A part of the fin body 340 constitutes the connection fin 342.

As shown in FIG. 44, the fin body 340 is separately arranged at an upstream side portion and a downstream side portion in the Y direction of the coolant channel 330. A downstream end of the fin body 340 on the upstream side and an upstream end of the fin body 340 on the downstream side are arranged in a part of the intermediate region 303M. The inclined fin 341 is arranged at the upstream end of the fin body 340 on the downstream side. As shown in FIG. 45, a part of the upstream end of the fin body 340 connected to the inclined fin 341 serves as the connection fin 342. That is, it can also be said that the fluid diode unit 332 is formed of a part of the fin body 340 on the downstream side and the inclined fin 341 connected to the part of the fin body 340 on the downstream side.

As shown in FIG. 45, when viewed from the X direction, the inclined fin 341 is formed in a linear shape and inclined with respect to the Y direction. The connection fin 342 is formed in a linear shape extending in the Y direction. When viewed from the X direction, an acute-angled space 301a which is a space having an acute angle and an obtuse-angled space 302a which is a space having an obtuse angle are present between the inclined fin 341 and the connection fin 342.

The acute-angled space 301 and the obtuse-angled space 302a are both a space facing the downstream side of the inclined fin 341. The coolant flowing from the downstream region 303D toward the upstream region 303U is partially blocked by the acute-angled space 301a. In particular, the coolant evaporated to be gas bubbles tends to enter the acute-angled space 301 and be prevented from flowing toward the upstream side of the acute-angled space 301a. Thus, the fluid diode unit 332 that increases the channel resistance in the direction from the downstream region 303D toward the upstream region 303U is formed in the intermediate region 303M.

The fluid diode unit 332 is formed in the vicinity of a center portion in the Z direction of the coolant channel 330 and is not formed at an outer portion in the Z direction of the coolant channel 330. The plurality of inclined fins 341 are formed so that the inclined fins 341 located above the center portion in the Z direction of the coolant channel 330 and the inclined fins 341 located below the center portion are inclined in opposite directions. Thus, the inclined fin 341 is inclined so that a part of the inclined fin 341 closer to the downstream side in the Y direction is located closer to the center in the Z direction of the coolant channel 330.

In other words, as shown in FIG. 45, the fluid diode unit 332 has a guide surface 332b that guides the coolant from outside to inside in a width direction (i.e., Z direction) orthogonal to both the channel direction (i.e., Y direction) of the coolant channel 330 and the normal direction (i.e., X direction) of the cooling surface 331. The guide surface 332b is a surface on the upstream side of main surfaces of the inclined fin 341.

As shown in FIG. 44, a diffusion unit 305 through which adjacent branch channels 337 communicate with each other is provided between the internal fin 304 on the upstream side and the internal fin 304 on the downstream side. The diffusion unit 305 is provided only in the intermediate region 303M among the upstream region 303U, the intermediate region 303M, and the downstream region 303D.

The rest of the configuration is the same as in the seventeenth embodiment. Of reference numerals used in the eighteenth embodiment and subsequent embodiments, the same reference numerals as those used in the previously described embodiment indicate the same components or the like as in the previously described embodiment unless otherwise specified.

In the present embodiment, the fluid diode unit 332 is formed of the inclined fin 341 and the connection fin 342. Thus, the fluid diode unit 332 has the acute-angled space 301a facing the downstream side. Therefore, the channel resistance in the direction from the downstream region 303D toward the upstream region 303U can be effectively increased. As a result, the vapor of the coolant is prevented from flowing backward to the upstream region 303U, leading to smooth circulation of the liquid coolant.

Figure 46:
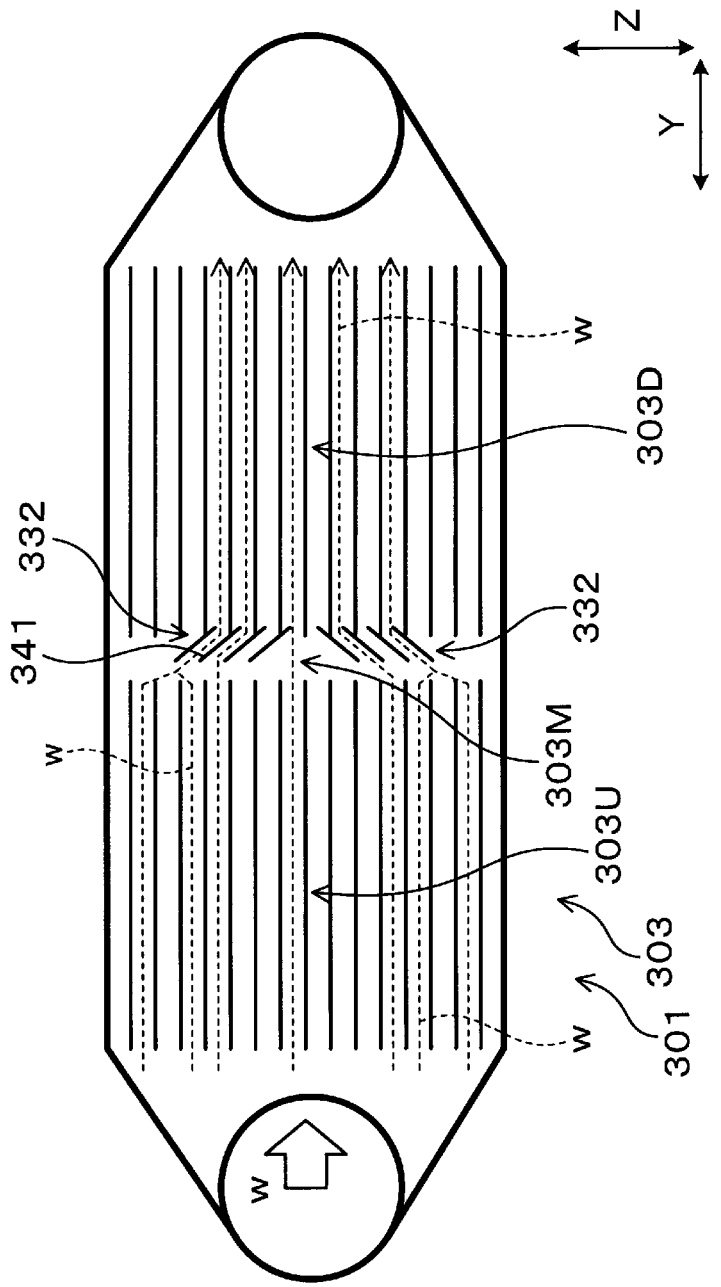
FIG. 46 is an explanatory plan view of a cooling pipe illustrating a flow of coolant of the eighteenth embodiment.

The fluid diode unit 332 has the guide surface 332b. Thus, as shown in FIG. 46, the guide surface 332b guides the coolant toward the center side in the Z direction, and a flow rate of the coolant at the center portion in the Z direction can be increased. Due to the increase in the flow rate, the gas bubbles captured in the acute-angled space 301a are more likely to be guided toward the downstream side. As a result, dry-out in the downstream region 303D can be prevented, thereby improving the cooling performance for the second electronic component 322.

Since the diffusion unit 305 is formed in the intermediate region 303M, the cooling performance can be effectively improved by an advantageous effect same as an advantageous effect described in detail in the thirty-third embodiment described later.

Other than this, the present embodiment has the same functions and effects as in the seventeenth embodiment.

First Comparative Embodiment

Figure 47:
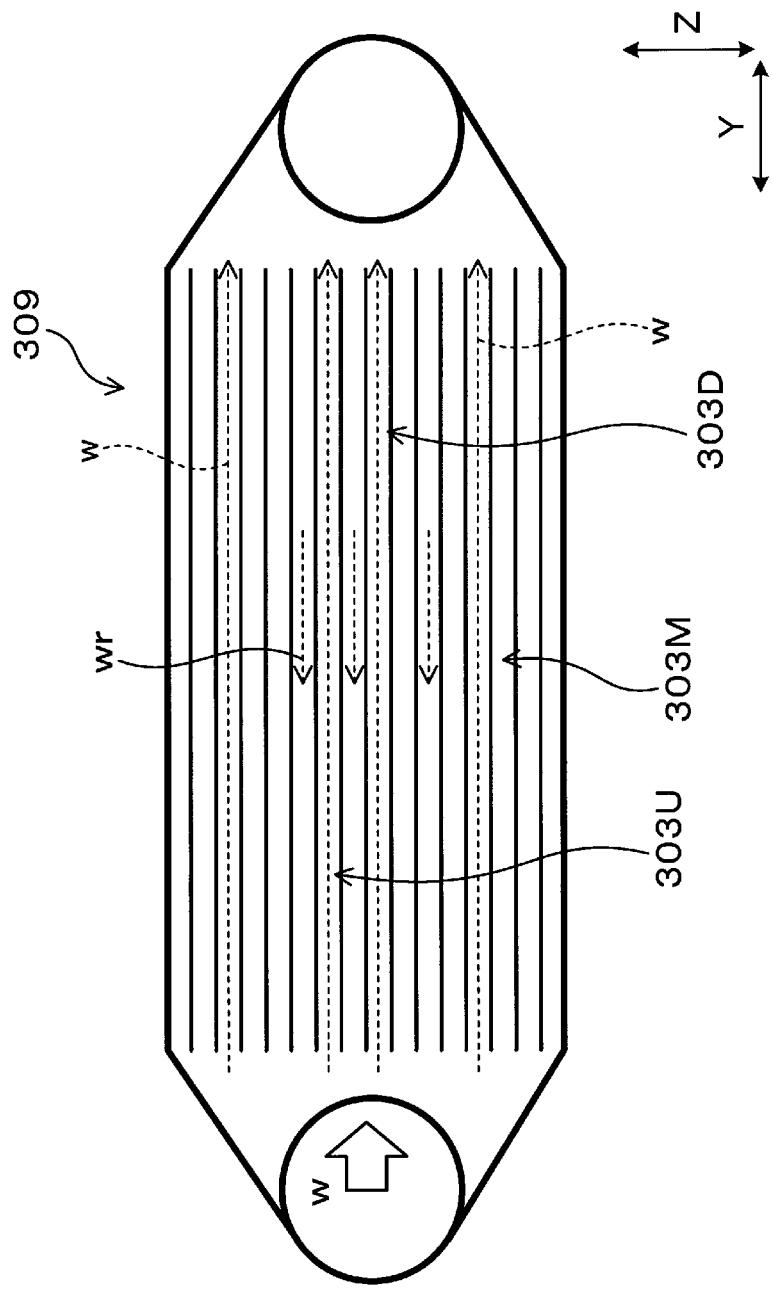
FIG. 47 is an explanatory plan view of a cooling pipe illustrating a flow of coolant of a first comparative embodiment.

As shown in FIG. 47, this comparative embodiment is an embodiment in which a component cooling device includes a cooling pipe 309 not including any fluid diode unit. More specifically, the comparative embodiment is an embodiment obtained by removing the inclined fins 341 from the cooling pipe 303 shown in the eighteenth embodiment. The internal fin 304 is continuously formed to extend in the Y direction from the upstream side of the upstream region 303U to the downstream side of the downstream region 303D.

The rest of the configuration is the same as in the eighteenth embodiment.

In some cases, part of the vapor of the coolant evaporated in the downstream region flows through the intermediate region 303M toward the upstream region 303U. In this case, if no fluid diode unit is formed in the intermediate region 303M, the vapor of the coolant flows backward as indicated by arrow wr and reaches the upstream region 303U. In that case, the vapor of the coolant is less likely to be smoothly discharged from the discharge unit 303b.

In this regard, as shown in FIG. 46, in the component cooling device 301 of the eighteenth embodiment, the fluid diode unit 332 can prevent the vapor of the coolant from flowing to the upstream region 303U. Thus, the vapor is discharged from the discharge unit 303b to achieve a smooth flow of liquid coolant.

Nineteenth Embodiment

Figure 48:
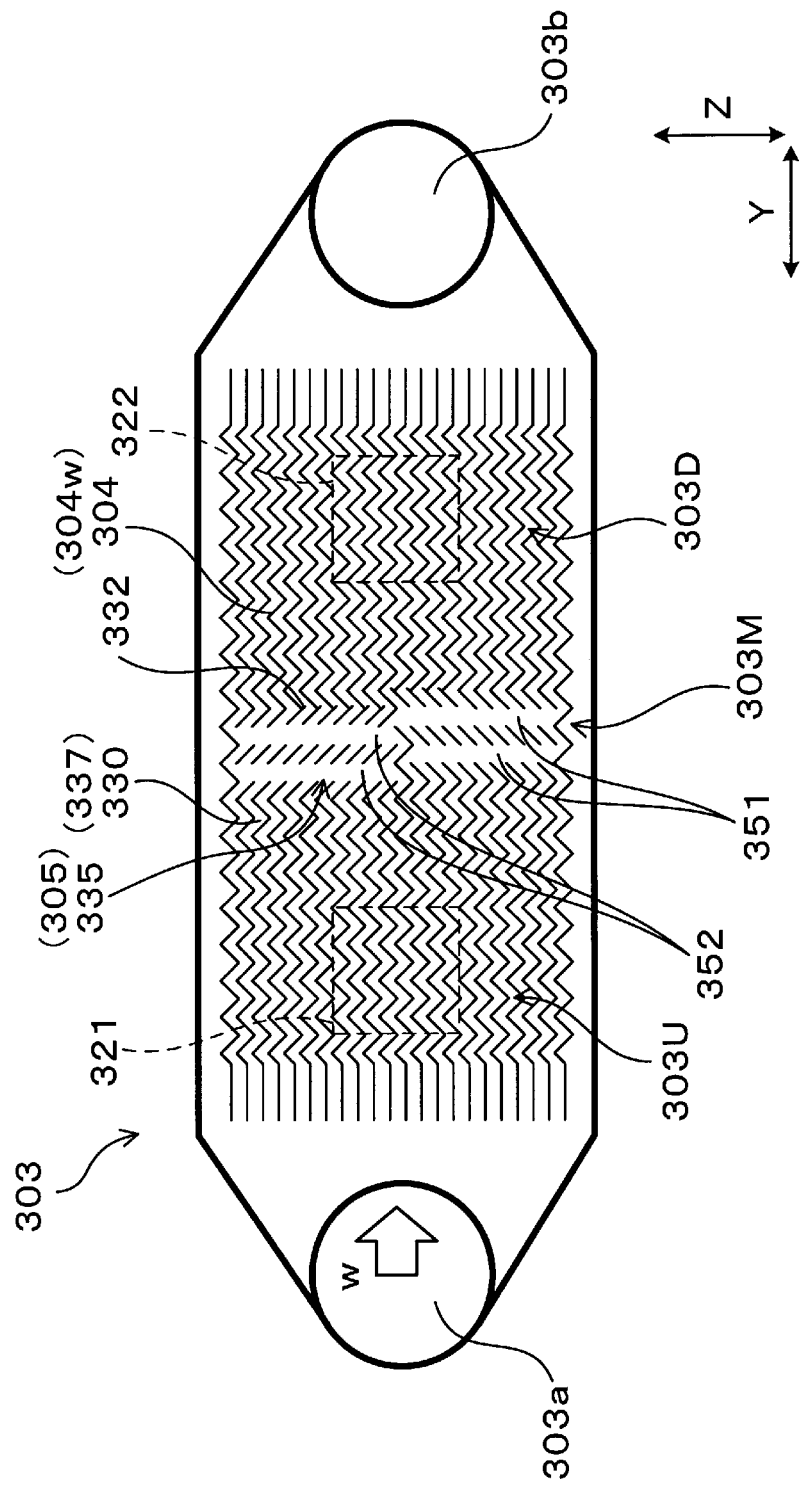
FIG. 48 is an explanatory plan view of a cooling pipe of a nineteenth embodiment.
Figure 49:
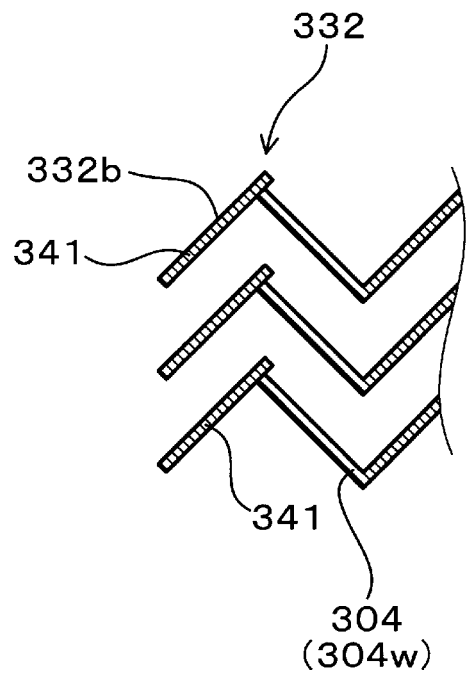
FIG. 49 is an enlarged explanatory view of a fluid diode unit of the nineteenth embodiment.

As shown in FIGS. 48 and 49, the present embodiment is an embodiment in which the component cooling device 301 is provided with the fluid diode unit 332 formed at a part of a wave fin 304W as the internal fin 304.

In the present embodiment, as shown in FIG. 48, the wave fin 304W is arranged in the coolant channel 330. The wave fin 304W has a corrugated shape whose inclination direction with respect to the channel direction (i.e., Y direction) is alternately changed when viewed from the normal direction (i.e., X direction) of the cooling surface 331. The fluid diode unit 332 is formed at a part of the wave fin 304W.

Specifically, as shown in FIG. 49, the fluid diode unit 332 is formed at a part of a portion of the wave fin 304W at which the inclination direction with respect to the Y direction is reversed. Thus, the fluid diode unit 332 is formed by deforming a part of the wave fin 304W.

The part of the wave fin 304W at which the fluid diode unit 332 is formed is also the inclined fin 341 that is inclined with respect to the Y direction. The fluid diode unit 332 is formed of a protruding downstream end of the inclined fin 341. Also in the present embodiment, as shown in FIG. 48, the fluid diode unit 332 is formed at a part in the Z direction of the coolant channel 330. Specifically, the fluid diode unit 332 is formed in the vicinity of the center portion in the Z direction and is not formed at the outer portion in the Z direction.

In the present embodiment, the cooling pipe 303 is arranged so that the width direction orthogonal to both the channel direction of the coolant channel 330 and the normal direction of the cooling surface 331 is a vertical direction (i.e., direction of gravity). That is, the cooling pipe 303 is arranged so that the Z direction is the vertical direction. The coolant channel 330 has a vertical communication portion 335 in the intermediate region 303M. The vertical communication portion 335 communicates in the vertical direction from below a center of the first electronic component 321 to above an upper end of the second electronic component 322.

The width direction (i.e., Z direction) of the coolant channel 330 may be slightly inclined with respect to the vertical direction. The vertical communication portion 335 also does not necessarily need to be parallel to the vertical direction, and is allowed to be slightly inclined with respect to the vertical direction as long as the vertical communication portion 335 has a function described later.

In the present embodiment, the vertical communication portion 335 is formed by cutting off a part of the internal fin 304. Specifically, in the present embodiment, the wave fin 304W which is the internal fin 304 is continuously formed in a region including the upstream region 303U, the intermediate region 303M, and the downstream region 303D. A part of the wave fin 304W is broken by a plurality of communication spaces 351 and a plurality of communication spaces 352 communicating with each other in the vertical direction provided in the intermediate region 303M.

The vertical communication portion 335 has two communication spaces 351 formed on a lower side in the vertical direction and two communication spaces 352 formed on an upper side in the vertical direction. The communication spaces 351 and the communication spaces 352 are formed to be deviated from each other in the Y direction. However, the communication spaces 351 and the communication spaces 352 are connected to each other through the channel along the wave fin 304W. As a result, the lower communication spaces 351 and the upper communication spaces 352 communicate with each other.

A lower end of the lower communication space 351 is arranged at least below the center of the first electronic component 321, and an upper end of the upper communication space 352 is arranged at least above the upper end of the second electronic component 322. Thus, the vertical communication portion 335 composed of the communication spaces 351, 352 communicates in the vertical direction from below the center of the first electronic component 321 to above the upper end of the second electronic component 322.

The fluid diode unit 332 is formed on the downstream side of the vertical communication portion 335.

In particular, in the present embodiment, the inclined fin 341 is formed adjacent to a downstream end of the vertical communication portion 335. The fluid diode unit 332 is formed in the vicinity of the downstream end of the inclined fin 341. A main surface on the upstream side of the inclined fin 341 is the guide surface 332b.

In the present embodiment, the vertical communication portion 335 also functions as the diffusion unit 305. Specifically, in the component cooling device 301 of the present embodiment, only in the intermediate region 303M among the upstream region 303U, the intermediate region 303M, and the downstream region 303D, the internal fin 304 is provided with the diffusion unit 305 through which adjacent branch channels 337 communicate with each other.

The rest of the configuration is the same as in the seventeenth embodiment.

In the present embodiment, since the internal fin 304 has the wave fin 304W, the heat transfer area with the coolant can be increased, thereby improving the cooling performance. The fluid diode unit 332 is formed at a part of the wave fin 304W. Thus, the fluid diode unit 332 can be provided by using the corrugated shape of the wave fin 304W and deforming a part of the wave fin 304W. Therefore, the fluid diode unit 332 can be easily formed at low cost.

The vertical communication portion 335 allows the evaporated coolant to move above the second electronic component 322. Specifically, for example, when the coolant heated by the first electronic component 321 is evaporated to be gas bubbles and the gas bubbles reach the intermediate region 303M, the gas bubbles move upward through the vertical communication portion 335. Accordingly, even when the gas bubbles flow to the downstream region 303D, the gas bubbles pass through the upper side of the second electronic component 322. Thus, deterioration of the coolability for the second electronic component 322 due to the gas bubbles can be prevented.

The fluid diode unit 332 is formed on the downstream side of the vertical communication portion 335. Thus, some of the gas bubbles leaking from the fluid diode unit 332 toward the upstream side of the fluid diode unit 332 can move above the second electronic component 322 through the vertical communication portion 335.

The vertical communication portion 335 also functions as the diffusion unit 305. Thus, the cooling performance can be effectively improved by an advantageous effect that is the same as an advantageous effect described in detail in the thirty-third embodiment described later.

Other than this, the present embodiment has the same functions and effects as in the eighteenth embodiment.

Figure 50:
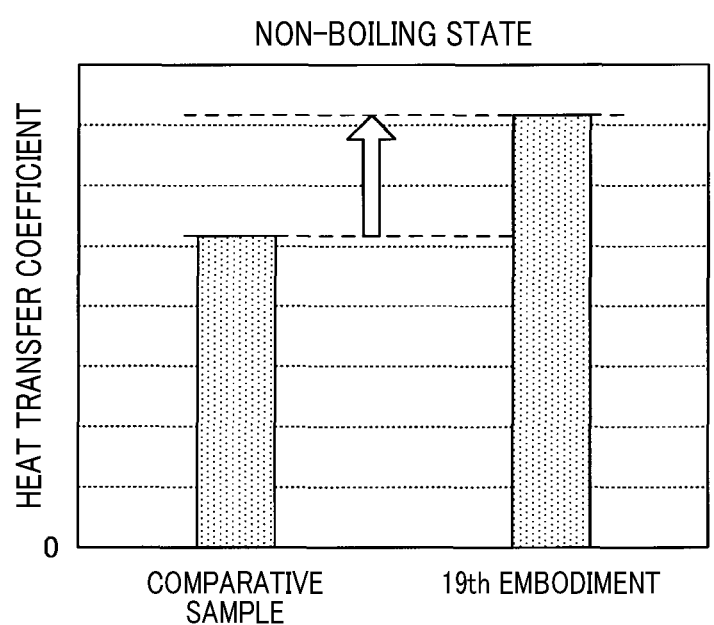
FIG. 50 is a diagram showing the results of an effect confirmation test in a non-boiling state for a heat exchanger according to the nineteenth embodiment.
Figure 51:
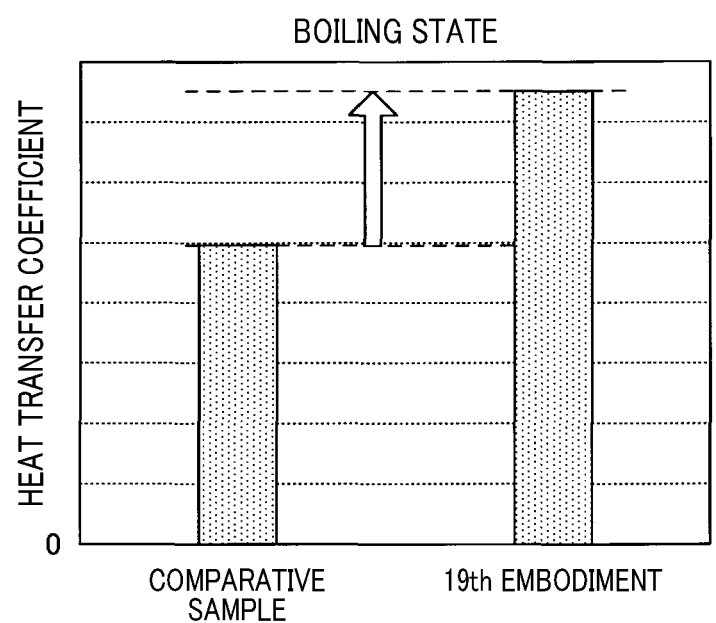
FIG. 51 is a diagram showing the results of an effect confirmation test in a boiling state for the heat exchanger according to the nineteenth embodiment.
Figure 52:
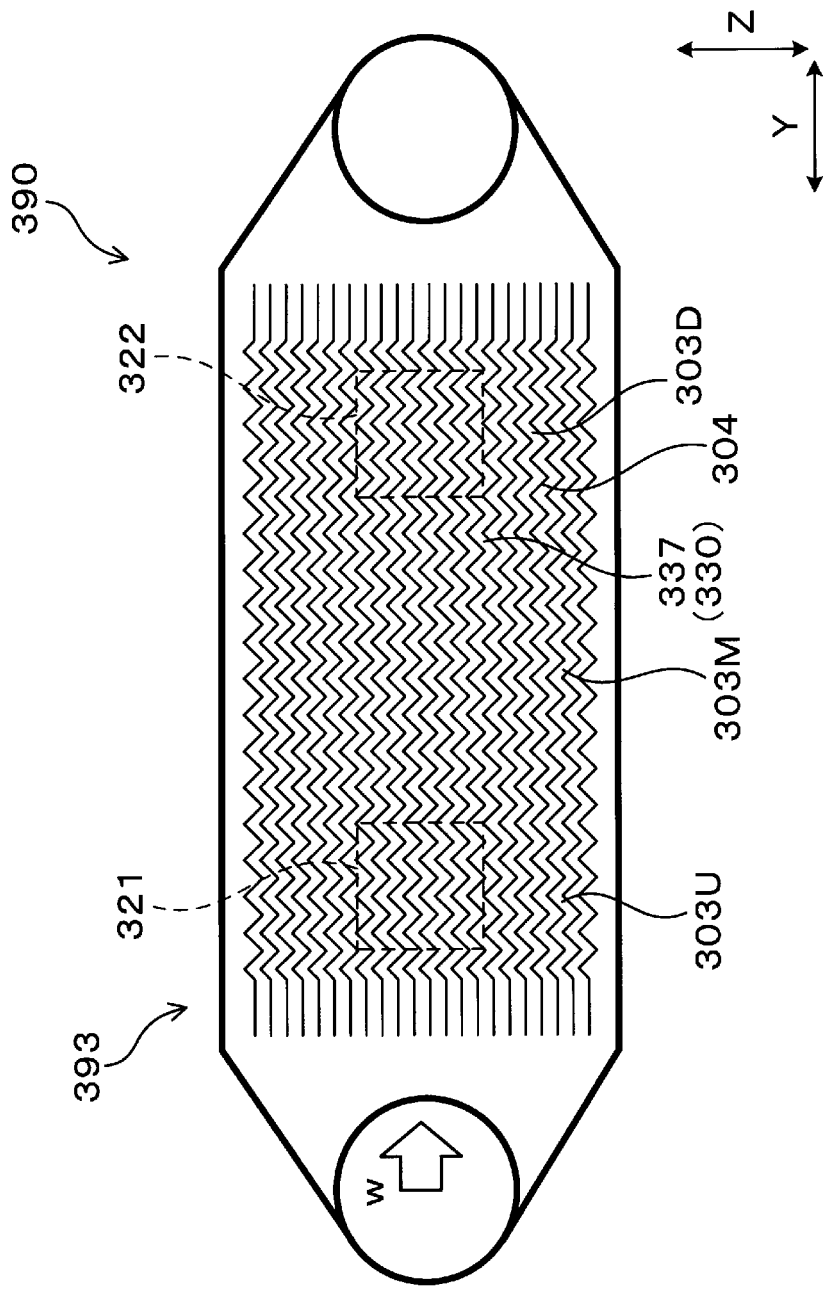
FIG. 52 is an explanatory plan view of a comparative sample for the effect confirmation test.

Next, FIGS. 50 and 51 show the results of an effect confirmation test using the component cooling device 301 of the nineteenth embodiment. Specifically, a heat transfer coefficient from the second electronic component 322 to the coolant has been analyzed both in a non-boiling state and in a boiling state of the coolant. As comparison, the heat transfer coefficient has also been analyzed in a component cooling device 390 (i.e., comparative sample) including a cooling pipe 393 provided with no fluid diode unit or no diffusion unit (i.e., vertical communication portion) as shown in FIG. 52.

In the analysis of the heat transfer coefficient, a flow rate of the coolant at a position facing the second electronic component 322 has been calculated by simulation. Then, the heat transfer coefficient has been calculated from a relationship between the flow rate of the coolant and the heat transfer coefficient acquired in advance by using an actual device.

FIG. 50 shows the heat transfer coefficient from the second electronic component 322 to the coolant in the non-boiling state. FIG. 51 shows the heat transfer coefficient from the second electronic component 322 to the coolant in the boiling state. FIGS. 50 and 51 show side by side the results of both the comparative sample and the sample of the nineteenth embodiment.

As shown in FIGS. 50 and 51, in both the non-boiling state and the boiling state, the use of the component cooling device 301 of the nineteenth embodiment increases the heat transfer coefficient of the second electronic component 322. In particular, in the boiling state, as shown in FIG. 51, the heat transfer coefficient of the component cooling device 301 of the nineteenth embodiment is higher by approximately 50 percent than the heat transfer coefficient of the comparative sample.

The above results have been obtained presumably because in the non-boiling state, particularly due to the guide surface 332b, the liquid coolant flowing toward the downstream region 303D is easily collected in the vicinity of the center in the Z direction of the coolant channel 330, leading to the increase in the flow rate of the coolant that exchanges heat with the second electronic component 322.

The above results have been obtained presumably because in the boiling region, due to the fluid diode unit 332, the coolant is prevented from flowing backward from the downstream region 303D to the upstream region 303U, leading to the increase in the amount of coolant introduced in the vicinity of the center in the Z direction of the downstream region 303D.

Twentieth Embodiment

Figure 53:
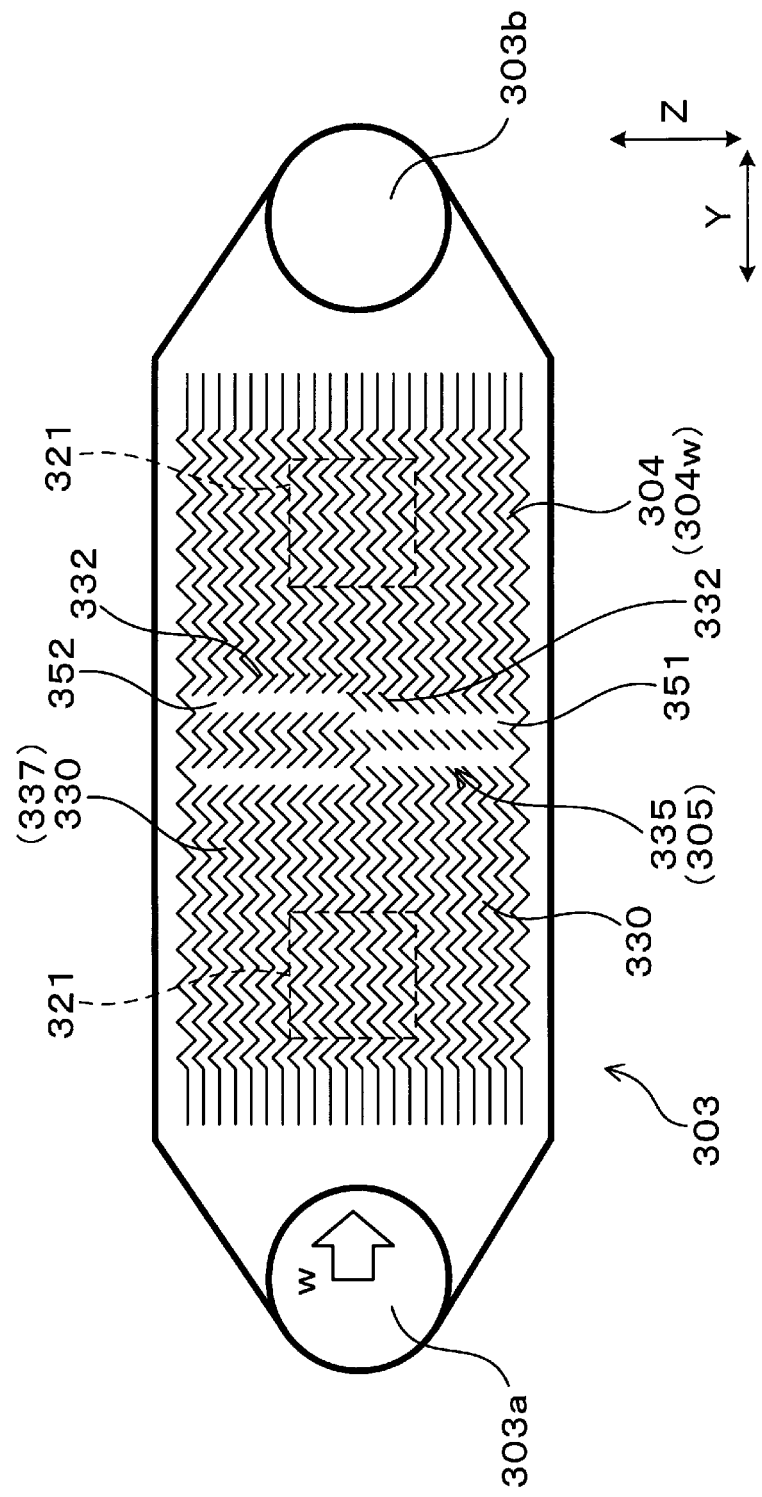
FIG. 53 is an explanatory plan view of a cooling pipe of a twentieth embodiment.

As shown in FIG. 53, the present embodiment is an embodiment obtained by changing the arrangement of the vertical communication portion 335 of the nineteenth embodiment.

Specifically, one of the upper communication spaces 352 is arranged on the downstream side in the Y direction of the lower communication spaces 351.

The fluid diode unit 332 located on the downstream side of the upper communication space 352 is arranged at a position on the downstream side in the Y direction of the fluid diode unit 332 located on the downstream side of the lower communication space 351.

Other than this, the present embodiment has the same configuration and functions and effects as in the nineteenth embodiment.

Twenty-first Embodiment

Figure 54:
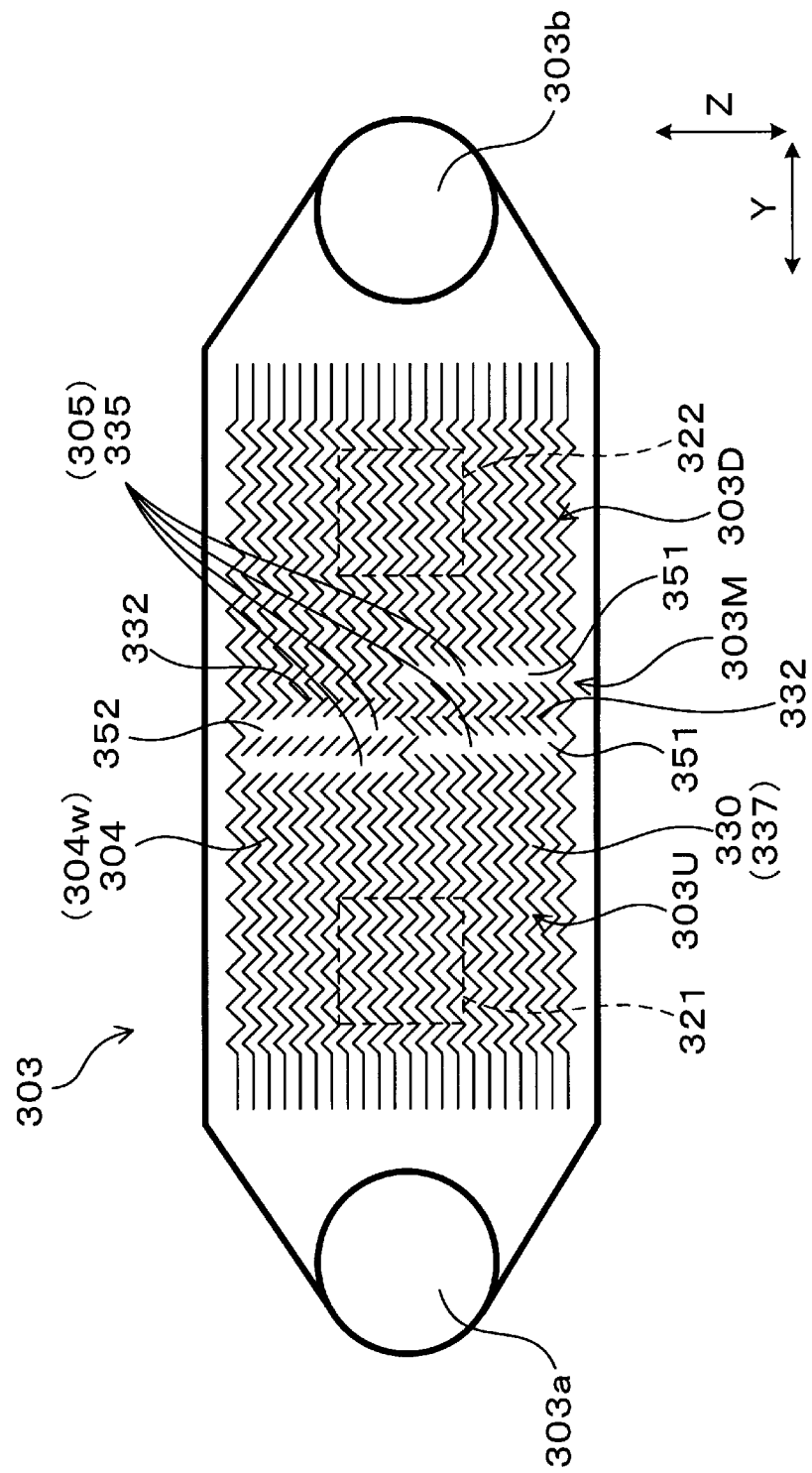
FIG. 54 is an explanatory plan view of a cooling pipe of a twenty-first embodiment.

As shown in FIG. 54, the present embodiment is an embodiment obtained by changing the positional relationship between the vertical communication portion 335 and the fluid diode unit 332 of the nineteenth embodiment.

Specifically, the fluid diode unit 332 on the lower side is arranged between the two lower communication spaces 351.

Other than this, the present embodiment has the same configuration and functions and effects as in the nineteenth embodiment.

Twenty-second Embodiment

Figure 55:
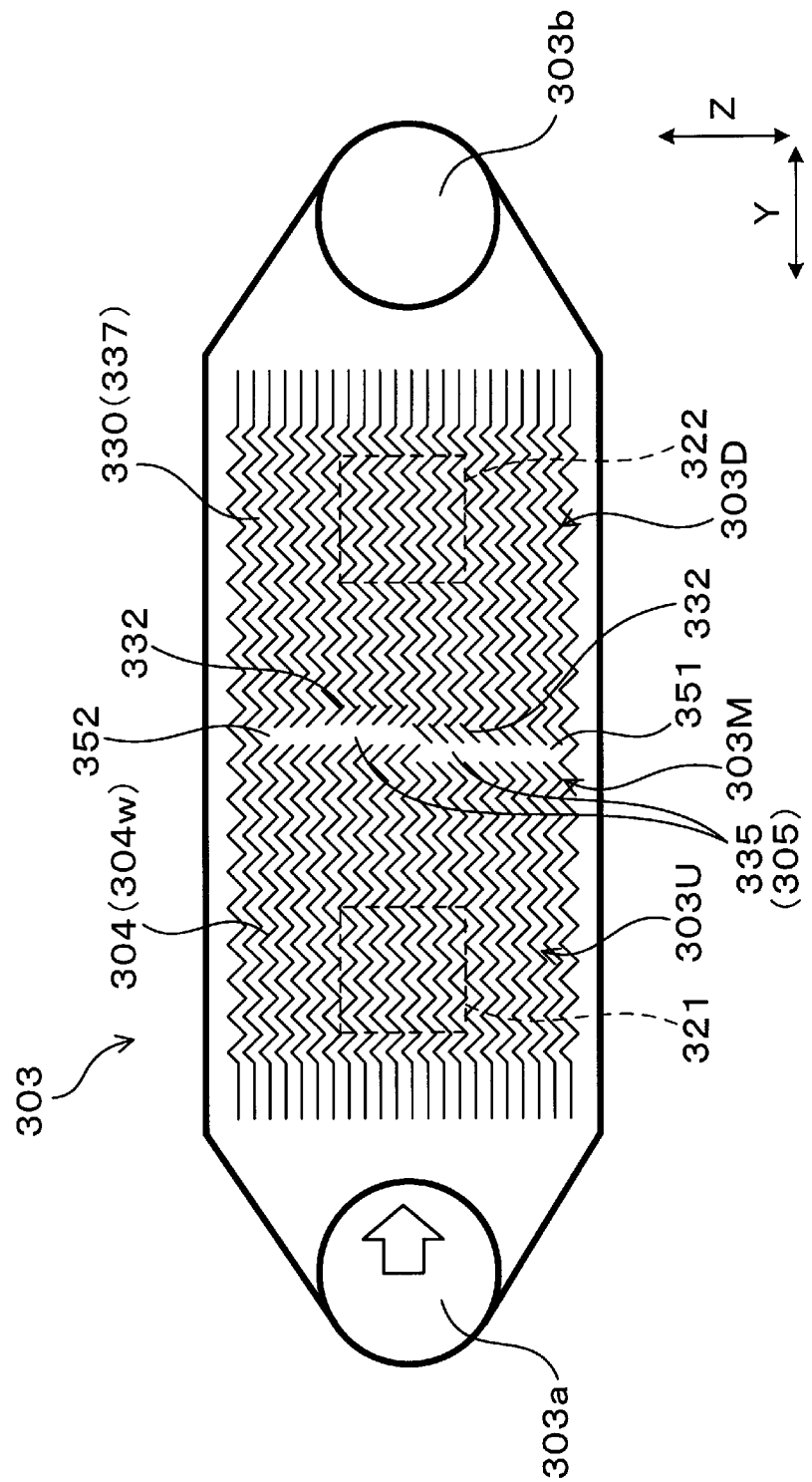
FIG. 55 is an explanatory plan view of a cooling pipe of a twenty-second embodiment.

As shown in FIG. 55, the present embodiment is an embodiment in which the vertical communication portion 335 is formed of a single lower communication space 351 and a single upper communication space 352. In the present embodiment, the lower communication space 351 is arranged on the upstream side in the Y direction of the upper communication space 352. The fluid diode unit 332 on the lower side is arranged on the upstream side of the fluid diode unit 332 on the upper side.

The rest of the configuration is the same as in the nineteenth embodiment.

In the present embodiment, the heat transfer area of the internal fin 304 is larger than in the nineteenth embodiment.

Other than this, the present embodiment has the same functions and effects as in the nineteenth embodiment.

Twenty-third Embodiment

Figure 56:
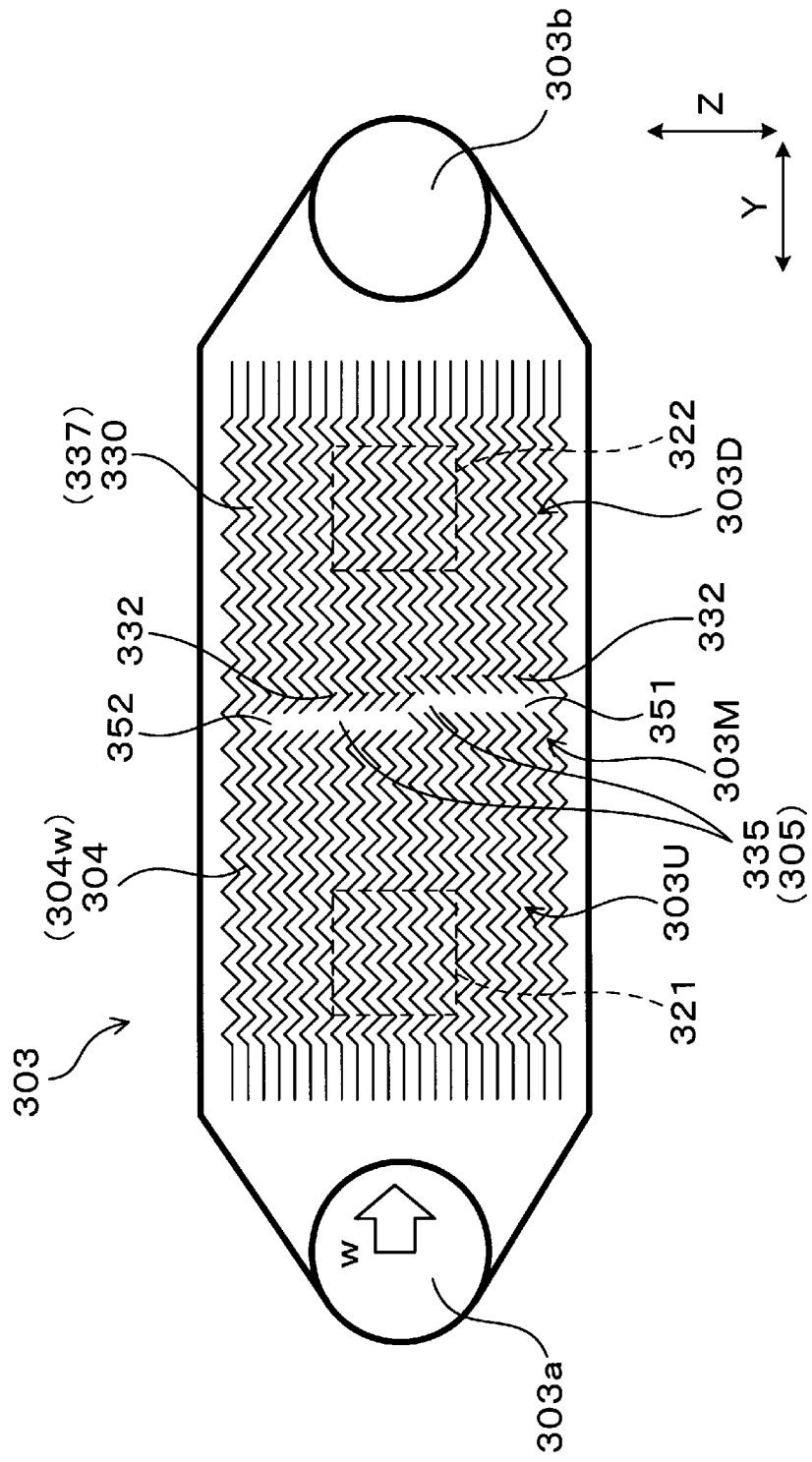
FIG. 56 is an explanatory plan view of a cooling pipe of a twenty-third embodiment.

As shown in FIG. 56, the present embodiment is also an embodiment in which the vertical communication portion 335 is formed of a single lower communication space 351 and a single upper communication space 352. In the present embodiment, the lower communication space 351 is arranged on the downstream side in the Y direction of the upper communication space 352. The fluid diode unit 332 on the lower side is arranged on the downstream side of the fluid diode unit 332 on the upper side.

Other than this, the present embodiment has the same configuration and functions and effects as in the nineteenth embodiment.

Twenty-fourth Embodiment

Figure 57:
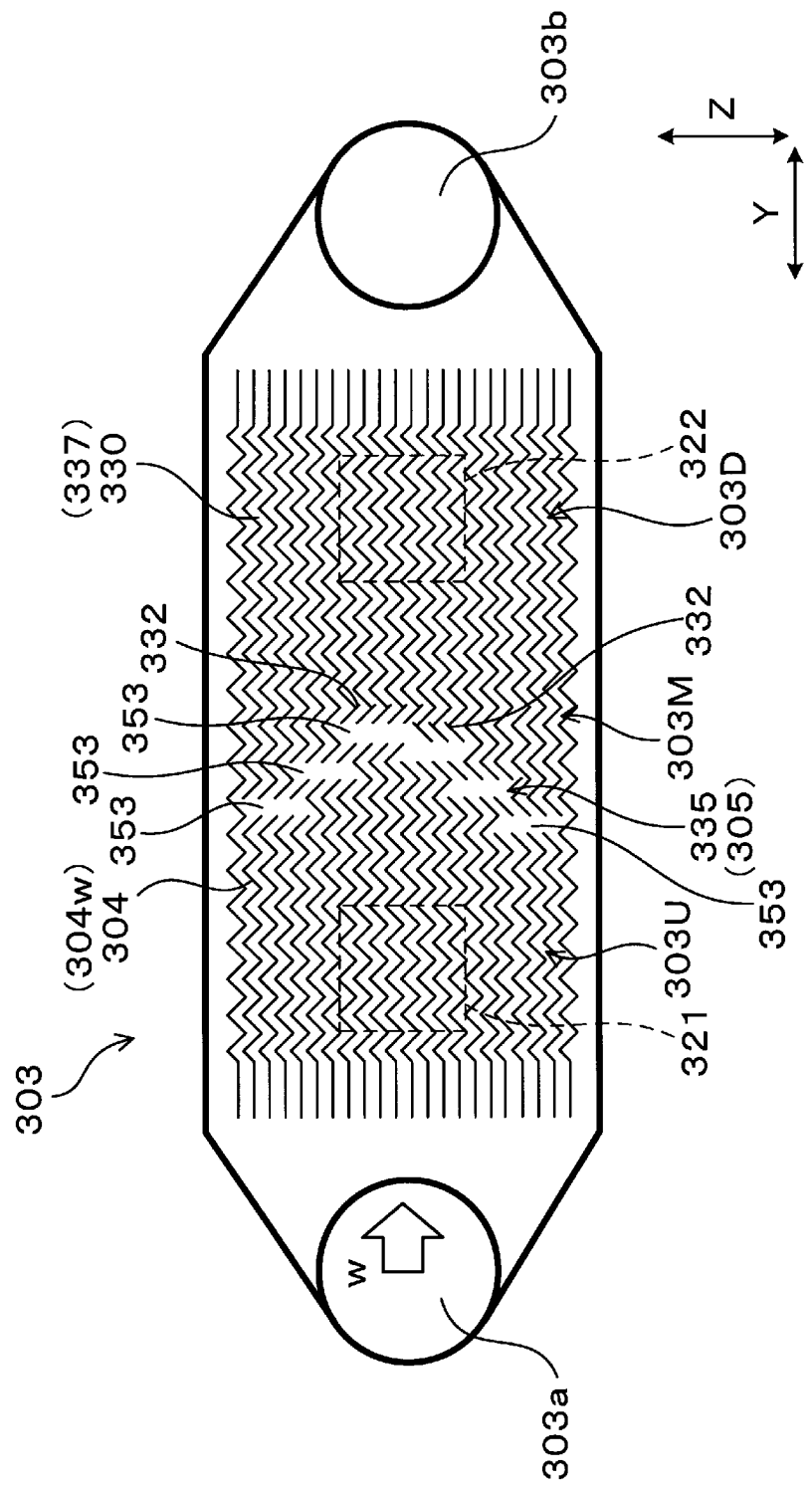
FIG. 57 is an explanatory plan view of a cooling pipe of a twenty-fourth embodiment.

As shown in FIG. 57, the present embodiment is an embodiment in which the vertical communication portion 335 is composed of six communication spaces 353 located at different positions in the Z direction.

The six communication spaces 353 are arranged so that the communication space 353 closer to the center portion in the Z direction is located closer to the downstream side in the Y direction. The fluid diode unit 332 is formed on the downstream side of each of the two communication spaces 353 arranged in the vicinity of the center in the Z direction.

Other than this, the present embodiment has the same configuration and functions and effects as in the nineteenth embodiment.

In the present embodiment, the number of communication spaces 353 is not particularly limited as long as the number of communication spaces 353 is three or more.

Twenty-fifth Embodiment

Figure 58:
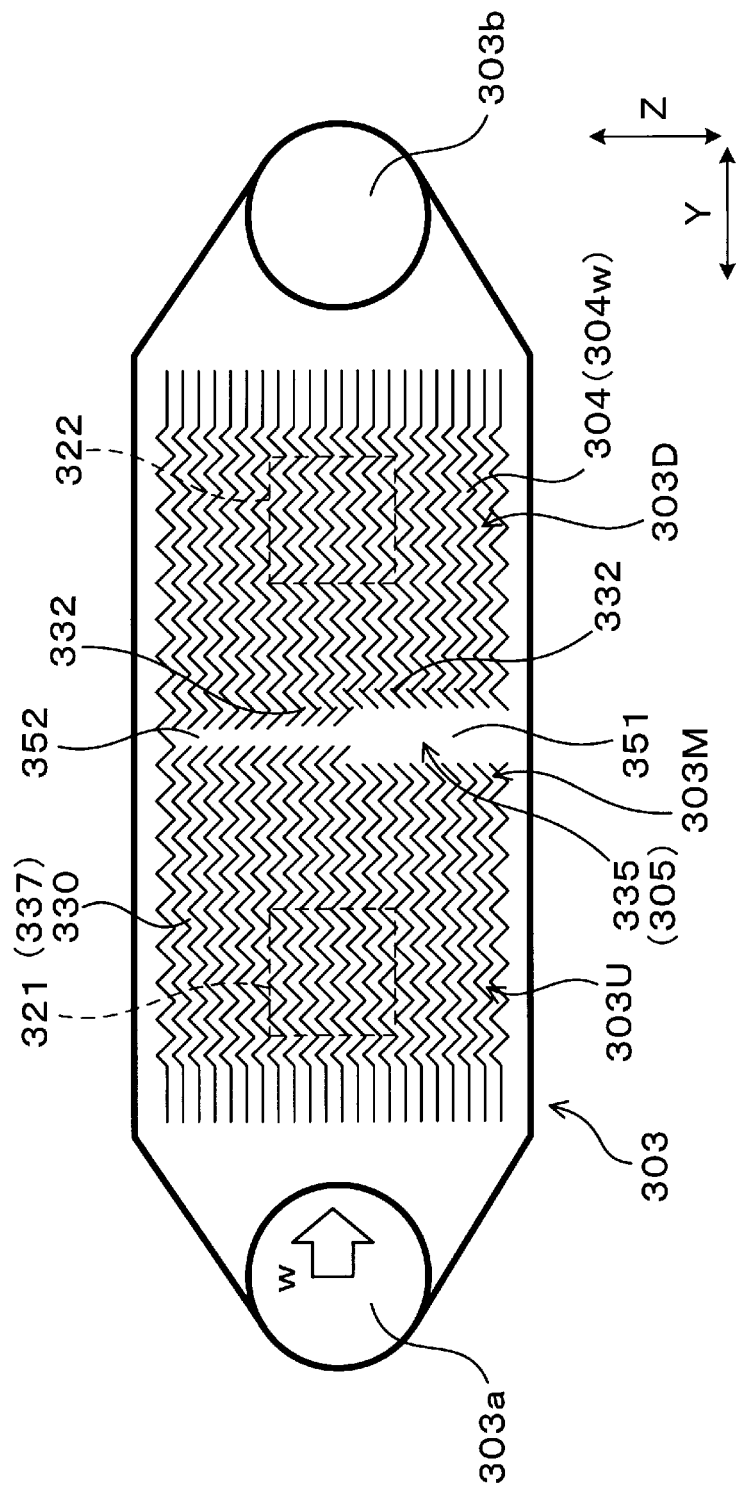
FIG. 58 is an explanatory plan view of a cooling pipe of a twenty-fifth embodiment.

As shown in FIG. 58, the present embodiment is an embodiment in which the lower communication space 351 has a larger width in the Y direction than the upper communication space 352.

The upper communication space 352 is directly connected to the lower communication space 351. Furthermore, a center in the Y direction of the upper communication space 352 is located at substantially the same position as a center in the Y direction of the lower communication space 351.

Other than this, the present embodiment has the same configuration and functions and effects as in the nineteenth embodiment.

Twenty-Sixth Embodiment

Figure 59:
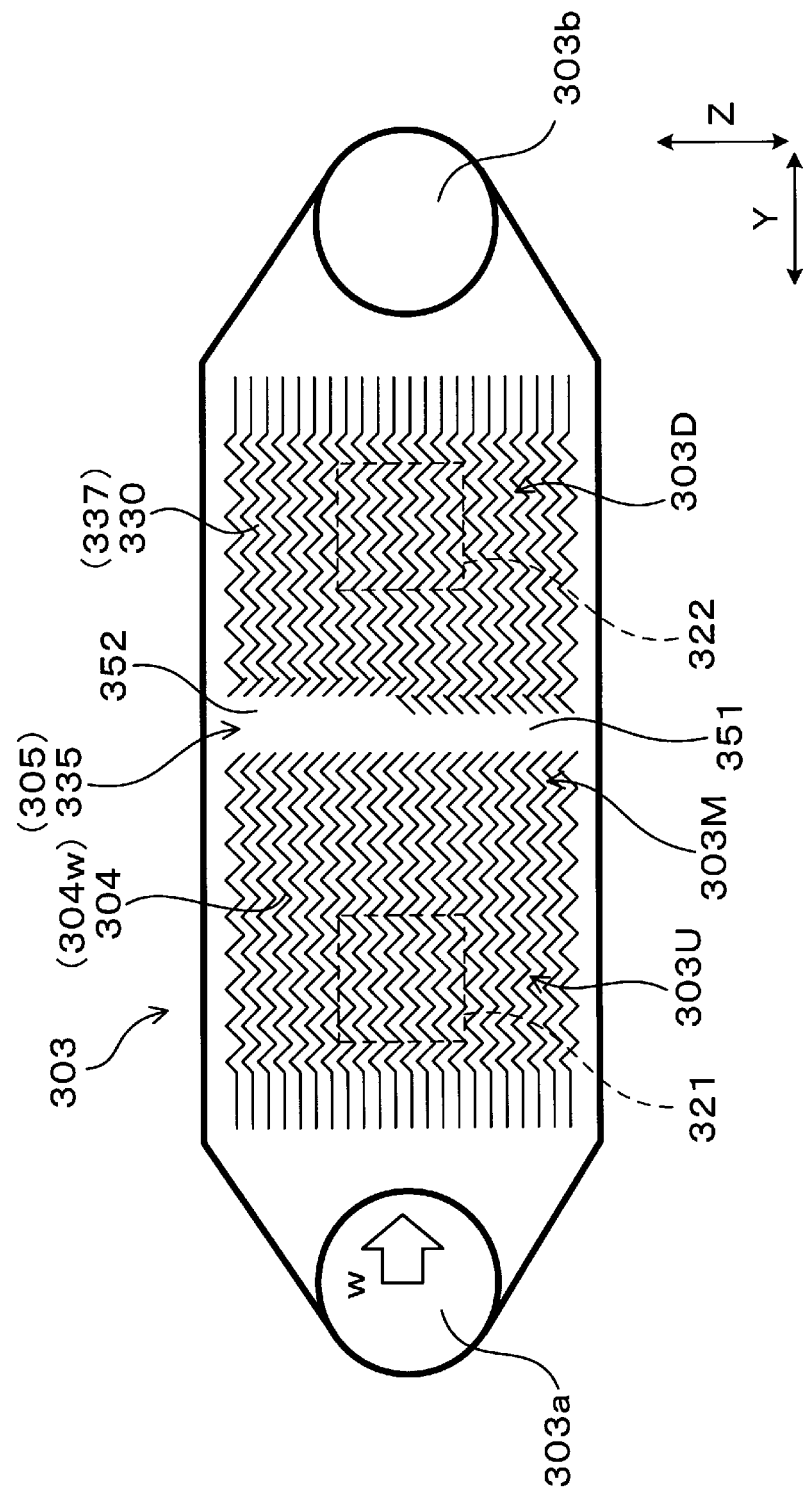
FIG. 59 is an explanatory plan view of a cooling pipe of a twenty-sixth embodiment.

As shown in FIG. 59, the present embodiment is an embodiment in which the upper communication space 352 has a larger width in the Y direction than the lower communication space 352.

The upper communication space 352 is directly connected to the lower communication space 351. Furthermore, an upstream end in the Y direction of the upper communication space 352 is located at substantially the same position as an upstream end in the Y direction of the lower communication space 351.

Other than this, the present embodiment has the same configuration and functions and effects as in a twenty-fifth embodiment.

Twenty-Seventh Embodiment

Figure 60:
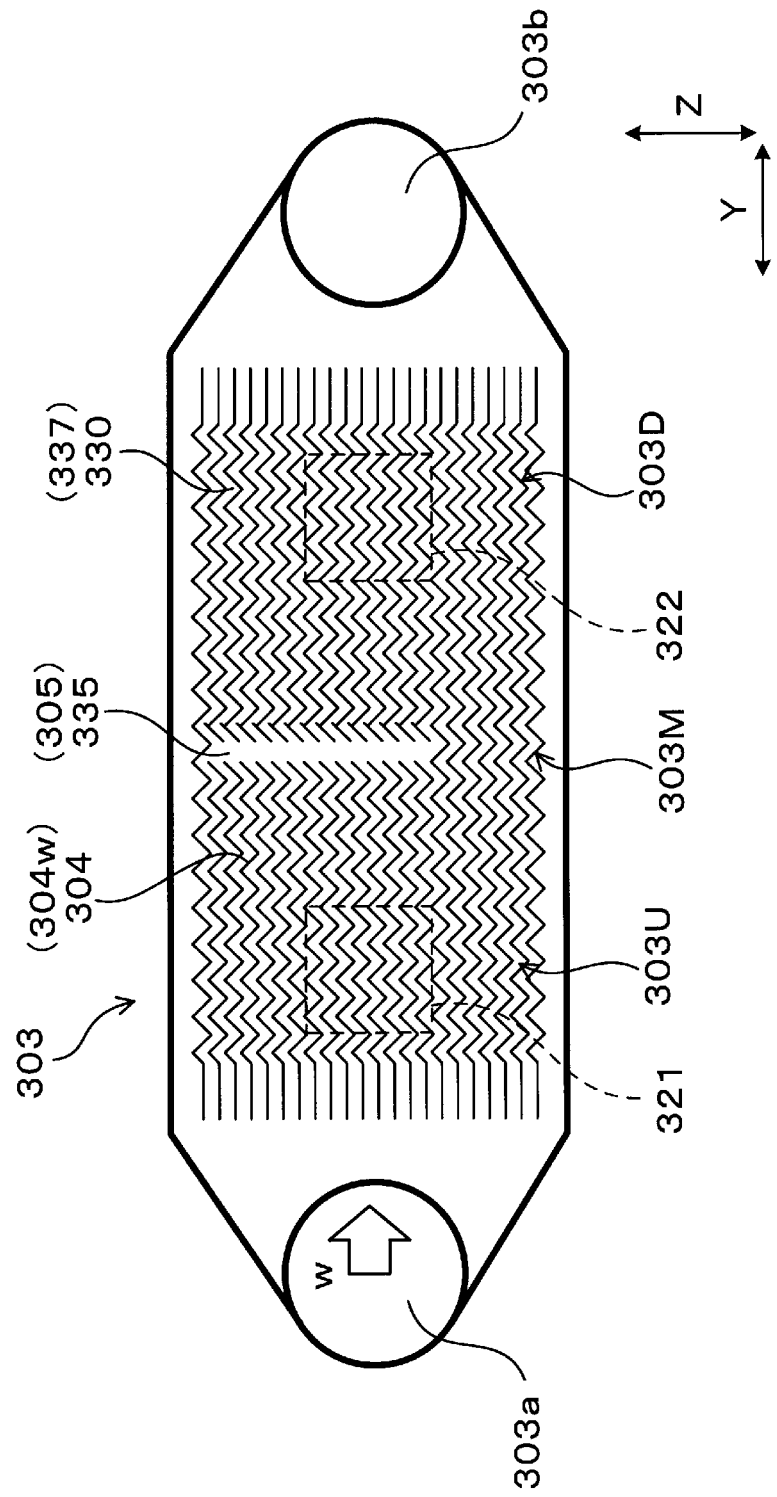
FIG. 60 is an explanatory plan view of a cooling pipe of a twenty-seventh embodiment.

As shown in FIG. 60, the present embodiment is an embodiment in which the vertical communication portion 335 is formed of a single communication space.

Specifically, the vertical communication portion 335 composed of the single communication space is linearly formed in the Z direction from below the center of the first electronic component 321 to above the upper end of the second electronic component 322. In particular, in the present embodiment, a lower end of the vertical communication portion 335 is arranged at a position of a lower end in the Z direction of the second electronic component 322.

The rest of the configuration is the same as in the nineteenth embodiment.

In the present embodiment, the vertical communication portion 335 can be simplified. Furthermore, the region from which the internal fin 304 is removed can be reduced. Thus, the gas bubbles can be easily released upward while the heat transfer area with the coolant is maintained to be large.

Other than this, the present embodiment has the same functions and effects as in the nineteenth embodiment.

Twenty-Eighth Embodiment

Figure 61:
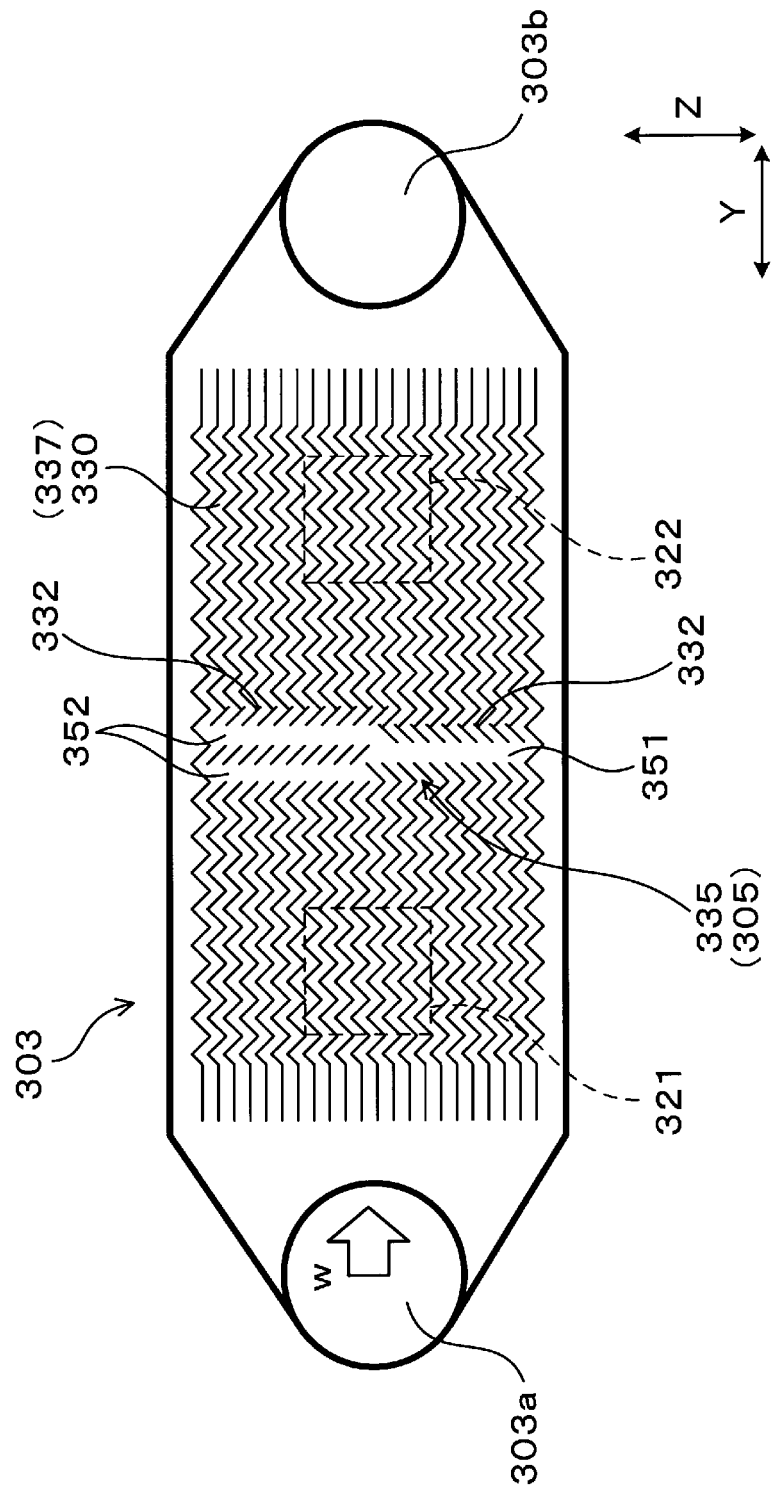
FIG. 61 is an explanatory plan view of a cooling pipe of a twenty-eighth embodiment.

As shown in FIG. 61, the present embodiment is an embodiment in which two upper communication spaces 352 and a single lower communication space 351 are provided.

With respect to the two communication spaces 352 arranged in the Y direction, the fluid diode unit 332 on the upper side is formed on the downstream side of the communication space 352 on the downstream side.

Other than this, the present embodiment has the same configuration and functions and effects as in the nineteenth embodiment.

Twenty-Ninth Embodiment

Figure 62:
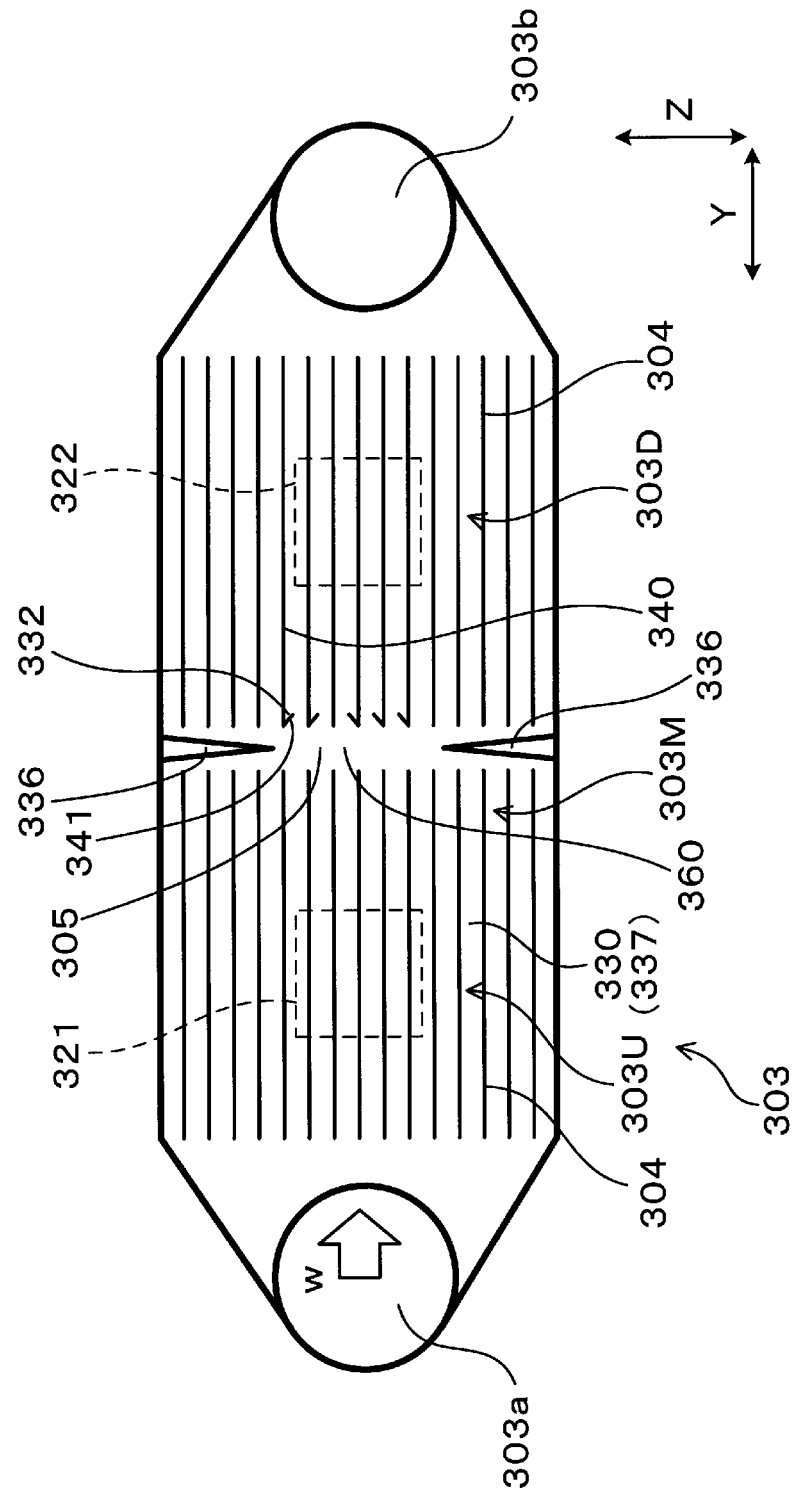
FIG. 62 is an explanatory plan view of a cooling pipe of a twenty-ninth embodiment.

As shown in FIG. 62, the present embodiment is an embodiment in which narrowed portions 336 are arranged at both end portions in the Z direction of the intermediate region 303M of the coolant channel 330.

Specifically, the pair of narrowed portions 336 protrude from both ends toward the center in the Z direction of the coolant channel 330. Between the pair of narrowed portions 336, a narrowed opening 360 through which the coolant channels 330 communicate with each other in the Y direction is formed. The narrowed opening 360 is formed at a position in the Z direction corresponding to the first electronic component 321 and the second electronic component 322.

The internal fin 304 is separately provided on the upstream side of the narrowed portions 336 and on the downstream side of the narrowed portions 336. The fluid diode unit 332 is formed at an upstream end of the internal fin 304 on the downstream side. The fluid diode unit 332 is formed in the range in the Z direction in which the narrowed opening 360 is formed.

The fluid diode unit 332 has the inclined fin 341. However, the inclined fin 341 of the component cooling device 301 of the present embodiment has a shorter length than the inclined fin 341 shown in the eighteenth embodiment (see FIGS. 44 and 45). In the present embodiment, an upstream end of the inclined fin 341 is connected to an upstream end of the fin body 340.

A space between the internal fin 304 on the upstream side and the internal fin 304 on the downstream side constitutes the diffusion unit 305 through which adjacent branch channels 337 communicate with each other.

The rest of the configuration is the same as in the eighteenth embodiment.

Figure 63:
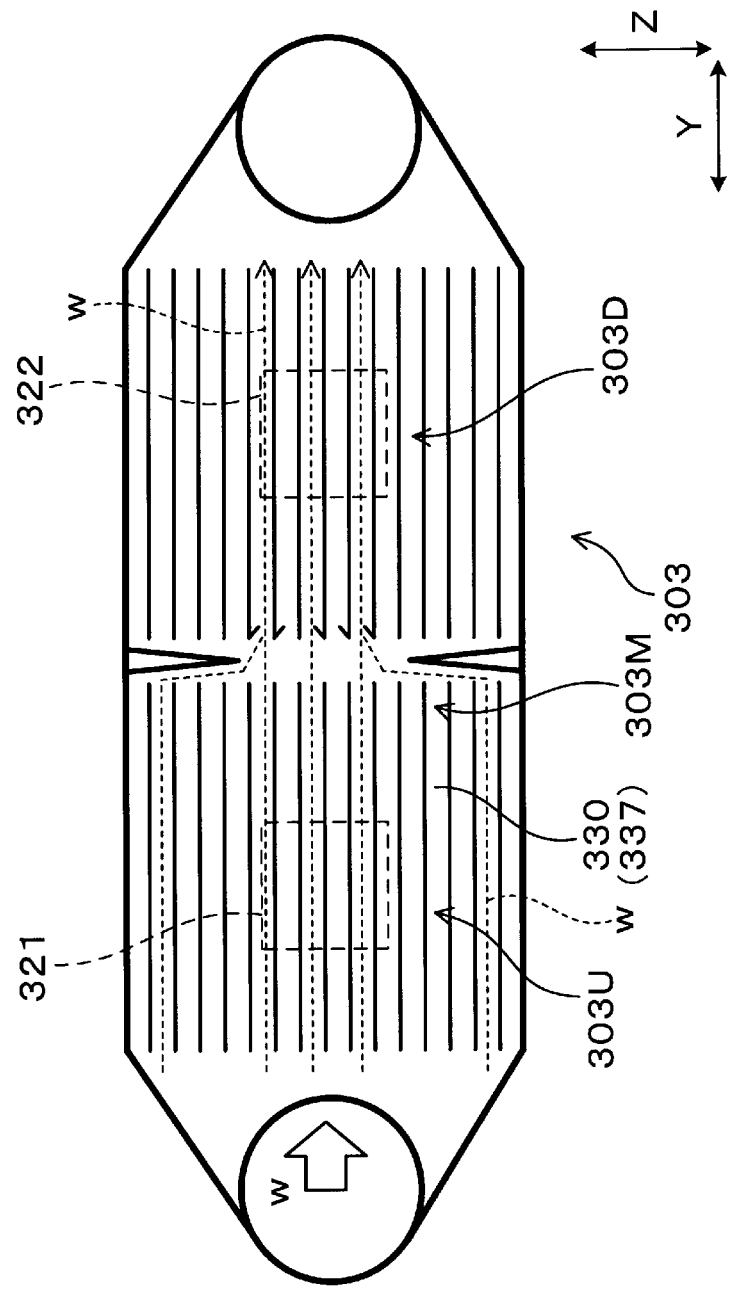
FIG. 63 is an explanatory plan view of a cooling pipe illustrating a flow of coolant of a twenty-ninth embodiment.

In the present embodiment, as shown in FIG. 63, a flow of coolant in the downstream region 303D can be concentrated in the vicinity of the center in the Z direction. Thus, it is possible to increase the flow rate of the coolant in the vicinity of the center in the Z direction in the downstream region 303D. Accordingly, the cooling performance for the second electronic component 322 can be improved.

Since the diffusion unit 305 is formed in the intermediate region 303M, the cooling performance can be effectively improved by an advantageous effect same as the advantageous effect described in detail in the thirty-third embodiment described later.

Other than this, the present embodiment has the same functions and effects as in the eighteenth embodiment.

Thirtieth Embodiment

Figure 64:
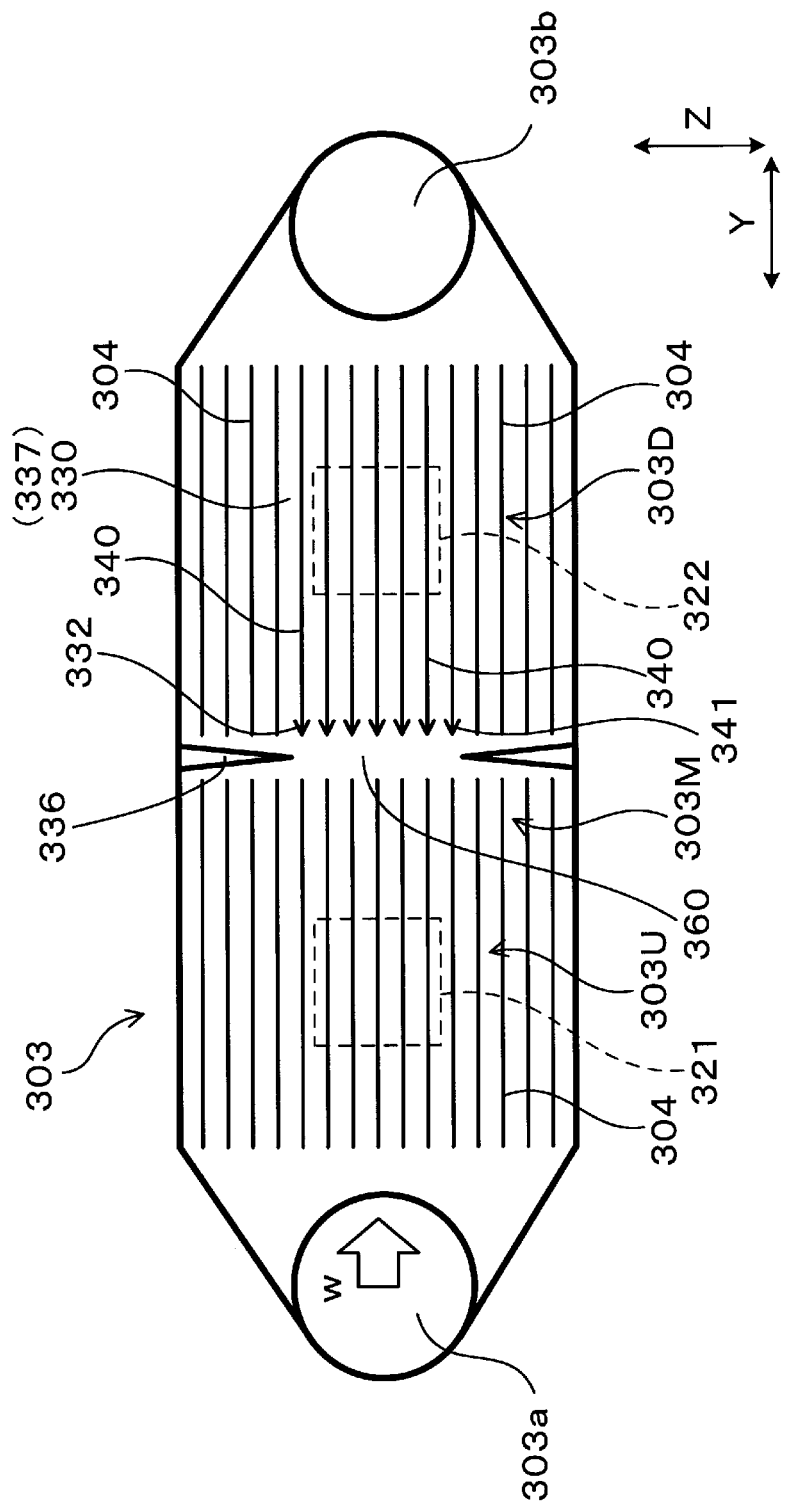
FIG. 64 is an explanatory plan view of a cooling pipe of a thirtieth embodiment.
Figure 65:
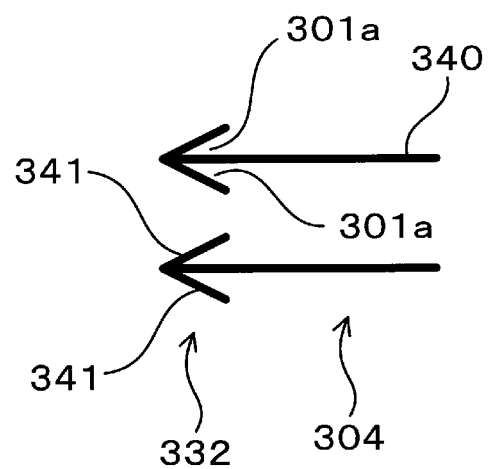
FIG. 65 is an enlarged explanatory view of a fluid diode unit of the thirtieth embodiment.

As shown in FIGS. 64 and 65, the present embodiment is an embodiment obtained by changing the shape of the fluid diode unit 332 of a twenty-ninth embodiment.

Specifically, in the present embodiment, the fluid diode unit 332 includes the inclined fins 341 on both sides in the Z direction of the upstream end of the fin body 340 of the internal fin 304. Thus, the acute-angled spaces 301a are provided on the both sides of the fin body 340.

The rest of the configuration is the same as in the seventeenth embodiment.

In the present embodiment, it is possible to increase the channel resistance in the direction from the downstream region 303D toward the upstream region 303U in the fluid diode unit 332. Thus, the evaporated coolant can be more effectively prevented from flowing backward from the downstream region 303D to the upstream region 303U.

Other than this, the present embodiment has the same functions and effects as in the seventeenth embodiment.

Thirty-First Embodiment

Figure 66:
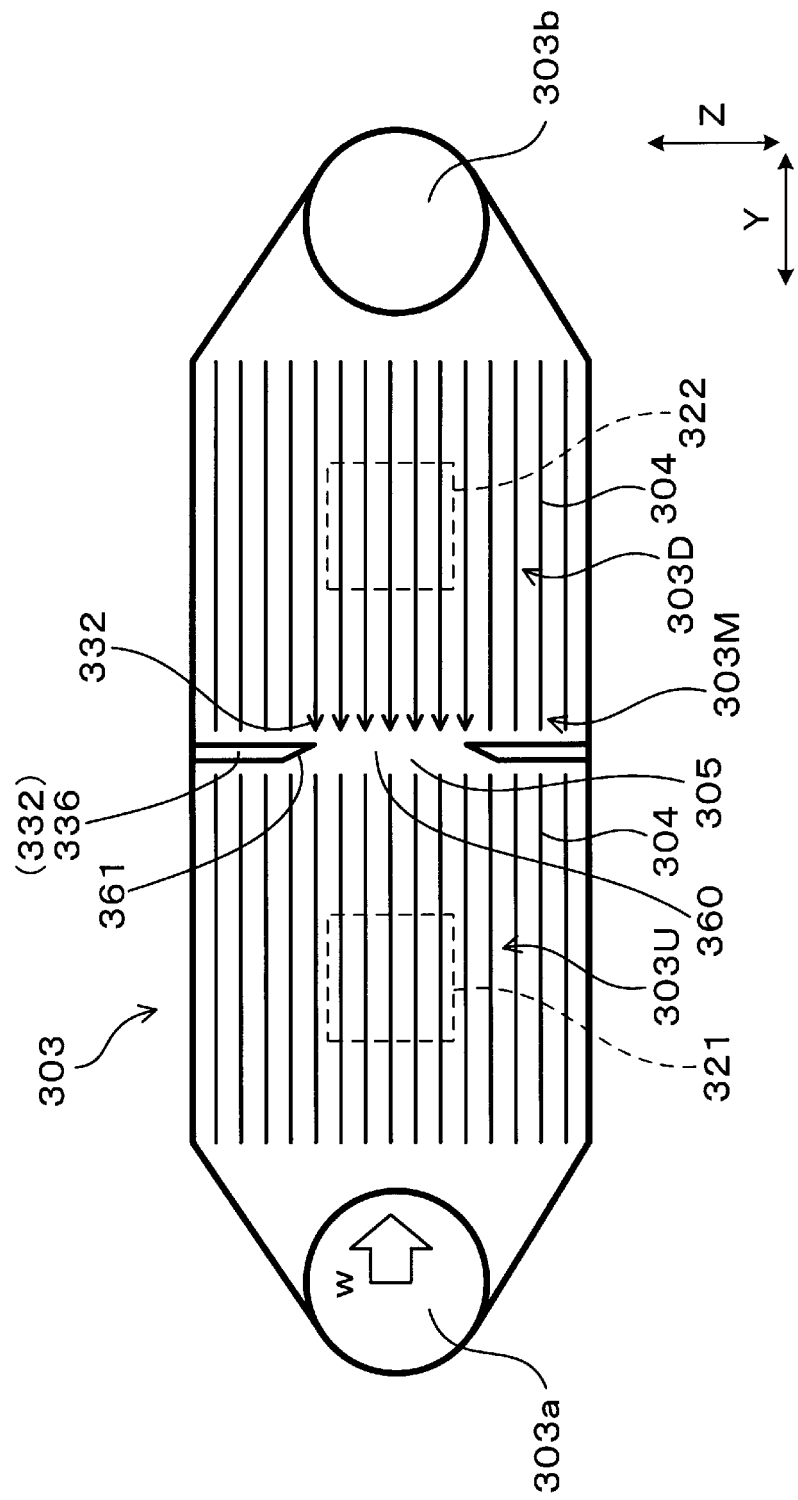
FIG. 66 is an explanatory plan view of a cooling pipe of a thirty-first embodiment.

As shown in FIG. 66, the present embodiment is an embodiment obtained by changing the shape of the narrowed portions 336 of a thirtieth embodiment. In the present embodiment, an inclined end surface 361 is provided at a protruding end in the Z direction of the narrowed portion 336. The inclined end surface 361 is inclined so that a part of the inclined end surface 361 closer to the downstream side in the Y direction is located closer to the center side in the Z direction.

The rest of the configuration is the same as in a thirtieth embodiment.

In the present embodiment, since the narrowed portions 336 have the inclined end surface 361, it is possible to achieve a smooth flow of coolant passing through the narrowed opening 360 toward the downstream side. Also the narrowed portions 336 allow the channel resistance in the direction from the downstream region 303D toward the upstream region 303U to be higher than the channel resistance in the direction from the upstream region 303U toward the downstream region 303D. Thus, the narrowed portions 336 can also function as the fluid diode unit 332.

Other than this, the present embodiment has the same functions and effects as in a thirtieth embodiment.

Thirty-Second Embodiment

Figure 67:
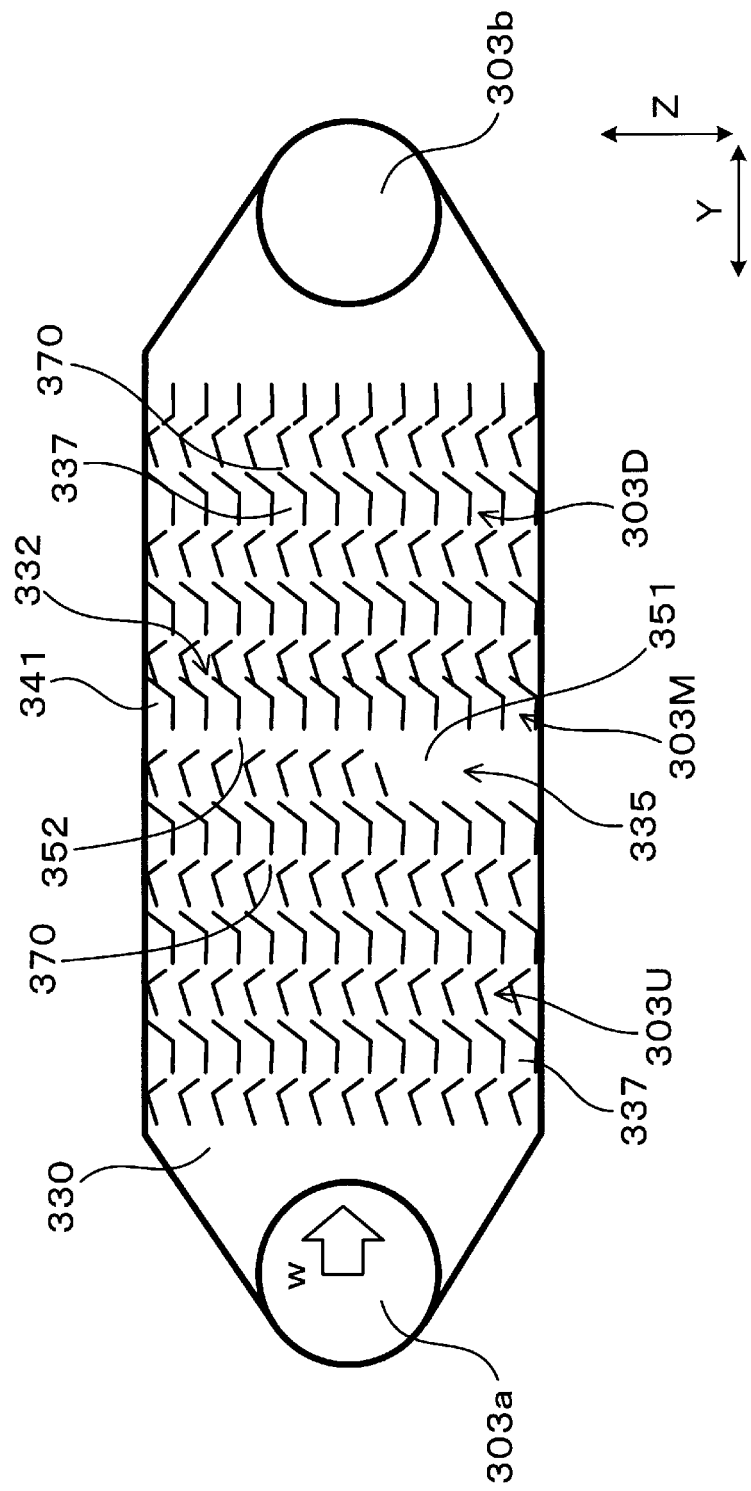
FIG. 67 is an explanatory plan view of a cooling pipe of a thirty-second embodiment.
Figure 68:
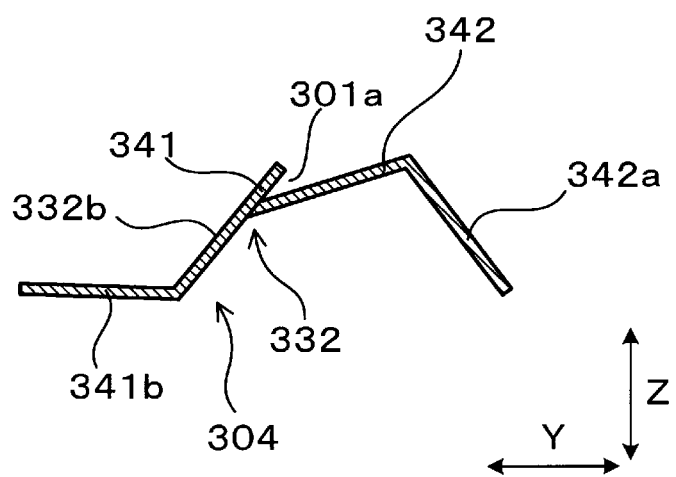
FIG. 68 is an enlarged explanatory view of a fluid diode unit of the thirty-second embodiment.

As shown in FIGS. 67 and 68, the present embodiment is an embodiment obtained by changing the shape of the internal fin 304 of a twenty-fifth embodiment.

In the present embodiment, as in a twenty-fifth embodiment, the vertical communication portion 335 is provided in the intermediate region 303M. The vertical communication portion 335 connects the lower communication space 351 to the upper communication space 352 in the Z direction. A downstream end of the lower communication space 351 is aligned with a downstream end of the upper communication space 352.

The fluid diode unit 332 is formed on the downstream side of the vertical communication portion 335. As shown in FIG. 68, the fluid diode unit 332 is composed of the inclined fin 341 and the connection fin 342. The connection fin 342 is inclined in the same direction as the inclined fin 341 with respect to the Y direction. However, an inclination angle of the connection fin 342 with respect to the Y direction is smaller than an inclination angle of the inclined fin 341 with respect to the Y direction. Thus, the acute-angled space 301a is formed between the inclined fin 341 and the connection fin 342.

A downstream end of the connection fin 342 has a downstream end fin 342a that is inclined in a direction opposite to the inclination direction of the connection fin 342. An upstream end of the inclined fin 341 has an upstream end fin 341b that is formed to extend in the Y direction.

Over the entire internal fin 304, a communication unit 370 through which the branch channels 337 communicate with each other is formed.

The rest of the configuration is the same as in a twenty-fifth embodiment.

In the present embodiment, the coolant is prevented from flowing backward and the coolant is easily distributed in the Z direction. Therefore, the coolability for the first electronic component 321 and the second electronic component 322 can be further improved easily.

Other than this, the present embodiment has the same functions and effects as in a twenty-fifth embodiment.

Thirty-Third Embodiment

Figure 69:
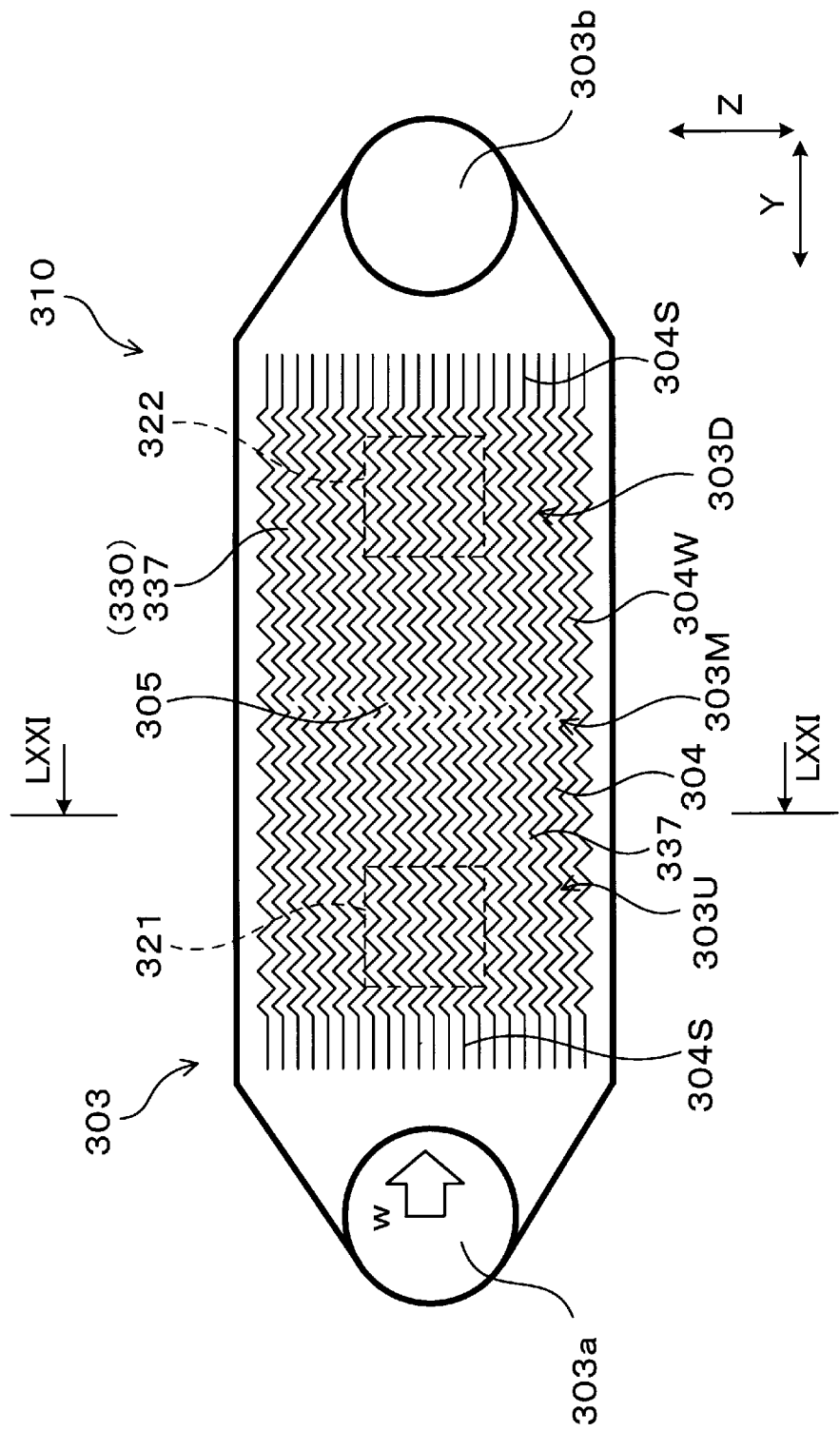
FIG. 69 is an explanatory plan view of a cooling pipe of a thirty-third embodiment.
Figure 70:
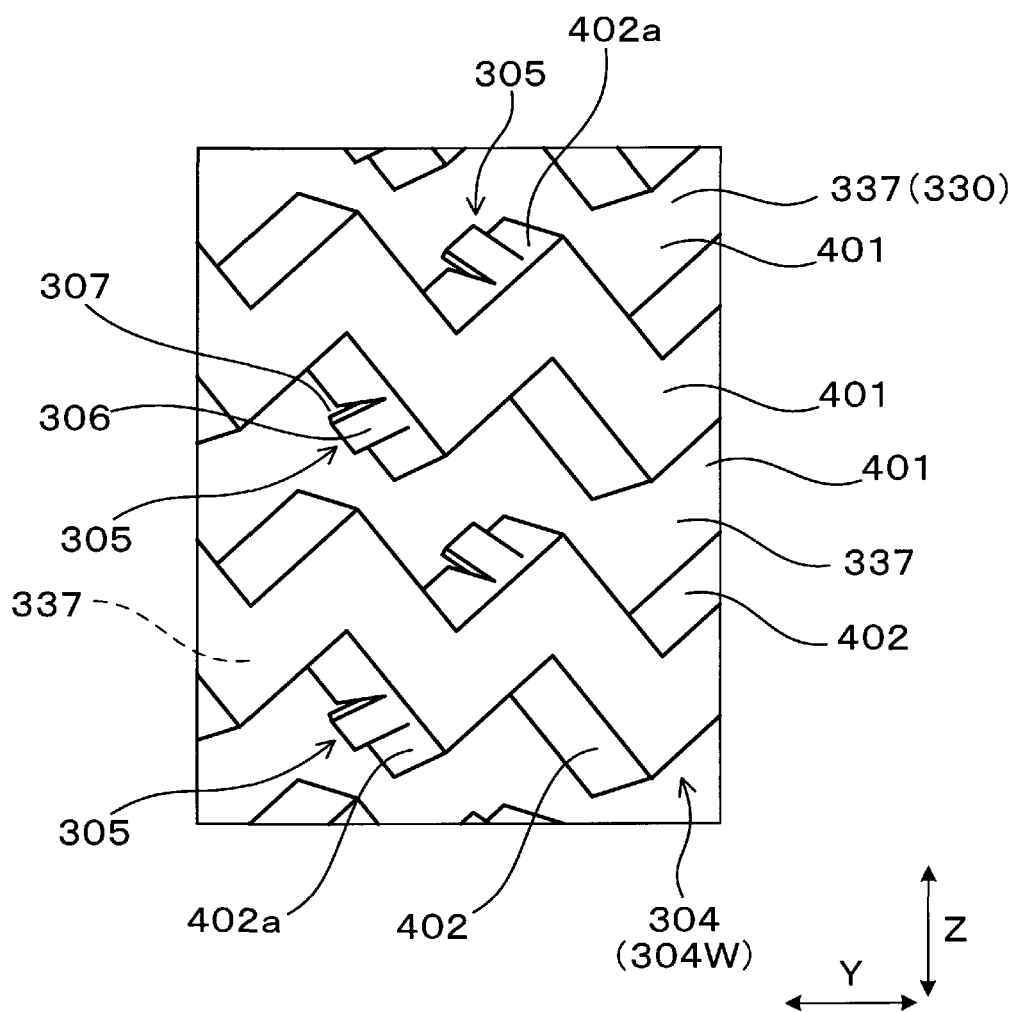
FIG. 70 is an explanatory perspective view of a diffusion unit of the thirty-third embodiment.

As shown in FIGS. 69 to 70, the present embodiment is an embodiment in which a component cooling device 310 as a heat exchanger is provided with the diffusion unit 305 described below at a specific part of the internal fin 304.

The cooling pipe 303 includes the internal fin 304 that partitions the coolant channel 330 into the plurality of branch channels 337 that extend parallel to each other in the channel direction Y.

As shown in FIG. 69, only in the intermediate region 303M among the upstream region 303U, the intermediate region 303M, and the downstream region 303D, the internal fin 304 is provided with the diffusion unit 305 through which adjacent branch channels communicate with each other.

The plurality of branch channels 337 that extend parallel to each other in the channel direction Y indicate the plurality of branch channels 337 formed in parallel to each other to extend in the channel direction Y as a whole, and the plurality of branch channels 337 may have a portion inclined with respect to the channel direction Y.

Figure 71:
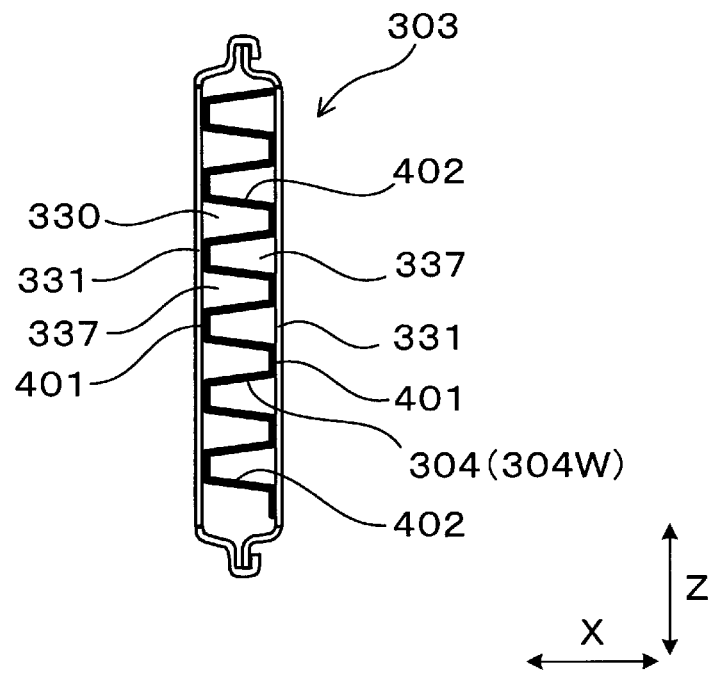
FIG. 71 is a cross-sectional view taken along line LXXI-LXXI in FIG. 69.

As shown in FIGS. 70 and 71, the internal fin 304 is made of a metal plate bent in a thickness direction, and has concave and convex portions in the X direction. In the present embodiment, as shown in FIG. 69, the internal fin 304 formed by bending a single metal plate is arranged in a region including the upstream region 303U, the intermediate region 303M, and the downstream region 303D.

The internal fin 304 has the corrugated wave fin 304W whose inclination direction with respect to the channel direction Y is alternately changed when viewed from the normal direction X of the cooling surface 331. The diffusion unit 305 is formed at a part of the wave fin 304W.

Thus, the wave fin 304W is formed at a part of the internal fin 304. The diffusion unit 305 is formed at a part of the wave fin 304W. In the present embodiment, the wave fin 304W is formed in the entire area of the upstream region 303U, the intermediate region 303M, and the downstream region 303D. On the upstream side and the downstream side of the wave fins 304W, straight fins 304S that are parallel to the Y direction are formed.

As shown in FIG. 70, the diffusion unit 305 has a projection 306 which is a part of the internal fin 304 projecting toward one of the branch channels 337.

In the present embodiment, a cut is made at a part of the metal plate constituting the internal fin 304, and the part of the metal plate is subjected to bending. Thus, at a part of the internal fin 304, the projection 306 is formed and an opening 307 is also formed.

More specifically, as shown in FIGS. 70 and 71, the internal fin 304 has a bottom wall portion 401 that is parallel to the Z direction and a side wall portion 402 that is erected in the Z direction. The bottom wall portion 401 and the side wall portion 402 are alternately continued in the Z direction to integrally form the internal fin 304. The side wall portion 402 is bent in a plate thickness direction to form the corrugated wave fin 304W. The branch channel 337 is formed between the side wall portions 402 adjacent to each other in the Z direction.

As shown in FIG. 70, the projection 306 of the diffusion unit 305 is formed at a part of the side wall portion 402.

Specifically, the projection 306 is formed to project from a part of the side wall portion 402 toward one of the branch channels 337. One side of the projection 306 closer to the bottom wall portion 401 is connected to the side wall portion 402 or the bottom wall portion 401, and the other side of the projection 306 is cut off.

The opening 307 is formed at the part of the side wall portion 402 at which the projection 306 is formed. Thus, the opening 307 is formed adjacent to each of an upstream side and a downstream side of the projection 306.

The side wall portion 402 of the wave fin 304W is formed in a corrugated shape so that the inclination direction with respect to the Y direction is alternately changed. When portions of the side wall portion 402 at which the inclination direction with respect to the Y direction is reversed are assumed to be peaks and valleys, the diffusion unit 305 (i.e., the projection 306 and the opening 307) is formed at a part of a unit side wall portion 402a, which is a part of the side wall portion 402 between the peak and the valley adjacent to each other in the Y direction.

As shown in FIG. 69, the diffusion unit 305 is not formed in the upstream region 303U or the downstream region 303D. The diffusion unit 305 in the intermediate region 303M is formed substantially throughout the coolant channel 330 in the Z direction.

Unlike the component cooling devices 301 of Embodiments 17 to 32, the component cooling device 310 of the present embodiment includes no fluid diode unit. However, in the present embodiment, the fluid diode unit may be provided as appropriate.

The rest of the configuration is the same as in the eighteenth embodiment.

Figure 72:
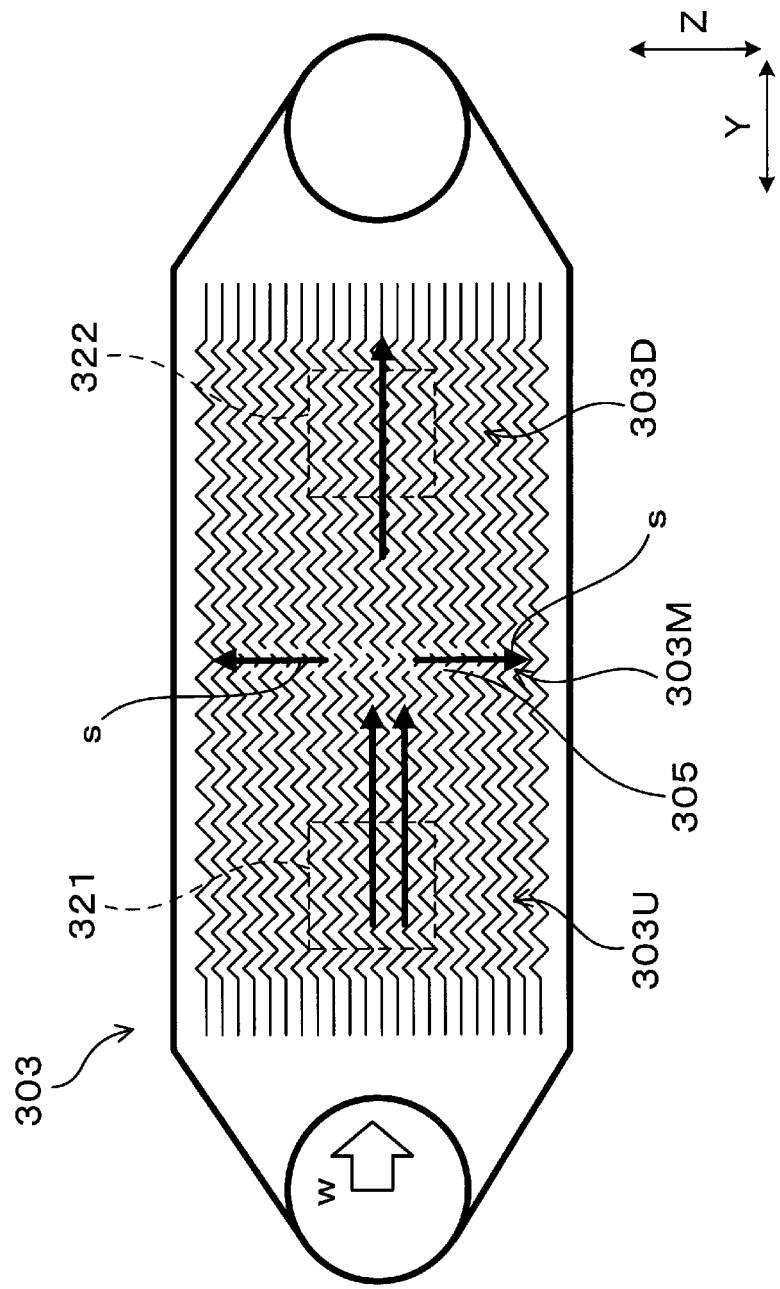
FIG. 72 is an explanatory plan view of a cooling pipe illustrating a flow of vapor of the thirty-third embodiment.
Figure 73:
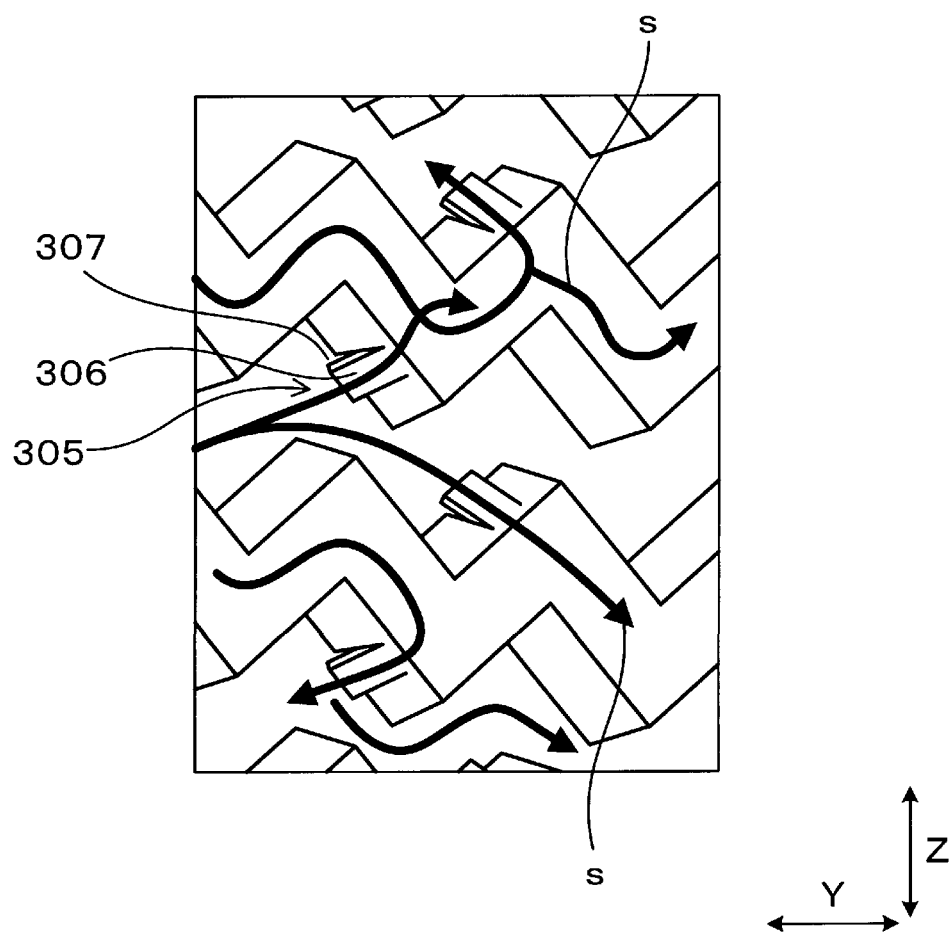
FIG. 73 is an enlarged an explanatory perspective view illustrating a flow of vapor of the thirty-third embodiment.

In the present embodiment, the diffusion unit 305 is formed in the intermediate region 303M. Accordingly, as shown in FIGS. 72 and 73, even when the coolant is evaporated to be vapor by heat of the first electronic component 321 and the second electronic component 322, the vapor s can be diffused toward both sides in the Z direction through the diffusion unit 305. Thus, the vapor s generated in the branch channel 337 in the vicinity of the center in the Z direction can be released toward both sides in the Z direction. Accordingly, in the vicinity of the center in the Z direction, the liquid coolant can be smoothly introduced and efficient cooling of the first electronic component 321 and the second electronic component 322 can be ensured.

Figure 74:
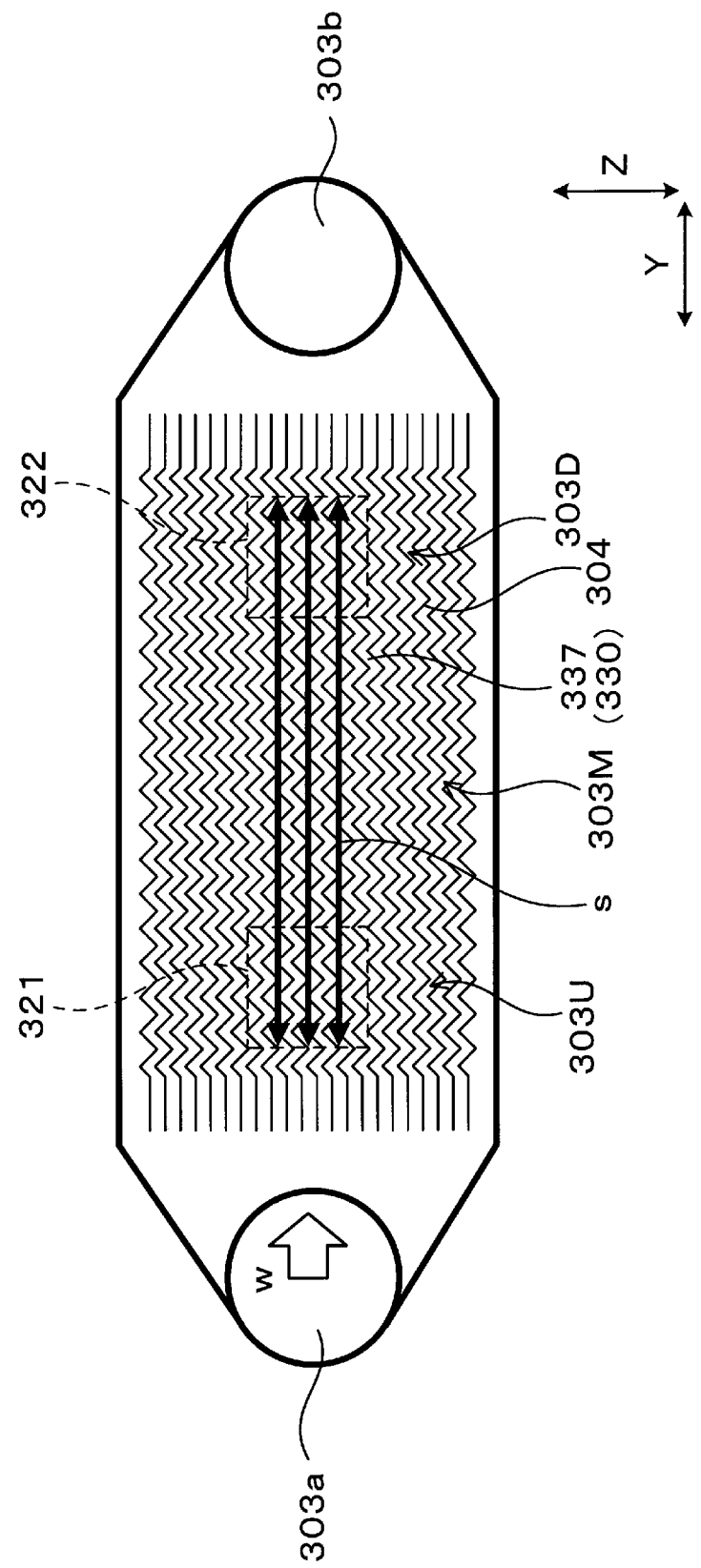
FIG. 74 is an explanatory plan view of a cooling pipe having no diffusion unit illustrating a flow of vapor in the cooling pipe.
Figure 75:
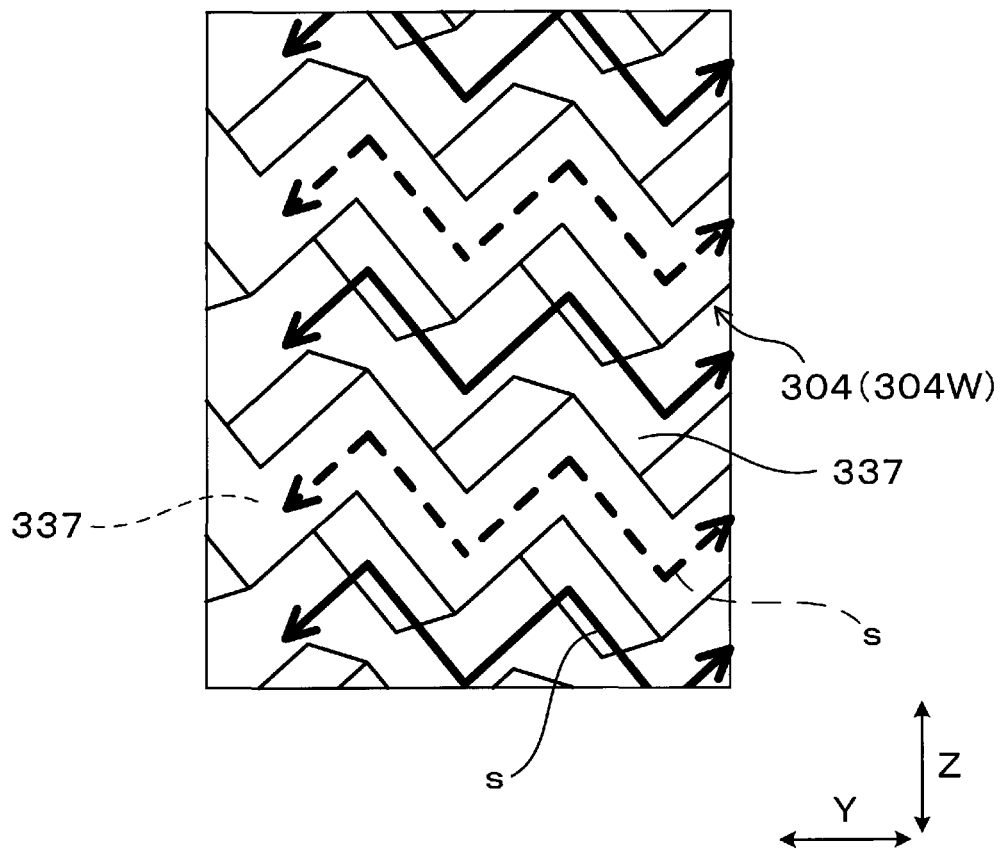
FIG. 75 is an enlarged an explanatory perspective view illustrating a flow of vapor in the cooling pipe having no diffusion unit.

Specifically, if the internal fin 304 is provided with no diffusion unit as shown in FIGS. 74 and 75, the vapor s generated in the branch channel 337 in the vicinity of the center in the Z direction is spread in the Y direction. At this time, if an expansion pressure of the vapor s is larger than a supply pressure of the introduced liquid coolant, part of the vapor s flows backward from the downstream region 303D toward the upstream region 303U. In that case, in the branch channel 337 in the vicinity of the center in the Z direction, the vapor s is less likely to flow toward the discharge unit 303b. Thus, the vapor s is retained in the coolant channel 330 and may cause a dry-out state. This may be a factor that deteriorates the cooling performance for the first electronic component 321 and the second electronic component 322.

In this regard, since the component cooling device 310 shown in the thirty-third embodiment includes the diffusion unit 305, as described above, the vapor s can be released toward both sides in the Z direction (see FIG. 72). Accordingly, in the vicinity of the center in the Z direction, the liquid coolant can be smoothly introduced and efficient cooling of the first electronic component 321 and the second electronic component 322 can be ensured.

The internal fin 304 is provided with the diffusion unit 305 only in the intermediate region 303M among the upstream region 303U, the intermediate region 303M, and the downstream region 303D. Therefore, the heat transfer area between the coolant and the internal fin 304 is easily ensured in the vicinity of the first electronic component 321 and the second electronic component 322.

Since the diffusion unit 305 is provided only in the intermediate region 303M, the pressure loss of the coolant can be reduced in the vicinity of the first electronic component 321 and the second electronic component 322. Therefore, in the non-boiling state, the flow rate of the coolant that exchanges heat with the first electronic component 321 and the second electronic component 322 is easily ensured.

As described above, even when provision of the diffusion unit 305 causes a reduction in the heat transfer area or an increase in the pressure loss, the influence on cooling of the electronic component is small. Therefore, the diffusion unit 305 can be upsized, and distribution of the coolant in the boiling state as described above can be more smoothly performed.

The internal fin 304 has the wave fin 304W, and the diffusion unit 305 is formed at a part of the wave fin 304W. Thus, the heat transfer area between the internal fin 304 and the coolant can be effectively increased, thereby improving the cooling performance. Since the wave fin 304W is provided with the diffusion unit 305, the coolant can be more effectively diffused in the Z direction.

The diffusion unit 305 has the projection 306. Thus, the heat transfer area between the internal fin 304 and the coolant can be further increased. Therefore, the cooling performance for the electronic component can be further improved.

As described above, also the present embodiment can provide a component cooling device capable of ensuring a smooth flow of coolant to improve the cooling performance for an electronic component.

Figure 76:
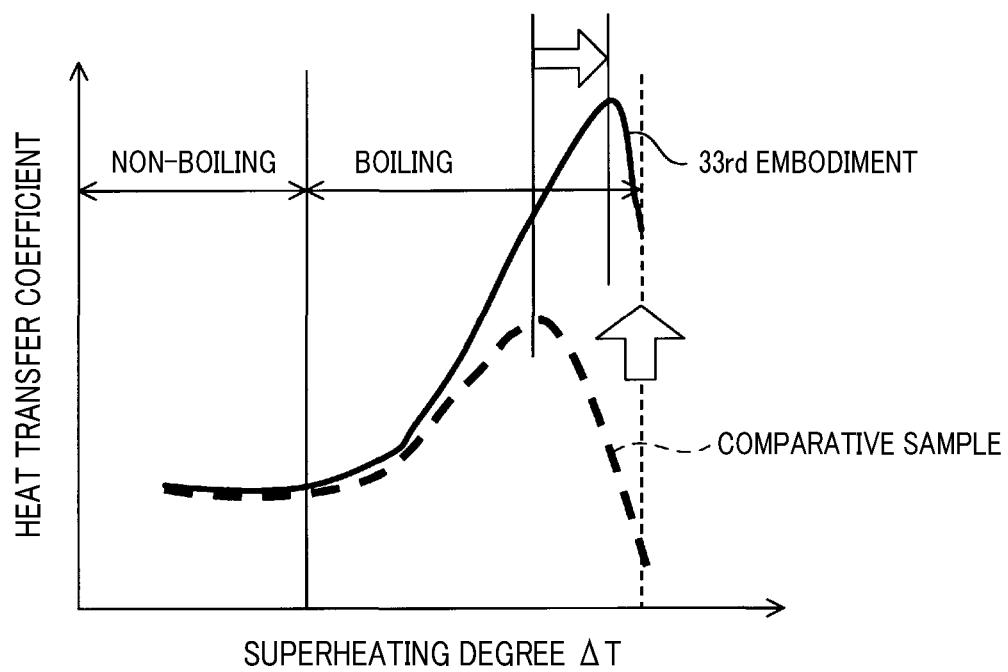
FIG. 76 is a diagram showing the results of an effect confirmation test for a heat exchanger according to the thirty-third embodiment.

Next, FIG. 76 shows the results of an effect confirmation test using the component cooling device 310 of the thirty-third embodiment. Specifically, a relationship between a heat transfer coefficient from the second electronic component 322 to the coolant and a superheating degree $\Delta T$ has been analyzed both in the non-boiling state and in the boiling state of the coolant. As comparison, the heat transfer coefficient has also been analyzed in a component cooling device (i.e., comparative sample) including a cooling pipe provided with no diffusion unit as shown in FIG. 74.

The heat transfer coefficient has been analyzed by the same method as in the effect confirmation test in the nineteenth embodiment. The superheating degree $\Delta T$ is a difference between a temperature of the heat transfer surface and a saturation temperature of the coolant.

As shown in FIG. 76, while the superheating degree $\Delta T$ is low and the coolant is in the non-boiling state, there is no particular difference in the heat transfer coefficient between the comparative sample and the sample of the thirty-third embodiment. When the superheating degree $\Delta T$ is increased and the coolant is in the boiling state, due to a boiling cooling effect, the heat transfer coefficient is increased, and up to a breaking point, as the superheating degree $\Delta T$ is increased, the heat transfer coefficient is also increased. However, in the comparative sample, the superheating degree $\Delta T$ reaches the breaking point earlier, and when the superheating degree $\Delta T$ exceeds the breaking point, a dry-out state (i.e., a state in which the coolant is vaporized on the entire heat transfer surface) occurs, and the heat transfer coefficient is suddenly reduced.

On the other hand, in the component cooling device 310 of the thirty-third embodiment, even when the superheating degree $\Delta T$ becomes high, the heat transfer coefficient is continuously increased. Therefore, even when the temperature of the second electronic component 322 is increased, the dry-out state is less likely to occur and a high heat transfer coefficient is achieved. Thus, the superheating degree $\Delta T$ before occurrence of the dry-out state is higher by approximately 20% than in the comparative sample.

The difference in the effect has been observed presumably because the diffusion unit 305 is provided in the intermediate region 303M as shown in FIG. 69. Specifically, the difference in the effect has been observed presumably because when the coolant is in the boiling state, as described above, it is possible to release the vapor s outward in the Z direction and ensure the flow rate of the coolant in the vicinity of the second electronic component 322 on the downstream side.

Thirty-Fourth Embodiment

Figure 77:
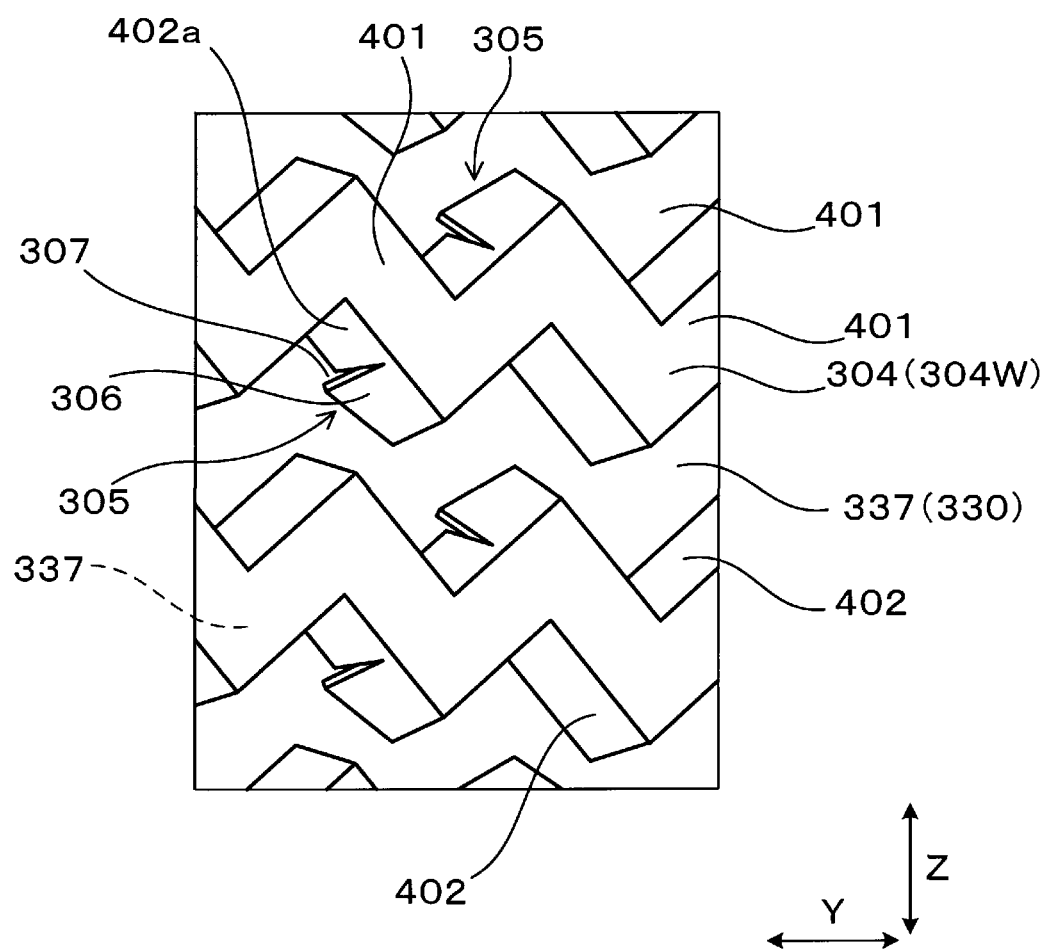
FIG. 77 is an explanatory perspective view of a diffusion unit of a thirty-fourth embodiment.

As shown in FIG. 77, the present embodiment is an embodiment in which the projection 306 is upsized.

Specifically, the projection 306 is formed in the entire region from one end to a center portion of the unit side wall portion 402a. Accordingly, the opening 307 is also formed in the entire region from one end to the center portion of the unit side wall portion 402a.

An end edge on the downstream side of the projection 306 is continuous to the side wall portion 402, and the opening 307 is formed on an upstream end side of the projection 306.

The rest of the configuration is the same as in the thirty-third embodiment.

In the present embodiment, it is possible to increase a surface area of the projection 306 with which the coolant is relatively more likely to collide. Therefore, the heat transfer area between the coolant and the internal fin 304 can be increased.

Furthermore, the configuration of the diffusion unit 305 can be simplified, thereby enabling the internal fin 304 to be easy to manufacture. As a result, the component cooling device 310 that allows good productivity can be obtained.

Other than this, the present embodiment has the same functions and effects as in the thirty-third embodiment.

Thirty-Fifth Embodiment

Figure 78:
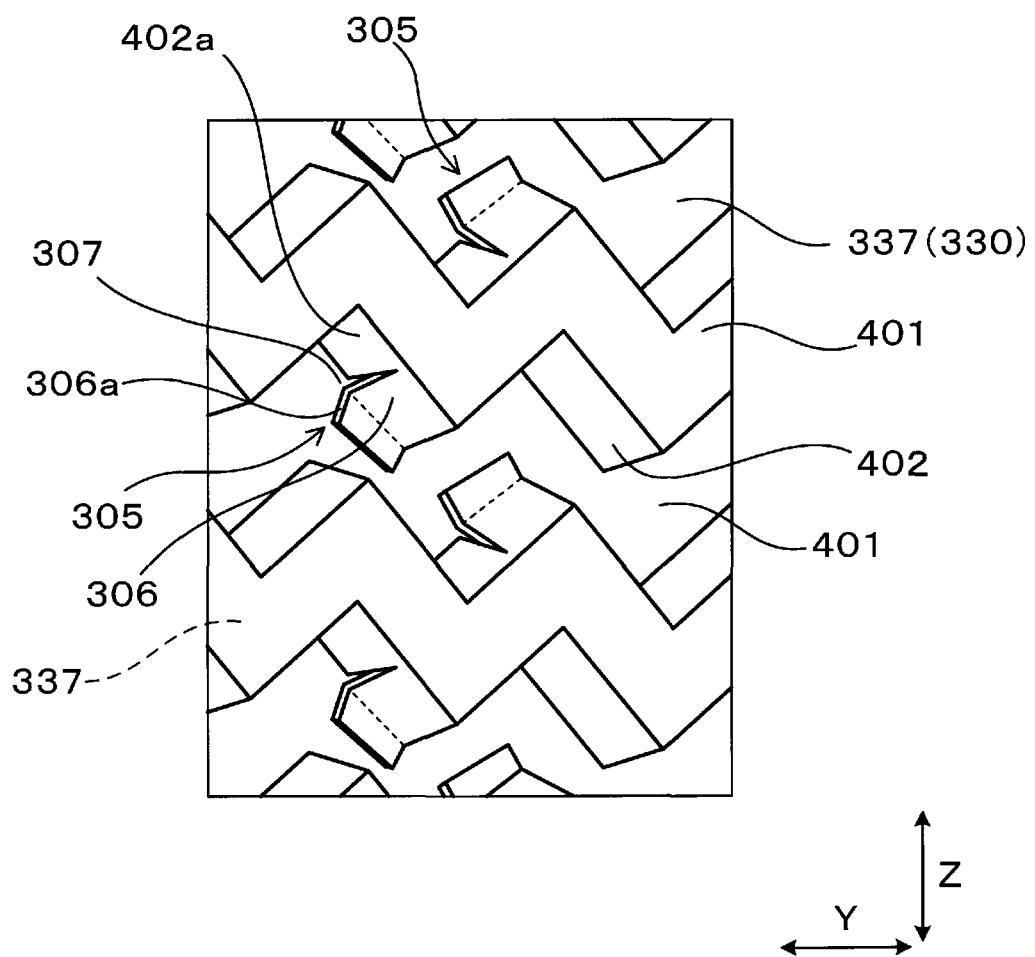
FIG. 78 is an explanatory perspective view of a diffusion unit of a thirty-fifth embodiment.

As shown in FIG. 78, the present embodiment is an embodiment in which a part of the projection 306 is bent and extended toward the branch channel 337 to form an extending portion 306a.

Specifically, a part of the projection 306 that projects to be inclined with respect to the side wall portion 402 is extended in a direction along the bottom wall portion 401 to form the extending portion 306a.

The rest of the configuration is the same as in the thirty-fourth embodiment.

In the present embodiment, the heat transfer area with the coolant at the projection 306 can be increased by the area obtained by providing the extending portion 306a.

Other than this, the present embodiment has the same functions and effects as in the thirty-fourth embodiment.

Figure 79:
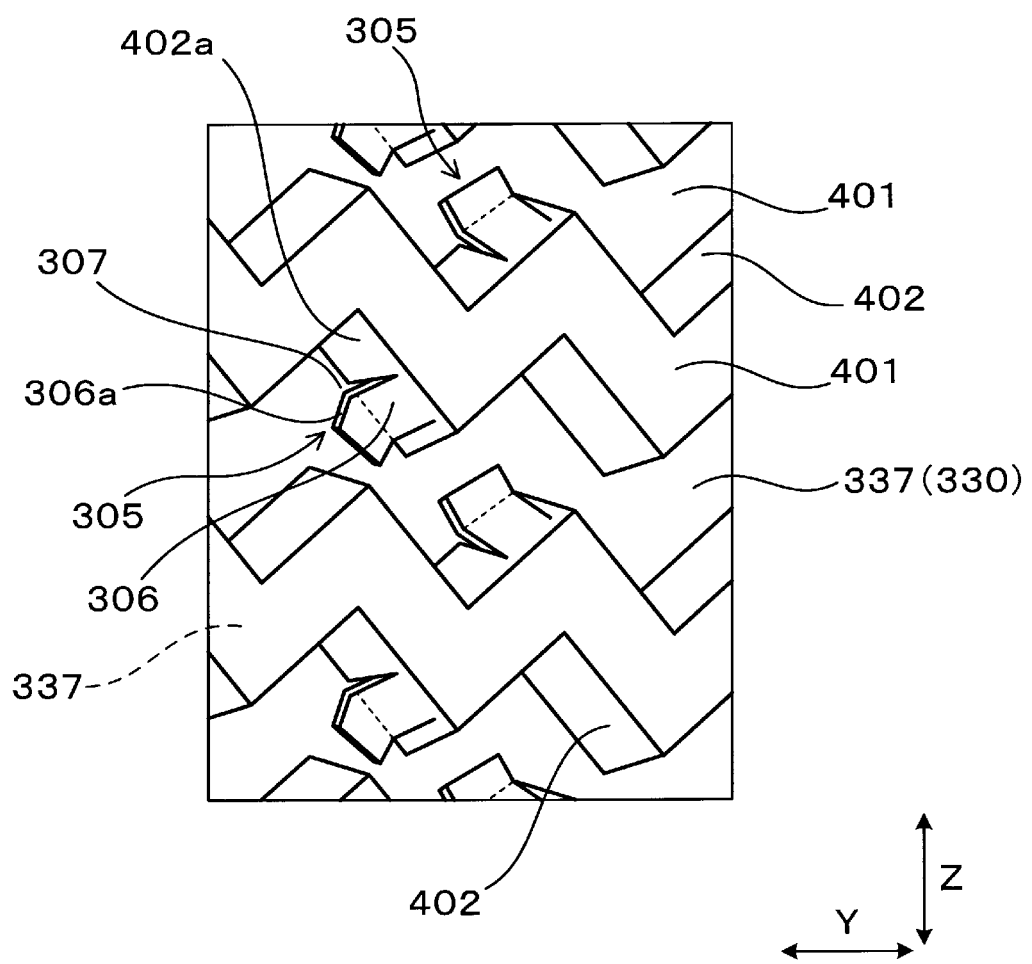
FIG. 79 is an explanatory perspective view of a diffusion unit a modification of a thirty-fifth embodiment.

In the thirty-fifth embodiment, as in the thirty-fourth embodiment, the projection 306 is formed in the entire region from one end to the center portion of the unit side wall portion 402a. However, as a modification of the thirty-fifth embodiment, as shown in FIG. 79, the projection 306 may be configured such that while the projection 306 is formed at a part of the center portion of the unit side wall portion 402a as in the thirty-third embodiment, the projection 306 is provided with the extending portion 306a.

Thirty-Sixth Embodiment

Figure 80:
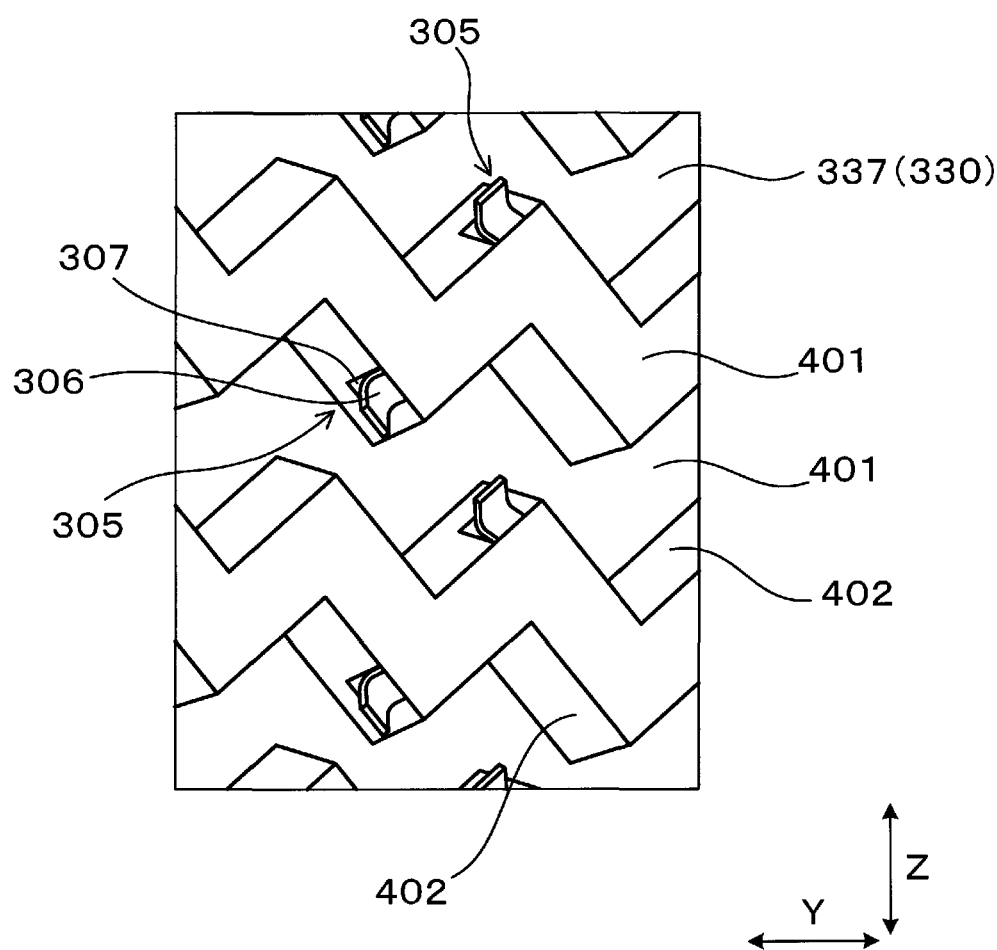
FIG. 80 is an explanatory perspective view of a diffusion unit of a thirty-sixth embodiment.

As shown in FIG. 80, the present embodiment is an embodiment in which the projection 306 is curved in the plate thickness direction.

Specifically, the projection 306 has a curved surface portion that is convex toward the opening 307.

Furthermore, there is a difference in level between the bottom wall portion 401 on a side opposite to a portion of the side wall portion 402 connected to the projection 306 and one end of the opening 307.

The rest of the configuration is the same as in the thirty-third embodiment.

In the present embodiment, the heat transfer area with the coolant at the projection 306 can be increased. Furthermore, the projection 306 can be easily formed.

Other than this, the present embodiment has the same functions and effects as in the thirty-third embodiment.

Thirty-Seventh Embodiment

Figure 81:
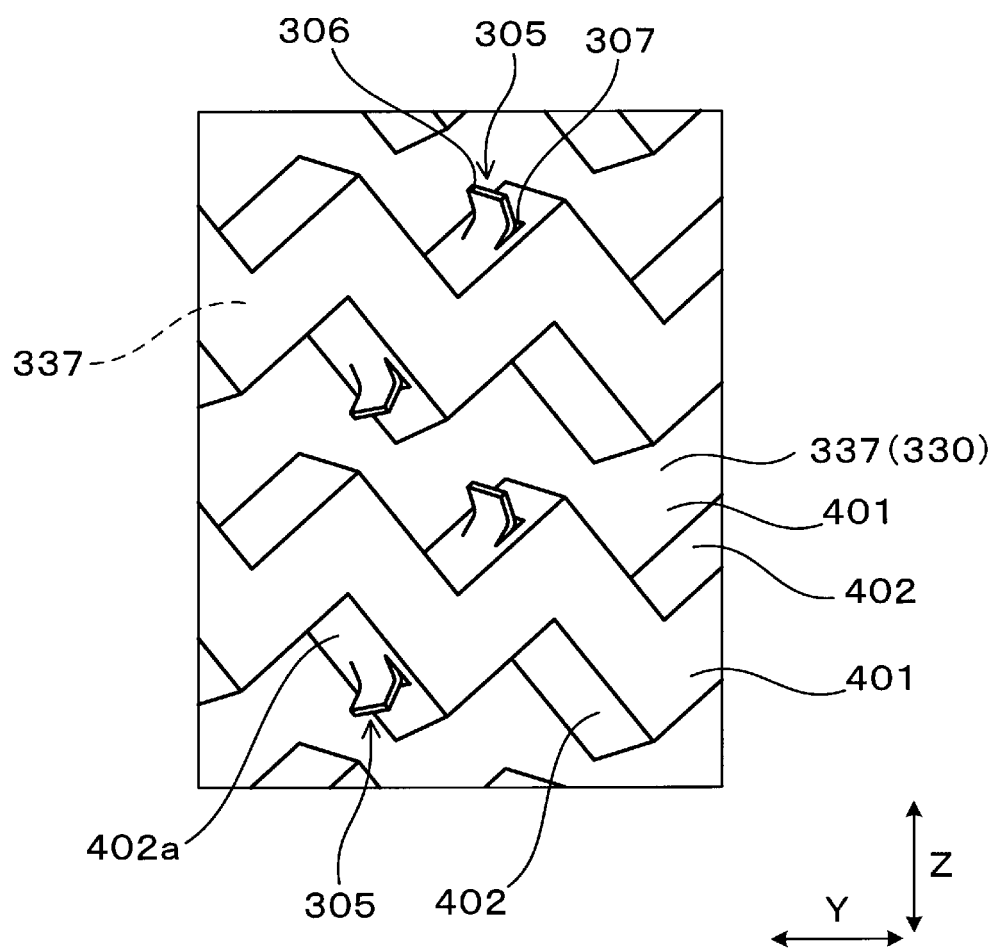
FIG. 81 is an explanatory perspective view of a diffusion unit of a thirty-seventh embodiment.

As shown in FIG. 81, the present embodiment is an embodiment obtained by changing the direction of the projections 306 of a thirty-sixth embodiment.

Specifically, the projections 306 are connected to the side wall portion 402 on the upstream side of the coolant channel 330.

Other than this, the present embodiment has the same configuration and functions and effects as in a thirty-sixth embodiment.

Thirty-Eighth Embodiment

Figure 82:
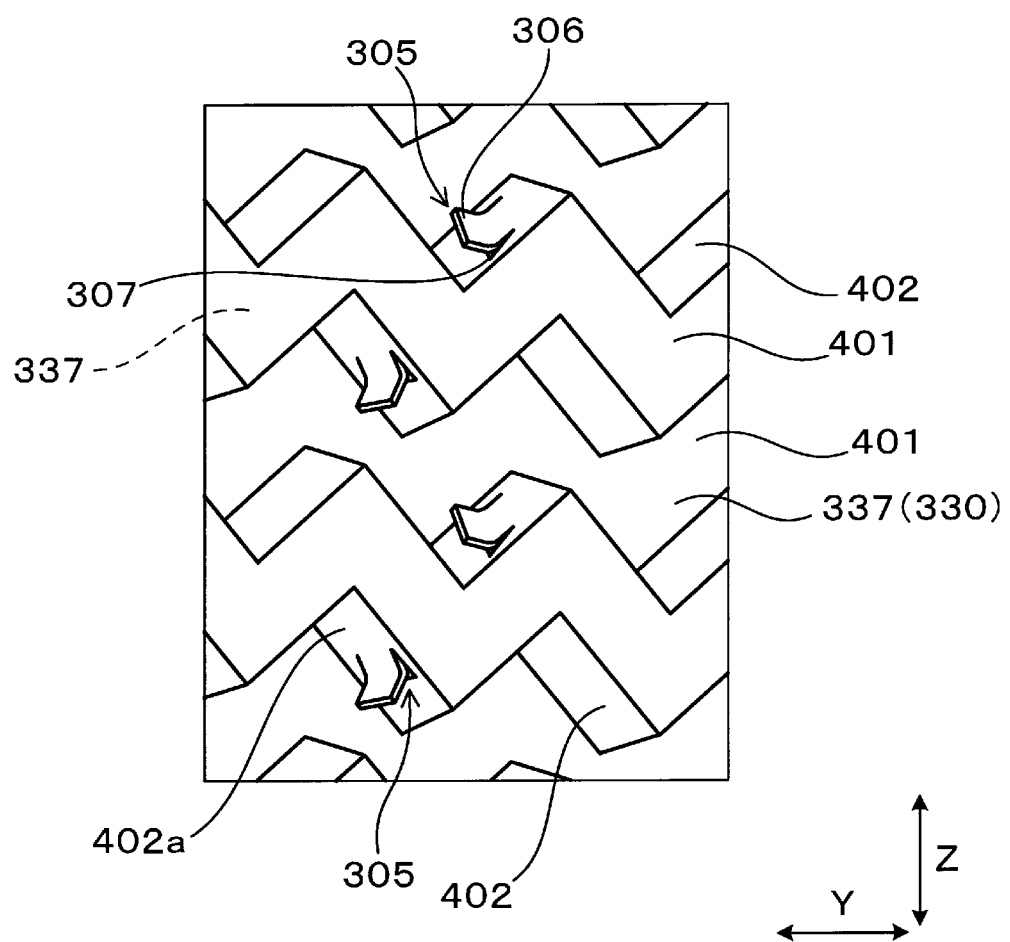
FIG. 82 is an explanatory perspective view of a diffusion unit of a thirty-eighth embodiment.

As shown in FIG. 82, the present embodiment is also an embodiment obtained by changing the direction of the projections 306 of a thirty-sixth embodiment.

However, in the present embodiment, some of the projections 306 are connected to the side wall portion 402 on the downstream side of the coolant channel 330.

Specifically, the projections 306 of the diffusion units 305 arranged on the upstream side of the coolant channel 330 are connected to the side wall portion 402 on the upstream side of the coolant channel 330, and the projections 306 of the diffusion units 305 arranged on the downstream side of the coolant channel 330 are connected to the side wall portion 402 on the downstream side of the coolant channel 330.

Other than this, the present embodiment has the same configuration and functions and effects as in a thirty-sixth embodiment.

Thirty-ninth Embodiment

Figure 83:
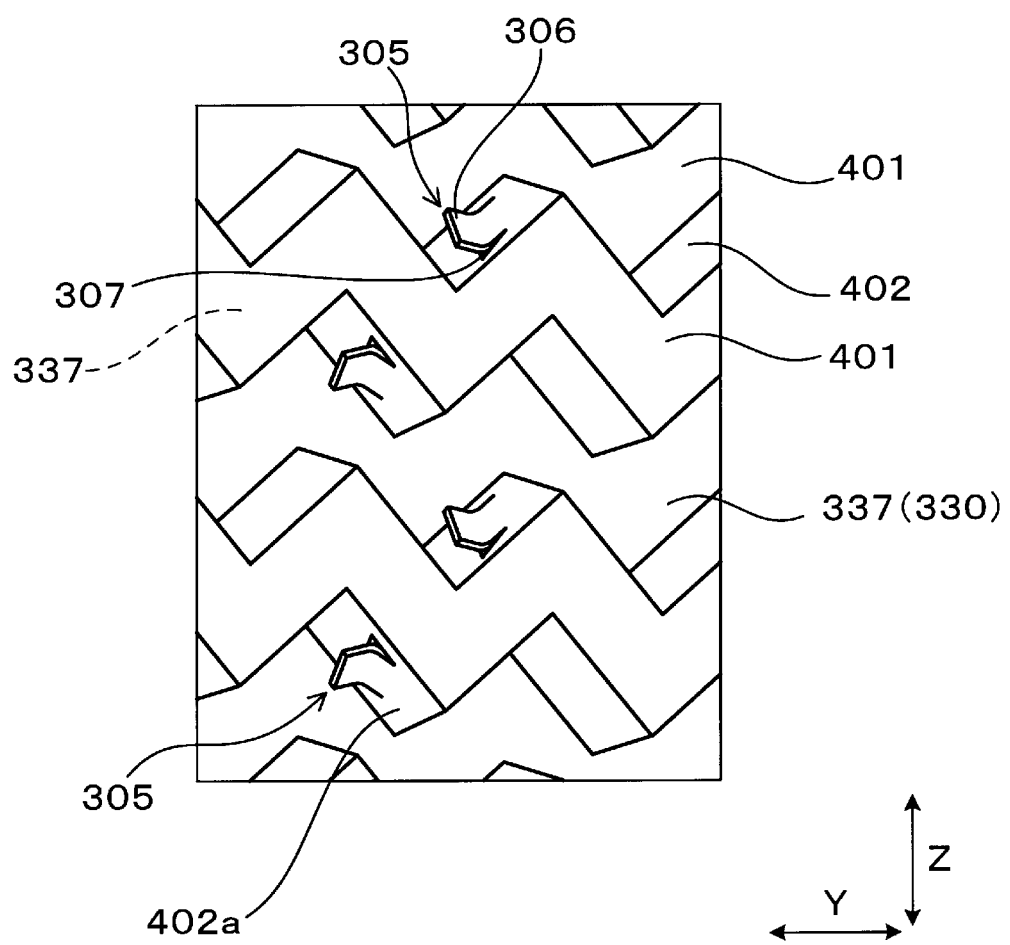
FIG. 83 is an explanatory perspective view of a diffusion unit of a thirty-ninth embodiment.

As shown in FIG. 83, the present embodiment is also an embodiment obtained by changing the direction of the projections 306 of a thirty-sixth embodiment.

However, in the present embodiment, all the projections 306 are connected to the side wall portion 402 on the downstream side of the coolant channel 330.

Other than this, the present embodiment has the same configuration and functions and effects as in a thirty-sixth embodiment.

Fortieth Embodiment

Figure 84:
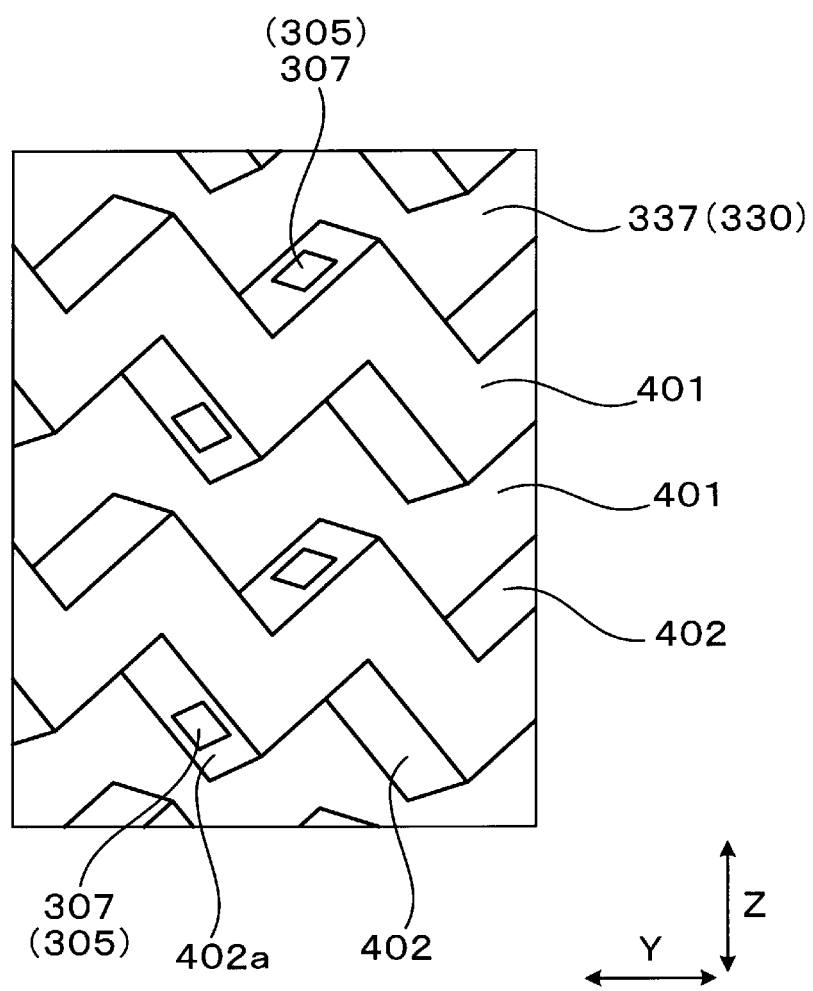
FIG. 84 is an explanatory perspective view of a diffusion unit of a fortieth embodiment.

As shown in FIG. 84, the present embodiment is an embodiment in which the diffusion unit 305 is not provided with the projection 306.

That is, unlike the thirty-third embodiment, the diffusion unit 305 does not have the projection 306. The opening 307 formed at the side wall portion 402 constitutes the diffusion unit 305. In the present embodiment, the opening 307 has a substantially rectangular shape.

The rest of the configuration is the same as in the thirty-third embodiment.

In the present embodiment, the diffusion unit 305 can be simplified. As a result, it is possible to improve the productivity of the component cooling device 310 and reduce a manufacturing cost.

Other than this, the present embodiment has the same functions and effects as in the thirty-third embodiment.

Forty-First Embodiment

Figure 85:
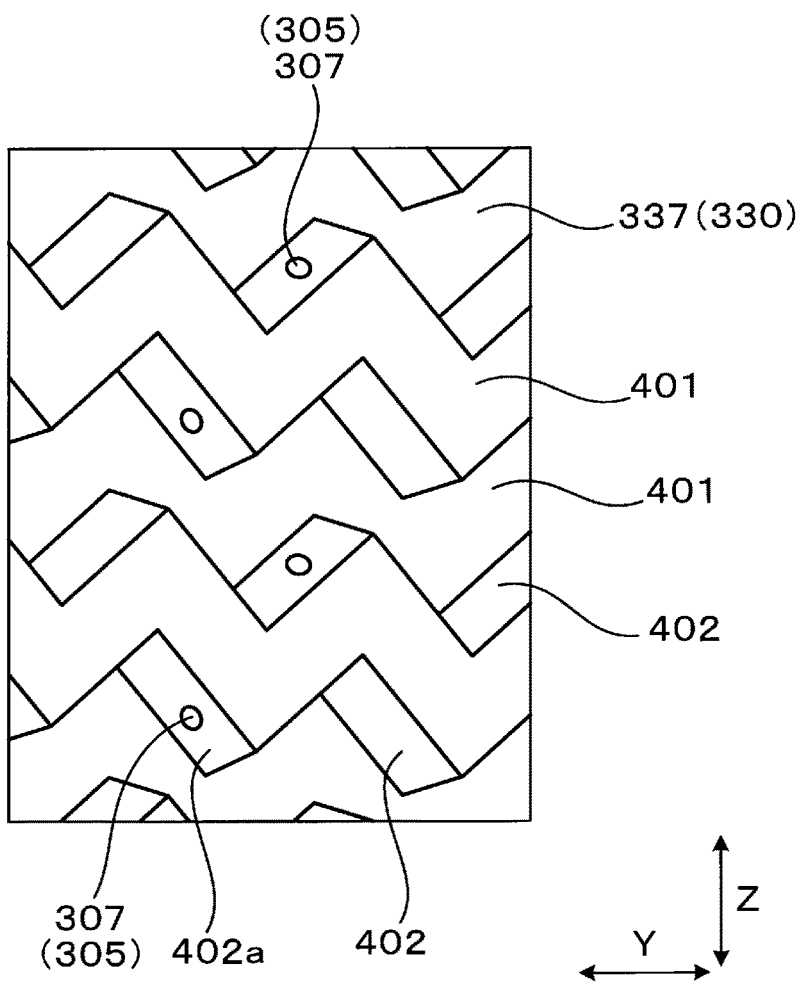
FIG. 85 is an explanatory perspective view of a diffusion unit of a forty-first embodiment.

As shown in FIG. 85, the present embodiment is also an embodiment in which the diffusion unit 305 is not provided with the projection 306.

In the present embodiment, the opening 307 constituting the diffusion unit 305 has a substantially circular shape.

The rest of the configuration is the same as in a 40th embodiment.

Also the present embodiment has the same functions and effects as in a 40th embodiment.

Forty-Second Embodiment

Figure 86:
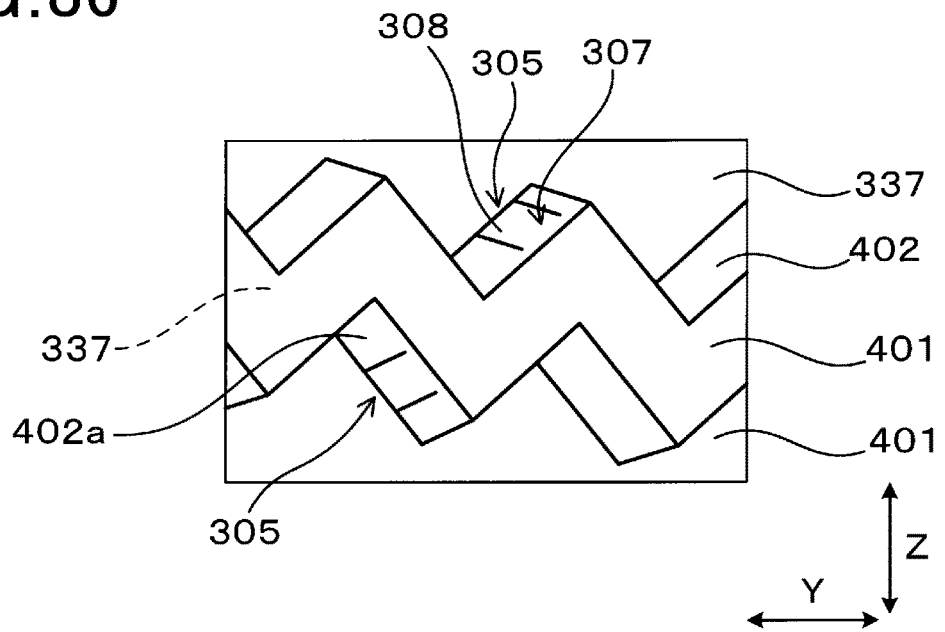
FIG. 86 is an explanatory perspective view of a diffusion unit in which an opening is closed of a forty-second embodiment.
Figure 87:
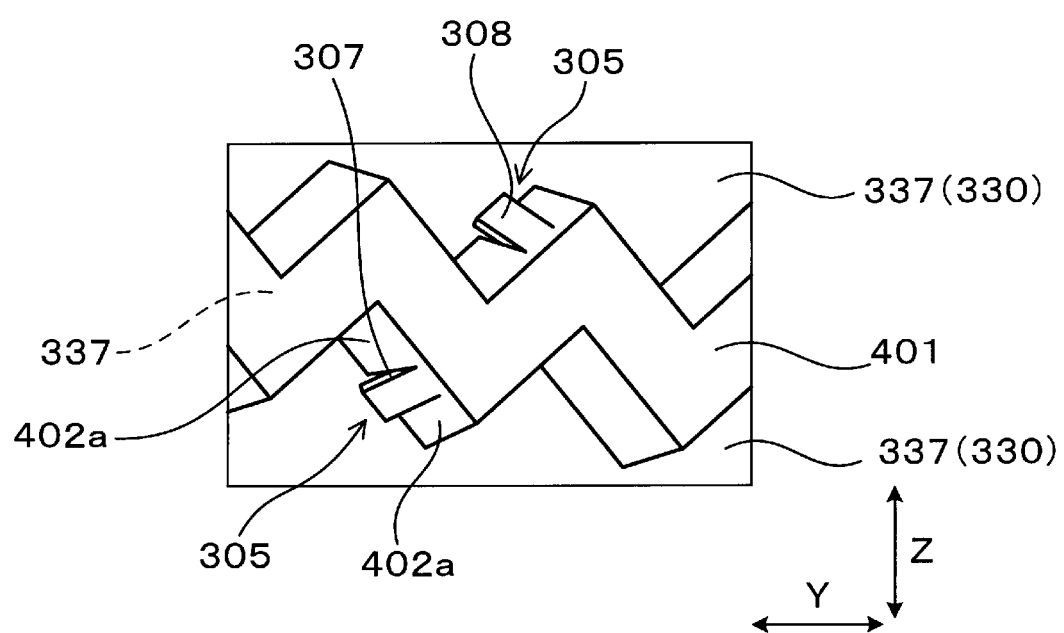
FIG. 87 is an explanatory perspective view of the diffusion unit in which the opening is opened of the forty-second embodiment.

As shown in FIGS. 86 and 87, the present embodiment is an embodiment in which the diffusion unit 305 has the opening 307 that is formed at a part of the internal fin 304, and a lid portion 308 that closes the opening 307.

The lid portion 308 is configured to be elastically deformed when a predetermined pressure in the plate thickness direction is applied to the lid portion 308.

Thus, when the predetermined pressure is not applied to the lid portion 308, as shown in FIG. 86, the opening 307 is closed by the lid portion 308. For example, in the non-boiling state in which the coolant does not boil, the pressure applied to the lid portion 308 is less than the predetermined pressure, and the opening 307 is closed by the lid portion 308. Accordingly, also in the diffusion unit 305, the coolant flows through each branch channel 337. Thus, in the diffusion unit 305, the coolant flows in each branch channel 337 without being diffused to another branch channel 337.

On the other hand, when the predetermined pressure is applied to the lid portion 308, as shown in FIG. 87, the lid portion 308 is elastically deformed and the opening 307 is opened. For example, in the boiling state in which the coolant boils, the pressure applied to the lid portion 308 is the predetermined pressure or more, and the lid portion 308 is elastically deformed in the thickness direction and the opening 307 is exposed. Thus, in the diffusion unit 305, the coolant (particularly vapor) can flow between the branch channels 337.

When the boiling state ends and the pressure applied to the lid portion 308 becomes less than the predetermined pressure, the opening 307 is closed again by the lid portion 308. Thus, the coolant flows again through each branch channel 337.

The diffusion unit 305 may be configured such that when the pressure applied to the lid portion 308 is less than the predetermined pressure, the opening 307 is completely closed by the lid portion 308 or the opening 307 is not completely closed by the lid portion 308. The degree of opening of the opening 307 when the pressure applied to the lid portion 308 is less than the predetermined pressure only needs to be smaller than the degree of opening of the opening 307 when the pressure applied to the lid portion 308 is the predetermined pressure or more.

The rest of the configuration is the same as in the thirty-third embodiment.

In the present embodiment, in normal times such as in the non-boiling state, the coolant is allowed to flow through each branch channel 337. Therefore, the channel resistance can be reduced, and a uniform flow rate of the coolant in the Z direction is easily achieved. As a result, the cooling performance for the electronic component is easily improved as a whole.

Since, when the coolant boils, the diffusion unit 305 functions as described above, the vapor can be released outward in the Z direction. Therefore, also in the boiling state, the cooling performance can be improved.

Other than this, the present embodiment has the same functions and effects as in the thirty-third embodiment.

In the present embodiment, the shapes of the opening 307 and the lid portion 308 may be changed as appropriate.

The above embodiments show an embodiment in which the first electronic component 321 and the second electronic component 322 are separately arranged in the respective individual component modules 320. However, the component cooling device may be configured such that a first electronic component and a second electronic component are integrated in a single component module and the component module is thermally in contact with a cooling pipe.

The present disclosure has been described in accordance with the embodiments, but it is understood that the present disclosure is not limited to these embodiments or structures. The present disclosure encompasses various modifications and variations in an equivalent range. In addition, the scope and spirit of the present disclosure encompass various combinations or forms and other combinations or forms including only one element, one or more elements, or one or less elements.

What is claimed is:

1. A heat exchanger that cools a cooled object by heat exchange between the cooled object and a liquid coolant, the heat exchanger comprising:
    a heat exchanger body that includes a circulation path through which the coolant is circulated and performs heat exchange between the coolant flowing through the circulation path and the cooled object;
    a coolant supply pump that supplies the coolant to the heat exchanger body;
    an accumulation determination unit that determines whether a foreign matter accumulation condition is fulfilled that is satisfied when foreign matter is determined to be accumulated in at least a part of the circulation path; and
    a process execution unit that in response to the foreign matter accumulation condition being satisfied, executes a foreign matter cleaning process of removing the foreign matter accumulated in the circulation path and cleaning the circulation path, wherein
    in the foreign matter cleaning process, the process execution unit reduces an amount of coolant supplied from the coolant supply pump so that the coolant has a superheating degree in a nucleate boiling region.

2. The heat exchanger according to claim 1, wherein
    in the foreign matter cleaning process, the process execution unit sets, as a target superheating degree in a range from a saturation start point to a burnout point indicated by a boiling curve of the coolant, a superheating degree closer to the burnout point than to the saturation start point, and reduces the amount of coolant supplied from the coolant supply pump so that the superheating degree of the coolant approaches the target superheating degree.

3. The heat exchanger according to claim 1, further comprising:
    an arithmetic unit that calculates a blockage degree of the circulation path based on at least one of a flow rate of the coolant flowing into the heat exchanger body and a pressure loss of the heat exchanger body, wherein
    the foreign matter accumulation condition includes a condition that is satisfied when the blockage degree exceeds a predetermined blockage threshold.

4. The heat exchanger according to claim 1, wherein
    the foreign matter accumulation condition includes a condition that is satisfied when elapsed time from start of use of the heat exchanger body or elapsed time from the previous foreign matter cleaning process exceeds a predetermined reference time.

5. The heat exchanger according to claim 1, further comprising:
    an adjustment unit that adjusts an amount of heat generated by the cooled object, wherein
    in the foreign matter cleaning process, the process execution unit causes the adjustment unit to increase the amount of heat generated by the cooled object.

6. The heat exchanger according to claim 5, wherein
    when, even after the amount of coolant supplied from the coolant supply pump is reduced, the coolant does not have a superheating degree in the nucleate boiling region, the process execution unit causes the adjustment unit to increase the amount of heat generated by the cooled object.

7. The heat exchanger according to claim 1, further comprising:
    a load determination unit that determines satisfaction or dissatisfaction of a low load condition that is satisfied when a load on a device including the cooled object is less than or equal to a predetermined reference load, wherein
    the process execution unit executes the foreign matter cleaning process in response to the foreign matter accumulation condition being satisfied and the low load condition being satisfied.

8. The heat exchanger according to claim 7, wherein
    the low load condition includes a condition that is satisfied when a temperature of the coolant before execution of the foreign matter cleaning process is a saturation temperature or less.

9. The heat exchanger according to claim 1, wherein
    the heat exchanger body is composed of a component cooler that is configured to cool an electronic component as the cooled object and cools the electronic component by heat exchange between the electronic component and the coolant, and the electronic component generates heat by energization.

10. The heat exchanger according to claim 1, wherein
    the heat exchanger body is composed of an intercooler that is configured to cool supercharged intake air as the cooled object and cools the supercharged intake air by heat exchange between the supercharged intake air and the coolant, and the supercharged intake air is supercharged to an internal combustion engine by a supercharger.

11. The heat exchanger according to claim 1, wherein the coolant is composed of antifreeze containing an anticorrosive that prevents generation of rust.

* * * * *